(12) United States Patent
Harris et al.

(10) Patent No.: US 12,206,220 B2
(45) Date of Patent: Jan. 21, 2025

(54) PHOTONICS PROCESSOR ARCHITECTURE

(71) Applicant: Lightmatter, Inc., Boston, MA (US)

(72) Inventors: Nicholas C. Harris, Boston, MA (US); Anthony Kopa, Somerville, MA (US); Carl Ramey, Westborough, MA (US); Darius Bunandar, Boston, MA (US); Michael Gould, Boston, MA (US)

(73) Assignee: Lightmatter, Inc., Boston, MA (US)

( * ) Notice: Subject to any disclaimer, the term of this patent is extended or adjusted under 35 U.S.C. 154(b) by 863 days.

(21) Appl. No.: 17/240,573

(22) Filed: Apr. 26, 2021

(65) Prior Publication Data

US 2021/0333818 A1    Oct. 28, 2021

Related U.S. Application Data

(60) Provisional application No. 63/114,387, filed on Nov. 16, 2020, provisional application No. 63/092,289, filed on Oct. 15, 2020, provisional application No. 63/088,915, filed on Oct. 7, 2020, provisional application No. 63/016,127, filed on Apr. 27, 2020.

(51) Int. Cl.
*H01S 5/042*     (2006.01)
*G02B 6/12*      (2006.01)
*G02B 6/43*      (2006.01)
*G02B 26/06*     (2006.01)
*G06E 1/04*      (2006.01)
*G06E 3/00*      (2006.01)
*H01S 5/0683*    (2006.01)
*H01S 5/42*      (2006.01)

(52) U.S. Cl.
CPC ........ *H01S 5/0427* (2013.01); *G02B 6/12019* (2013.01); *G02B 6/43* (2013.01); *G02B 26/06* (2013.01); *G06E 1/045* (2013.01); *G06E 3/005* (2013.01); *H01S 5/0683* (2013.01); *H01S 5/423* (2013.01)

(58) Field of Classification Search
CPC ............................... G06F 17/16; G06E 1/045
See application file for complete search history.

(56) References Cited

U.S. PATENT DOCUMENTS 3,944,820 A    3/1976   Stotts
4,566,077 A    1/1986   Schuocker et al.
(Continued)

OTHER PUBLICATIONS

U.S. Appl. No. 17/240,506, filed Apr. 26, 2021, Harris et al.
(Continued)

*Primary Examiner* — Michael D. Yaary
(74) *Attorney, Agent, or Firm* — Wolf, Greenfield & Sacks, P.C.

(57) ABSTRACT

Photonic processors are described. The photonic processors described herein are configured to perform matrix multiplications (e.g., matrix vector multiplications). Matrix multiplications are broken down in scalar multiplications and scalar additions. Some embodiments relate to devices for performing scalar additions in the optical domain. One optical adder, for example, includes an interferometer having a plurality of phase shifters and a coherent detector. Leveraging the high-speed characteristics of these optical adders, some processors are sufficiently fast to support clocks in the tens of gigahertz of frequency, which represent a significant improvement over conventional electronic processors.

25 Claims, 29 Drawing Sheets

(56) References Cited

U.S. PATENT DOCUMENTS

| | | | |
|---|---|---|---|
| 4,918,635 A * | 4/1990 | Li | G06E 1/04 |
| | | | 359/107 |
| 5,877,519 A | 3/1999 | Jewell | |
| 6,586,778 B2 | 7/2003 | Linthicum et al. | |
| 6,967,981 B2 | 11/2005 | Chua et al. | |
| 7,018,580 B2 | 3/2006 | Gorczyca et al. | |
| 7,042,020 B2 | 5/2006 | Negley | |
| 7,218,388 B1 | 5/2007 | Keeler et al. | |
| 7,813,401 B2 | 10/2010 | Scherer | |
| 8,027,587 B1 | 9/2011 | Watts | |
| 8,450,719 B2 | 5/2013 | Moon | |
| 8,526,771 B2 | 9/2013 | Meyer et al. | |
| 10,763,974 B2 | 9/2020 | Bunandar et al. | |
| 11,281,972 B2 | 3/2022 | Shen | |
| 11,507,818 B2 | 11/2022 | Hosseinzadeh et al. | |
| 2001/0041025 A1 | 11/2001 | Farahi | |
| 2004/0119197 A1 | 6/2004 | Gorczyca et al. | |
| 2006/0274796 A1 | 12/2006 | Cheng et al. | |
| 2008/0080579 A1 | 4/2008 | Scherer | |
| 2009/0080898 A1 | 3/2009 | Anderson et al. | |
| 2011/0150390 A1 | 6/2011 | Meyer et al. | |
| 2013/0308898 A1 | 11/2013 | Doerr et al. | |
| 2017/0194911 A1 | 7/2017 | Aksin | |
| 2019/0235346 A1 | 8/2019 | Royon et al. | |
| 2019/0356394 A1 | 11/2019 | Bunandar et al. | |
| 2019/0362787 A1 | 11/2019 | Lu et al. | |
| 2019/0370652 A1 | 12/2019 | Shen et al. | |
| 2020/0110992 A1 | 4/2020 | Hosseinzadeh et al. | |
| 2020/0142441 A1 | 5/2020 | Bunandar et al. | |
| 2020/0150345 A1 | 5/2020 | Nahmias | |
| 2020/0250532 A1 | 8/2020 | Shen et al. | |
| 2020/0250533 A1 | 8/2020 | Shen et al. | |
| 2020/0250534 A1 | 8/2020 | Shen et al. | |
| 2020/0355678 A1 | 11/2020 | Ozdemir et al. | |
| 2021/0201126 A1 | 7/2021 | Meng et al. | |
| 2021/0264241 A1* | 8/2021 | Karanth | G06N 3/045 |
| 2021/0272005 A1 | 9/2021 | King et al. | |
| 2021/0272006 A1 | 9/2021 | King et al. | |
| 2021/0365240 A1 | 11/2021 | Harris et al. | |
| 2022/0004029 A1 | 1/2022 | Meng et al. | |
| 2022/0179159 A1 | 6/2022 | Wu et al. | |
| 2022/0215257 A1 | 7/2022 | Shen et al. | |
| 2023/0018654 A1 | 1/2023 | Winzer et al. | |
| 2023/0352465 A1 | 11/2023 | Harris et al. | |

OTHER PUBLICATIONS

PCT/US2021/029150, Sep. 22, 2021, International Search Report and Written Opinion.
PCT/US2021/029150, Jun. 24, 2021, Invitation to Pay Additional Fees.
International Search Report and Written Opinion dated Aug. 25, 2023, in connection with International Application No. PCT/US23/20205.
Invitation to Pay Additional Fees mailed Jun. 24, 2021 in connection with International Application No. PCT/US2021/029150.
International Search Report and Written Opinion mailed Sep. 22, 2021 in connection with International Application No. PCT/US2021/029150.
Extended European Search Report dated Apr. 10, 2024, in connection with European Application No. 21796097.
Hamerly et al., Large-Scale Optical Neural Networks Based on Photoelectric Multiplication. Physical Review X. May 16, 2019;9(2):21032-1-10.
Hamerly et al., [Supplementary] Large-scale optical neural networks based on photoelectric Multiplication. Physical Review X. Feb. 21, 2019;9(021032). 11 Pages.
Harris et al., Accelerating artificial intelligence with silicon photonics. 2020 Optical Fiber Communications Conference and Exhibition (OFC). Mar. 8, 2020. 4 Pages. DOI:10.1364/OFC.2020.W3A.3.
Shen et al., Deep learning with coherent nanophotonic circuits. Jun. 12, 2017;11(7):441-446.

* cited by examiner

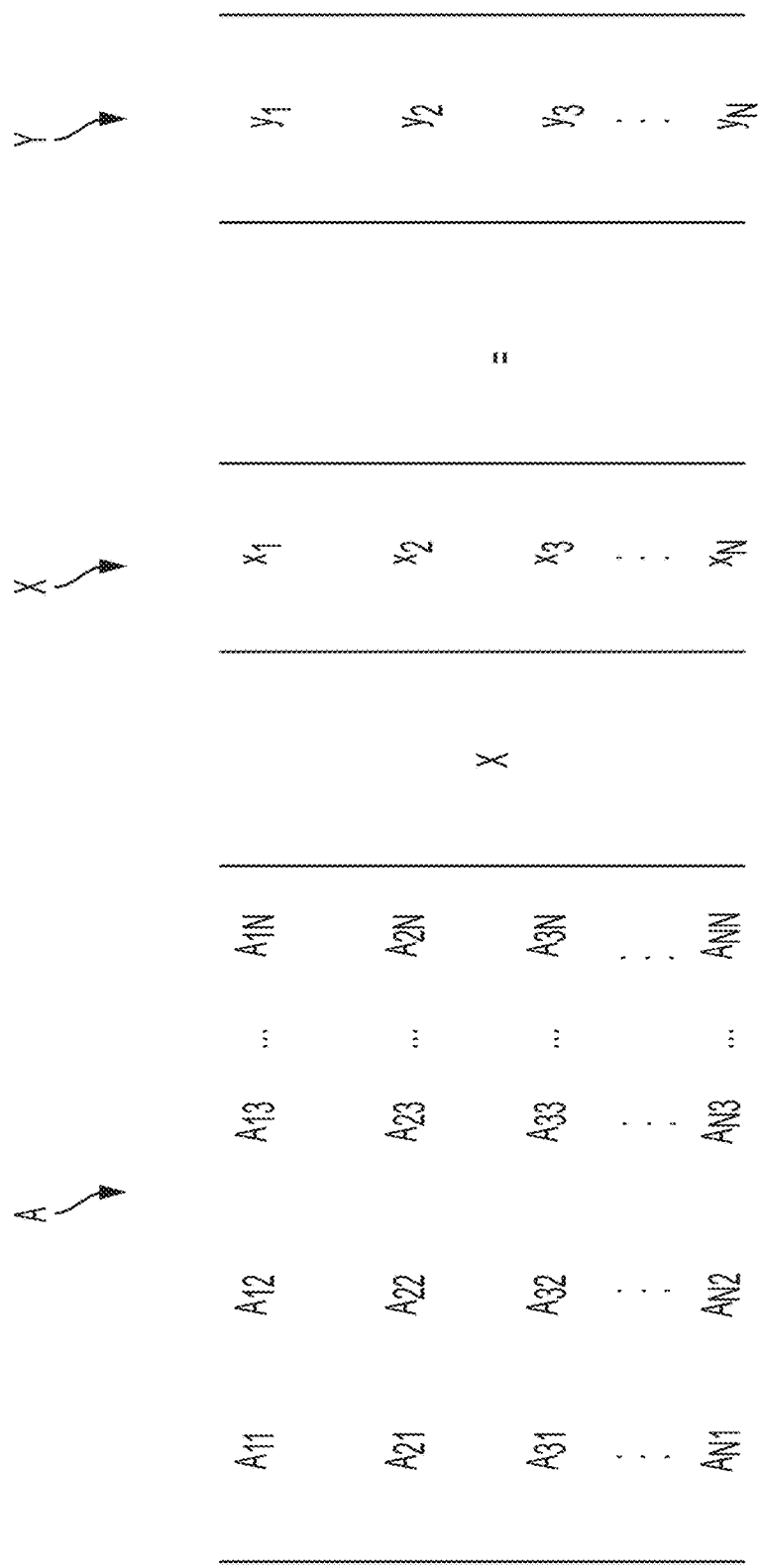

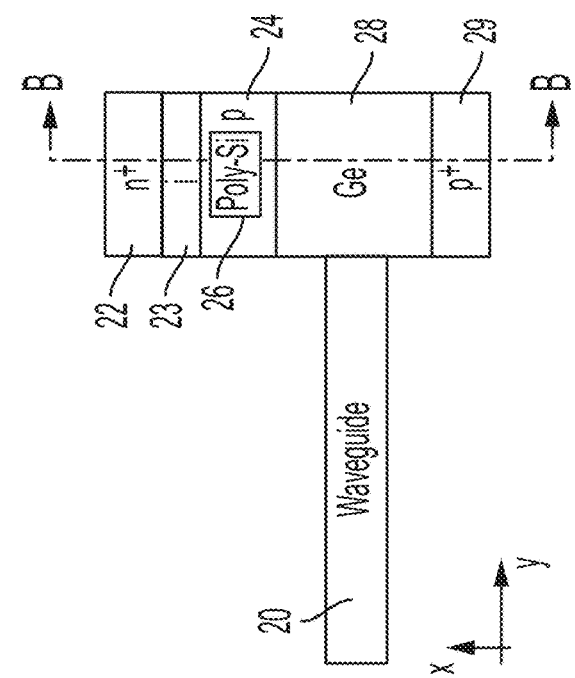
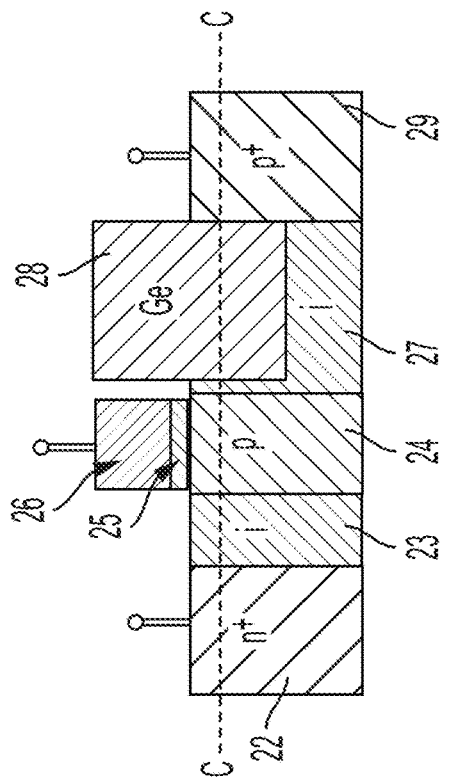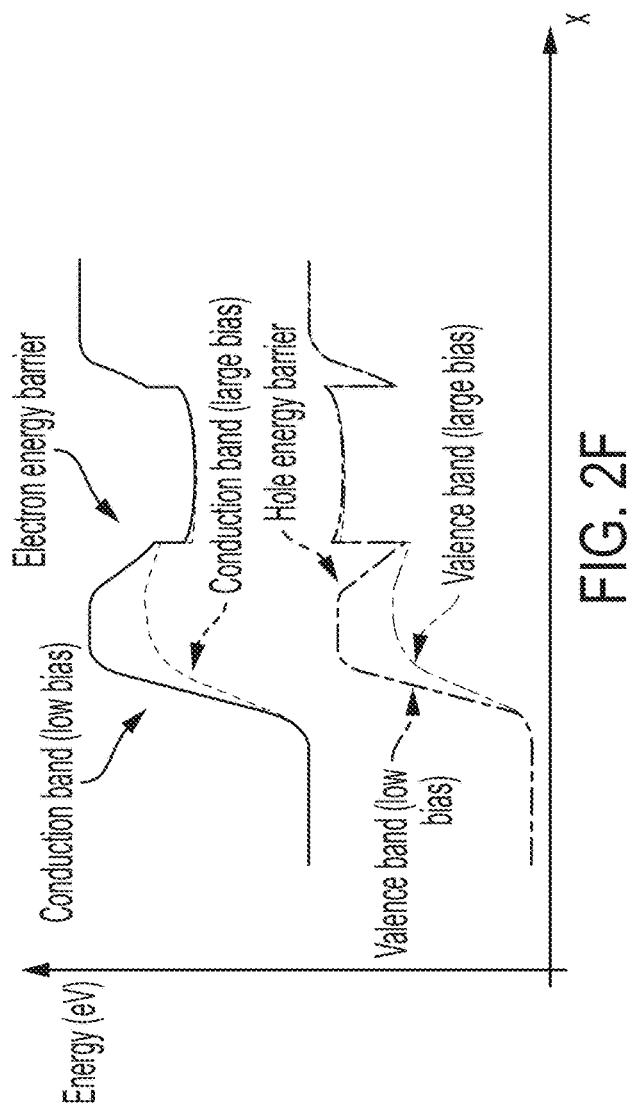

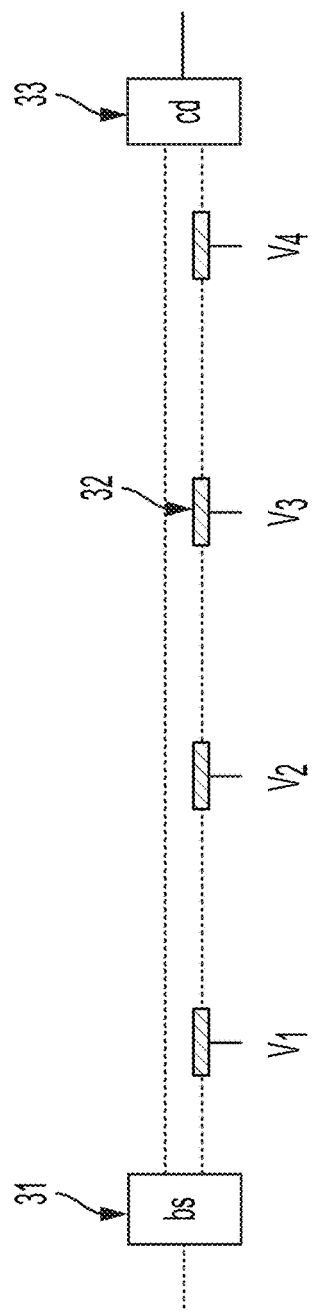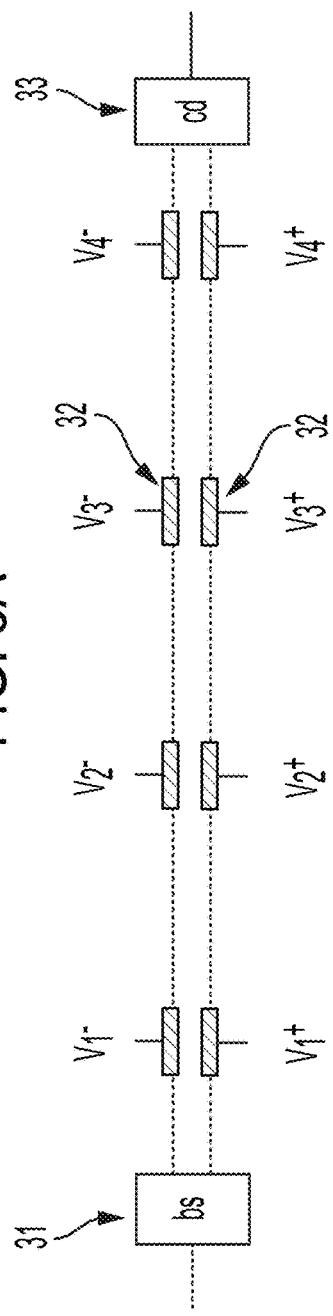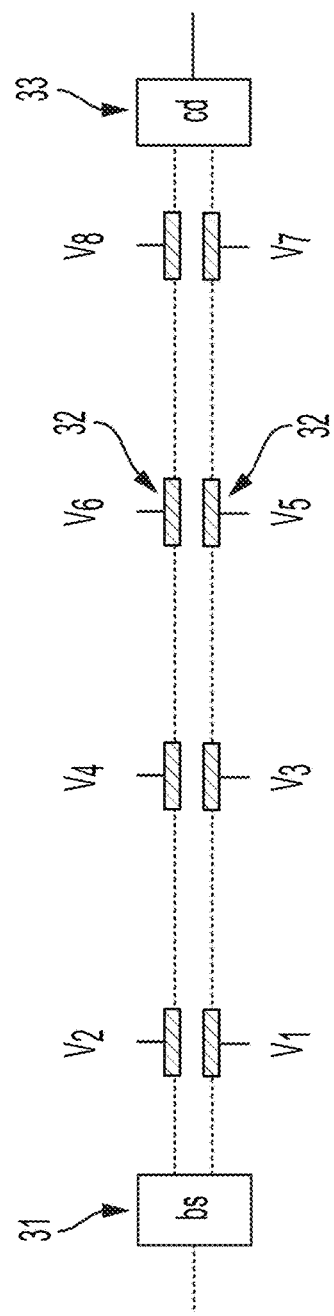
FIG. 3A
FIG. 3B
FIG. 3C

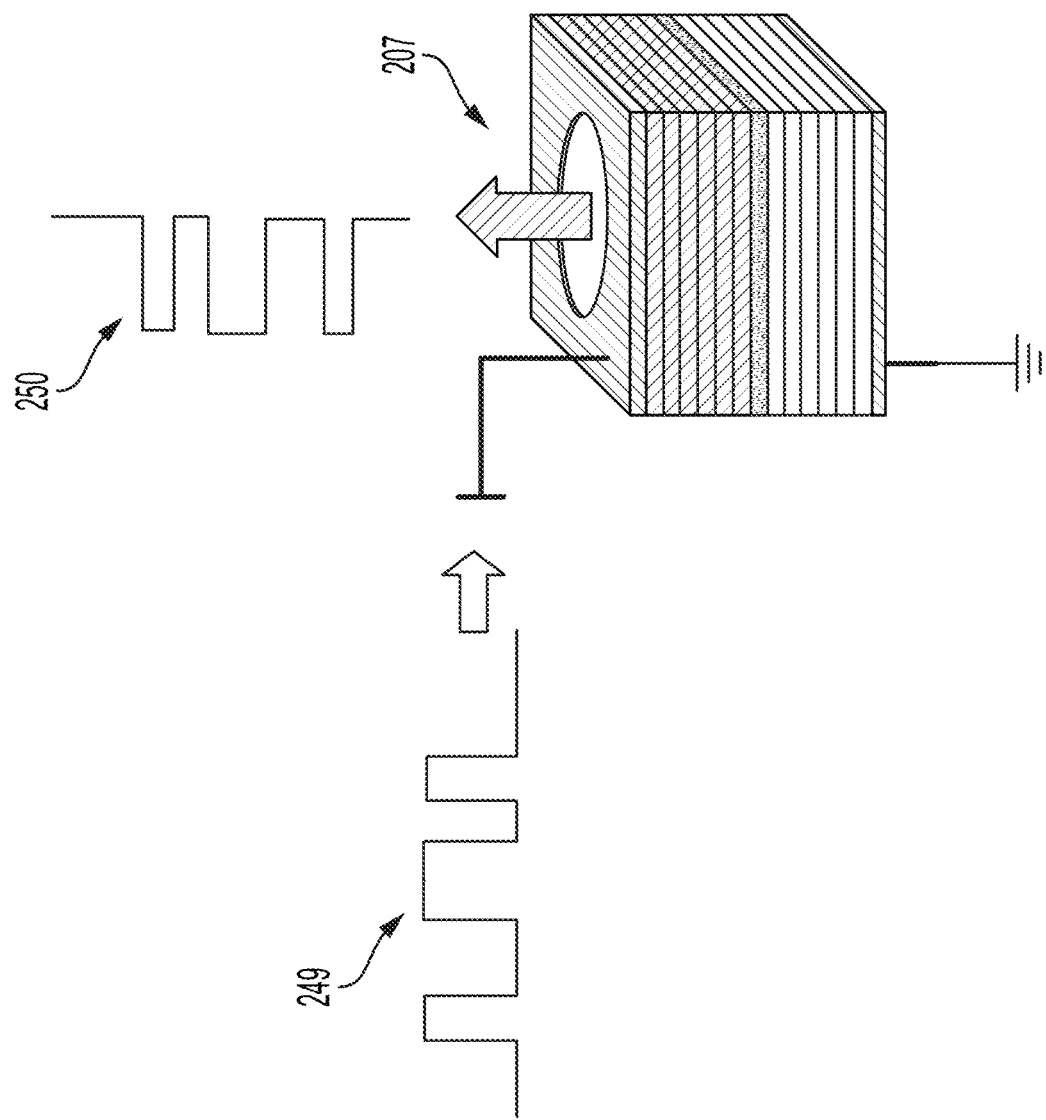

PHOTONICS PROCESSOR ARCHITECTURE

CROSS-REFERENCE TO RELATED APPLICATIONS

This application claims the benefit under 35 U.S.C. § 119(e) of U.S. Provisional Patent Application Ser. No. 63/016,127, entitled "VCSEL-BASED INTEGRATED OPTICAL-ELECTRONIC COMPUTING," filed on Apr. 27, 2020, U.S. Provisional Patent Application Ser. No. 63/088,915, entitled "PHOTONICS PROCESSOR ARCHITECTURE," filed on Oct. 7, 2020, U.S. Provisional Patent Application Ser. No. 63/092,289, entitled "PHOTONIC ADDER," filed on Oct. 15, 2020, and U.S. Provisional Patent Application Ser. No. 63/114,387, entitled "SEGMENTED COHERENT PHOTONIC ADDER FOR PHOTONIC ALGEBRA ACCELERATION," filed on Nov. 16, 2020, each of which is hereby incorporated herein by reference in its entirety.

BACKGROUND

Deep learning, machine learning, latent-variable models, neural networks, and other matrix-based differentiable programs are used to solve a variety of problems, including natural language processing and object recognition in images. Solving these problems with deep neural networks typically requires long processing times to perform the required computation. The most computationally intensive operations in solving these problems are often mathematical matrix operations, such as matrix multiplication.

SUMMARY OF THE DISCLOSURE

Some embodiments are directed to a photonic processor configured to perform matrix multiplication, the photonic processor comprising: a first encoder configured to produce a first input signal indicative of a first input value and a second encoder configured to produce a second input signal indicative of a second input value; a first multiplier configured to produce, based on the first input signal, a first output signal indicative of a first product of the first input value with a first matrix value; a second multiplier configured to produce, based on the second input signal, a second output signal indicative of a second product of the second input value with a second matrix value; an optical adder configured to receive light and to produce, based on the first and second output signals, a cumulative signal indicative of a sum of the first product with the second product; and a receiver configured to produce, based on the cumulative signal, an output value indicative of the sum.

In some embodiments, the optical adder comprises first and second optical phase shifters, and wherein the photonic processor further comprises a digital controller configured to: control the first optical phase shifter based on the first output signal, and control the second optical phase shifter based on the second output signal.

In some embodiments, the first and second optical phase shifters are optically connected in series.

In some embodiments, the optical adder further comprises a coherent detector coupled to the second optical phase shifter.

In some embodiments, the optical adder further comprises a first waveguide and a second waveguide, wherein the first and the second optical phase shifters are embedded in the first waveguide, and wherein the first and second waveguides are provided as inputs to the coherent detector.

In some embodiments, the optical adder further comprises a beam splitter coupled to the first and second waveguides.

In some embodiments, the first encoder is a first optical encoder such that the first input signal is a first optical input signal, and the second encoder is a second optical encoder such that the second input signal is a second optical input signal.

In some embodiments, the first multiplier comprises a first modulatable detector such that the first output signal is a first electrical output signal, and the second multiplier comprises a second modulatable detector such that the second output signal is a second electrical output signal.

In some embodiments, the first modulatable detector has a modulatable responsivity, wherein the first modulatable detector is configured to produce the first output signal by setting the modulatable responsivity based on the first matrix value.

In some embodiments, the first modulatable detector has a modulatable gain, wherein the first modulatable detector is configured to produce the first output signal by setting the modulatable gain based on the first matrix value.

In some embodiments, the first encoder is a first electronic encoder such that the first input signal is a first electrical input signal, and the second encoder is a second electronic encoder such that the second input signal is a second electrical input signal.

In some embodiments, the first multiplier comprises a Gilbert cell.

In some embodiments, the photonic processor further comprises a vertical cavity surface emitting laser (VCSEL) configured to generate the light with a wavelength less than 1.1 µm.

In some embodiments, the optical adder is formed on a silicon substrate and wherein the silicon substrate comprises a silicon nitride waveguide configured to couple the light with the wavelength less than 1.1 µm to the optical adder.

In some embodiments, the output value is equal to the sum.

Some embodiments are directed to a method for computing a numeric addition using light, the method comprising: producing first and second optical signals; providing the first optical signal to a first input of a coherent detector, wherein the providing comprises: modulating a phase of the first optical signal based on a first numeric value and further modulating the phase of the first optical signal based on a second numeric value; providing the second optical signal to a second input of the coherent detector; and adding the first numeric value to the second numeric value based on an output of the coherent detector.

In some embodiments, modulating the phase of the first optical signal based on the first numeric value comprises controlling a phase shifter using a voltage indicative of the first numeric value.

In some embodiments, the coherent detector comprises first and second photodetectors connected so that an anode of the first photodetector is coupled to a cathode of the second photodetector, and wherein adding the first numeric value to the second numeric value comprises mixing a first photocurrent at the anode of the first photodetector with a second photocurrent at the cathode of the second photodetector.

Some embodiments are directed to a photonic adder comprising: an optical splitter; a first waveguide coupled to a first output of the optical splitter, the first waveguide comprising first and second controllable phase shifters optically connected in series; a second waveguide coupled to a second output of the optical splitter; and a coherent detector comprising a first photodetector coupled to the first waveguide and a second photodetector coupled to the second waveguide.

In some embodiments, the photonic adder, further comprises a digital circuit configured to produce an output value indicative of a sum of a first input value with a second input value, wherein the producing comprises: controlling the first controllable phase shifter based on the first input value and controlling the second controllable phase shifter based on the second input value.

In some embodiments, the output value is equal to the sum of the first input value with the second input value.

In some embodiments, the second waveguide comprises third and fourth controllable phase shifters optically connected in series.

In some embodiments, the photonic adder further comprises an analog-to-digital converter (ADC) coupled to an output of the coherent detector.

In some embodiments, an anode of the first photodetector is electrically coupled to a cathode of the second photodetector.

Some embodiments are directed to a method for performing matrix multiplication, the method comprising: producing a first output signal indicative of a first product of a first input value with a first matrix value, wherein producing the first output signal comprises: controlling a first encoder to encode a first input signal based on the first input value; and controlling a first multiplier positioned in series with the first encoder based on the first matrix value; producing a second output signal indicative of a second product of a second input value with a second matrix value, wherein producing the second output signal comprises: controlling a second encoder to encode a second input signal based on the second input value; and controlling a second multiplier positioned in series with the second encoder based on the second matrix value; and controlling an optical adder to produce, based on the first and second output signals and further based on input light, a cumulative signal indicative of a sum of the first product with the second product.

In some embodiments, controlling the optical adder comprises coupling the light to the optical adder.

In some embodiments, the optical adder comprises a coherent detector, and wherein controlling the optical adder comprises reverse-biasing the coherent detector.

In some embodiments, the optical adder comprises first and second optical phase shifters optically connected in series, and wherein controlling the optical adder comprises: controlling the first optical phase shifter based on the first output signal; and controlling the second optical phase shifter based on the second output signal.

In some embodiments, controlling the first encoder comprises controlling a first optical encoder such that the first input signal is a first optical input signal.

In some embodiments, controlling the first multiplier based on the first matrix value comprises setting a characteristic of a modulatable detector based on the first matrix value.

Some embodiments are directed to a method of manufacturing a photonic adder, the method comprising: forming an optical splitter on a substrate; forming a first waveguide on the substrate so that the first waveguide is coupled to a first output of the optical splitter and comprises first and second controllable phase shifters optically connected in series; forming a second waveguide on the substrate so that the second waveguide is coupled to a second output of the optical splitter; and forming a coherent detector on the substrate so that the coherent detector comprises a first photodetector coupled to the first waveguide and a second photodetector coupled to the second waveguide.

In some embodiments, forming the first waveguide comprises forming the first and second optical phase shifters to be optically connected in series.

In some embodiments, forming the optical adder further comprises a coherent detector coupled to the second optical phase shifter.

Some embodiments are directed to an integrated photonics system comprising: a vertical cavity surface emitting laser (VCSEL); and a photonic integrated circuit (PIC) comprising a photonic processor configured to perform matrix multiplication, wherein the VCSEL is optically coupled to the photonic processor.

In some embodiments, the VCSEL is configured to generate light having a center wavelength less than 1.1 µm, and the PIC further comprises a waveguide optically coupling the VCSEL to the photonic processor, the waveguide being transparent to the center wavelength.

In some embodiments, the VCSEL is directly modulatable.

In some embodiments, the integrated photonics system further comprises an optical signal monitor configured to monitor an intensity of the light generated by the VCSEL.

In some embodiments, the VCSEL is a first VCSEL, the waveguide is a first waveguide, the center wavelength is a first center wavelength and the photonics system further comprises: a second VCSEL configured to generate light having a second center wavelength less than 1.1 µm; and a second waveguide optically coupling the second VCSEL to the photonic processor, the second waveguide being transparent to the second center wavelength.

In some embodiments, the first center wavelength differs from the second center wavelength.

In some embodiments, the photonic processor comprises a plurality of modulatable detectors, wherein the photonic processor is configured to perform matrix multiplication at least in part using the plurality of modulatable detectors.

In some embodiments, the PIC comprises a silicon substrate, and the waveguide comprises silicon nitride.

In some embodiments, the waveguide is optically coupled to the VCSEL at least in part by an out-of-plane optical coupler.

Some embodiments are directed to a method of operating an integrated photonics system to perform matrix multiplication, the method comprising: coupling light to a photonic processor of a photonic integrated circuit (PIC), wherein the coupling comprises: generating the light with a vertical cavity surface emitting laser (VCSEL); and coupling the light generated by the VCSEL to the photonic processor using a waveguide of the PIC; and using the light to perform matrix multiplication.

In some embodiments, generating the light with the VCSEL comprises generating light having a center wavelength less than 1.1 µm, and wherein coupling the light generated by the VCSEL to the photonic processor using the waveguide of the PIC comprises using a waveguide being transparent to the center wavelength.

In some embodiments, using the light to perform matrix multiplication comprises modulating the light using a plurality of modulatable detectors.

In some embodiments, generating the light with the VCSEL comprises directly modulating the VCSEL.

In some embodiments, the method further comprises monitoring an intensity of the light generated by the VCSEL.

In some embodiments, generating the light with the VCSEL further comprises generating a feedback signal based on the actual intensity of the light generated by the VCSEL.

In some embodiments, generating the light with the VCSEL comprises generating light having a first center wavelength, and wherein coupling the light to the photonic processor further comprises: generating the light with a second VCSEL, the second VCSEL configured to generate light having a second center wavelength less than 1.1 µm; coupling the light generated by the second VCSEL to the photonic processor using a second waveguide of the PIC, the waveguide being transparent to the center wavelength of the light generated by the second VCSEL.

In some embodiments, generating light having a second center wavelength comprises generating light having a different center wavelength than the first center wavelength.

Some embodiments are directed to a method of manufacturing an integrated photonics system, comprising: obtaining a substrate comprising a vertical cavity surface emitting laser (VCSEL) configured to generate light having a center wavelength less than 1.1 µm; obtaining a photonic integrated circuit (PIC) comprising: a photonic processor configured to perform matrix multiplication; and a waveguide optically coupled to the photonic processor, the waveguide being transparent to the center wavelength; and bonding the VCSEL to the PIC so that the waveguide optically couples the VCSEL to the photonic processor.

In some embodiments, wherein bonding the VCSEL to the PIC comprises flip-chip bonding the substrate comprising the VCSEL to the PIC.

In some embodiments, the PIC is formed on a silicon substrate and the waveguide is formed of silicon nitride.

BRIEF DESCRIPTION OF DRAWINGS

Various aspects and embodiments of the application will be described with reference to the following figures. It should be appreciated that the figures are not necessarily drawn to scale. Items appearing in multiple figures are indicated by the same reference number in the figures in which they appear.

FIG. 1A is a representation of a matrix-vector multiplication, in accordance with some embodiments.

FIG. 1B illustrates a portion of the matrix-vector multiplication of FIG. 1A, in accordance with some embodiments.

FIG. 2D is a top view of a photodetector including a metal-oxide-semiconductor capacitor (MOS cap), in accordance with some embodiments.

FIG. 2E is a cross sectional view of the photodetector of FIG. 2D taken along the BB line, in accordance with some embodiments.

FIG. 2F is an energy band diagram plotted along the CC line of FIG. 2E, in accordance with some embodiments.

FIGS. 3A-3C are block diagrams illustrating examples of photonic adders, in accordance with some embodiments.

FIG. 6B is a schematic view of a directly modulated VCSEL, in accordance with some embodiments.

DETAILED DESCRIPTION

I. Overview

Figure 2A:
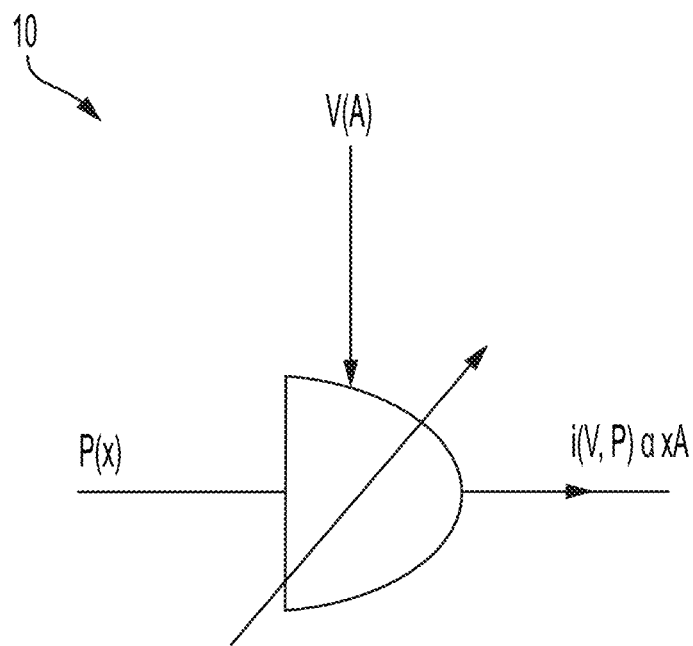
FIG. 2A is a block diagram illustrating a modulatable detector, in accordance with some embodiments.

Some embodiments relate to processor architectures configured to perform additions and/or multiplications in the optical domain. The inventors have recognized and appreciated that the manner in which conventional electronic processors perform additions and multiplications is inefficient. Conventional electronic processors face severe speed and efficiency limitations primarily due to the inherent presence of parasitic capacitance in electrical interconnects. Conductive traces interconnect those portions of an electronic processor that perform additions and multiplications. Large values of impedance limit the maximum rate at which data can be transferred through the trace with an acceptable bit error rate. With such conventional processors, for example, performing additions and multiplications at rates in the tens of gigahertz is very challenging, if not prohibitive. As a result, conventional processors are typically clocked at frequencies below 2 GHz.

The inventors have recognized and appreciated that performing additions and multiplications in the optical domain overcomes the aforementioned problems with electronic computing. Optical signals travel at the speed of light and are not affected by parasitic capacitance. Thus, the latency of optical signals is far less of a limitation than electrical propagation delay. Additionally, no power is dissipated by increasing the distance traveled by the light signals, opening up new topologies and processor layouts that would not be feasible using electronic signals. Thus, optical adders and multipliers (referred to herein also as "photonic adders" and "photonic multipliers") offer far better speed and efficiency performance than their electronic counterparts. Processors leveraging such optical components may be fast enough to support clock frequencies in excess of 15 GHz or even 20 GHz, which represents a substantial improvement over conventional processors.

Processors are well-suited for particular types of algorithms. For example, many machine learning algorithms (e.g., support vector machines, artificial neural networks and probabilistic graphical model learning) rely heavily on linear transformations on multi-dimensional arrays/tensors. The simplest linear transformation is a matrix-vector multiplication, which using conventional algorithms has a complexity on the order of $O(N^2)$, where N is the dimensionality of a square matrix being multiplied by a vector of the same dimension. General matrix-matrix (GEMM) operations are ubiquitous in software algorithms, including those for graphics processing, artificial intelligence, neural networks and deep learning. GEMM calculations in today's computers are typically performed using transistor-based systems such as GPUs or systolic array systems.

FIG. 1A is a representation of a matrix-vector multiplication, in accordance with some embodiments. Matrix A is referred to herein as "input matrix" or simply "matrix," and the individual elements of matrix A are referred to herein as "matrix values values" or "matrix parameters." Vector X is referred to herein as "input vector," and the individual elements of vector X are referred to as "input value," or simply "inputs." Vector Y is referred to herein as "output vector," and the individual elements of vector Y are referred to as "output values," or simply "outputs." In this example, A is an N×N matrix, though embodiments of the present application are not limited to square matrices or to any specific dimension. In the context of artificial neural networks, matrix A can be a weight matrix, or a block of submatrix of the weight tensor, or an activation (batched) matrix, or a block of submatrix of the (batched) activation tensor, among several possible examples. Similarly, the input vector X can be a vector of the weight tensor or a vector of the activation tensor, for example.

The matrix-vector multiplication of FIG. 1A can be decomposed in terms of scalar multiplications and scalar additions. For example, FIG. 1B illustrates how to obtain an output value $y_i$ (where i=1, 2 . . . N) as a linear combination of the input values $x_1$, $x_2$ . . . $x_N$. Obtaining $y_i$ involves performing scalar multiplications (e.g., $A_{i1}$ times $x_1$, and $A_{i2}$ times $x_2$) and scalar additions (e.g., $A_{i1}x_1$ plus $A_{i2}x_2$). Some embodiments of the present disclosure relate to techniques for performing scalar multiplications in the optical domain.

Some embodiments of the present disclosure relate to techniques for performing scalar additions in the optical domain.

II. Optical Multipliers

Some embodiments perform scalar multiplications in the optical domain using optical multipliers. Optical multipliers of the types described herein are designed so that at least one of the inputs to the multipliers is represented by an optical signal. The other input(s) to the multiplier may be represented by optical signals or electronic signals. The output(s) of the multiplier may be represented by the optical signals or electronic signals.

One example of an optical multiplier is a "modulatable detector." The inventors have appreciated that some optical multipliers occupy substantial chip real estate due to the presence of lengthy optical interferometers. This limits the number of multipliers that can be integrated on a single chip, thus limiting the computational capabilities of photonic processors that employ these multipliers. Some embodiments relate to compact optical multipliers that are based on modulatable detectors. Modulatable detectors are optical detectors having at least one characteristic that can be controlled by a user using an electronic control signal. These detectors are designed so that varying the magnitude of a control signal (e.g., a voltage or a current) alters a characteristic of the detector, such as the detector's responsivity, gain, impedance, conductance, etc. The result is that the detector's photocurrent depends not only on the optical power that the detector receives, but also on the control signal applied to the detector. Optical multipliers based on modulatable detectors are designed so that one of the factors to be multiplied modulates the modulatable characteristic. For example, in some of the embodiments in which the modulatable characteristic is the detector's responsivity, the responsivity may be controlled based on a matrix parameter $A_{ij}$. Modulatable detectors are substantially more compact that interferometric optical multipliers, thus allowing for a much higher degree of integration per unit area.

FIG. 2A is a block diagram illustrating a modulatable detector, in accordance with some embodiments. Modulatable detector 10 receives as input an optical signal having power P, and in response, produces a photocurrent i (the dark current of the modulatable detector will be neglected from this discussion). The photocurrent i is related to the input optical power by the following expression: i=P/R, where R is the responsivity of the modulatable detector. In addition to being dependent upon optical power P, the photocurrent is also dependent upon control voltage V (or, in other embodiments, another type of electronic signal such a control current). This detector is preceded by the term "modulatable" to indicate that the photocurrent can be modulated by the application of a control electronic signal. The modulatable detector of FIG. 2A may be used to implement an optical multiplier. For example, a first scalar value x may be encoded in optical power P and a second scalar value A may be encoded in voltage V so that photocurrent i, which is a function of both P and V, is proportional to the product x times A. Example implementations of modulatable detector 10 are described in detail further below.

Figure 2B:
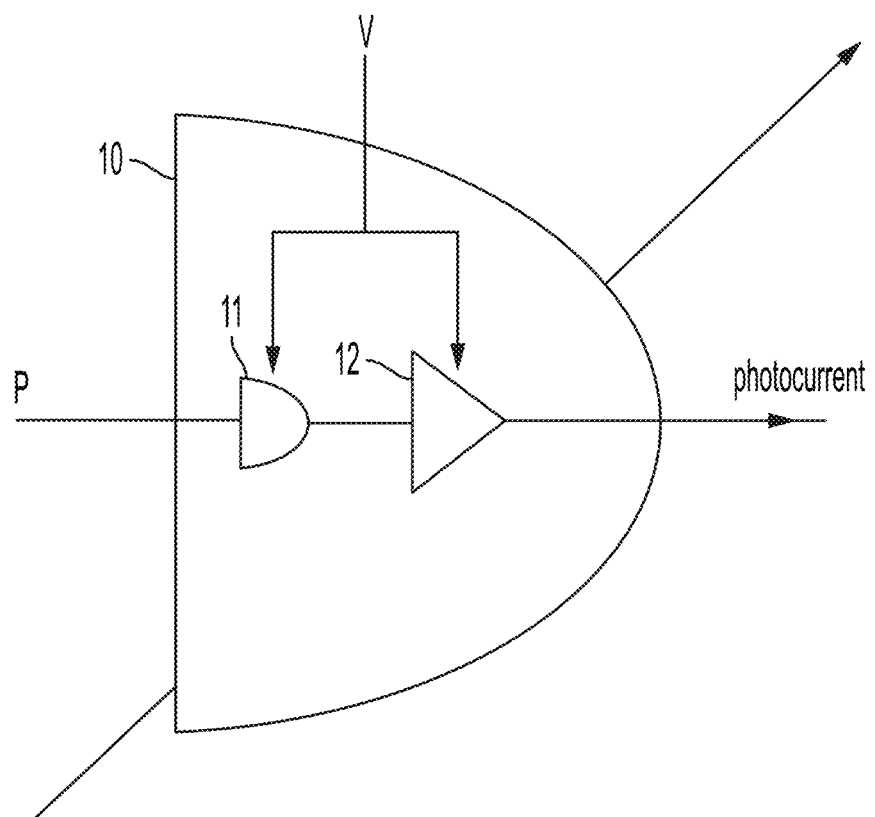
FIG. 2B is a block diagram illustrating the modulatable detector of FIG. 2A in additional detail, in accordance with some embodiments.

FIG. 2B is a block diagram illustrating a modulatable detector in additional detail, in accordance with some embodiments. Modulatable detector 10 includes a photodetector 11 and a gain stage 12. Photodetector 11 may be implemented using a photoconductor, a photodiode, an avalanche photodiode, a phototransistor, a photomultiplier (e.g., a tube), a superconducting detector, a graphene-based detector, or any other suitable type of photo-sensitive device. Gain stage 12 can include, for example, a current amplifier for amplifying the current generated by photodetector 11. In some embodiments, modulating a characteristic of modulatable detector 10 may involve modulating, using voltage V (or using a control current), the responsivity of photodetector 11 and/or the gain (e.g., current gain) or impedance of gain stage 12.

Figure 2C:
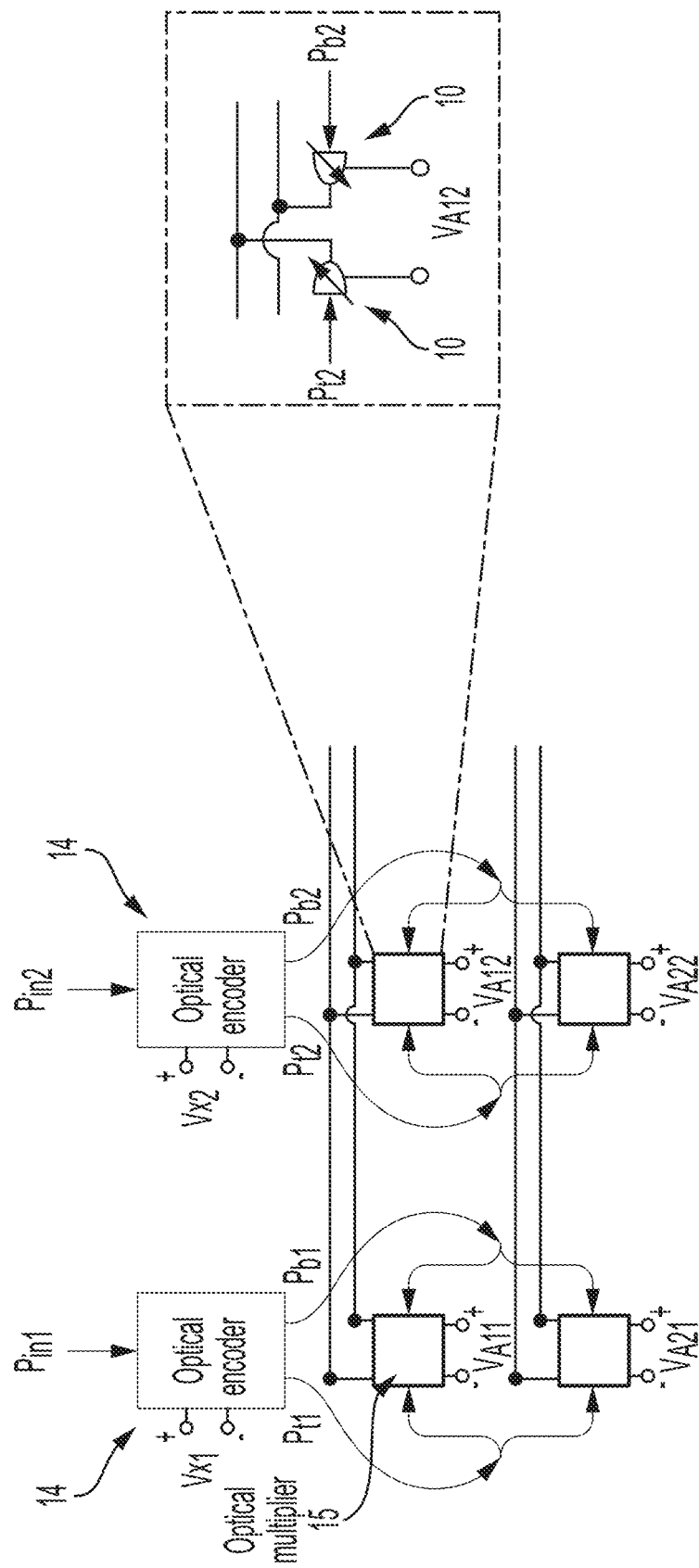
FIG. 2C is a block diagram illustrating a plurality of optical multipliers based on the modulatable detectors of FIG. 2A, in accordance with some embodiments.

In some embodiments, multiple modulatable detectors are used to perform the various scalar multiplications needed to perform matrix-vector multiplication. The architecture of FIG. 2C is designed to perform four scalar multiplications: an input vector having two input values is multiplied by a 2×2 matrix, though this architecture may be scaled to any other dimensions. The values of the input vector are identified as $x_1$ and $x_2$. Voltage $V_{x1}$ is a voltage that is encoded with (is proportional to or depends upon in some other fashion from) $x_1$ and voltage $V_{x2}$ is a voltage that is encoded with $x_2$. Optical encoders 14 encode $V_{x1}$ and $V_{x2}$ into a pair of optical signals having powers $P_{in1}$ and $P_{in2}$, respectively. In this example, the optical encoders operate in a differential fashion. Accordingly, the first optical encoder 14 outputs a pair of optical signals $P_{t1}$ and $P_{b1}$ that are encoded such that the difference $P_{t1}-P_{b1}$ is proportional to $x_1$. Similarly, the second optical encoder 14 outputs a pair of optical signals $P_{t2}$ and $P_{b2}$ that are encoded such that the difference $P_{t1}-P_{b2}$ is proportional to $x_2$.

These optical signals are provided as inputs to a set of four optical multipliers 15. As illustrated in the inset of FIG. 2C, each optical multiplier 15 includes a pair of modulatable detectors 10. The first optical multiplier 15 multiplies input value $x_1$ times matrix value $A_{11}$; the second optical multiplier 15 multiplies input value $x_1$ times matrix value $A_{21}$; the third optical multiplier 15 multiplies input value $x_2$ times matrix value $A_{12}$; and the fourth optical multiplier 15 multiplies input value $x_2$ times matrix value $A_{22}$. These multiplications are performed as follows. Voltages $V_{A11}$, $V_{A12}$, $V_{A21}$ and $V_{A22}$ are encoded with matrix values $A_{11}$, $A_{12}$, $A_{21}$ and $A_{22}$, respectively. Each optical multiplier 15 produces a pair of photocurrents, where the difference between the photocurrents is proportional to the respective input value multiplied by the respective matrix value. This is achieved by allowing a characteristic of the modulatable detector to be controlled by the respective voltage $V_{Aij}$. For example, the voltage $V_{Aij}$ may modulate the responsivity of photodetectors 11 and/or may modulate the gain of gain stage 12.

As discussed above, modulatable detectors of the types described herein are optical detectors having at least one characteristic that can be controlled by a user using one or more electronic control signals. Therefore, modulatable detectors have at least one electrical control terminal. These detectors are designed so that application of a control signal (e.g., a voltage, current or charge) alters a characteristic of the detector, such as the detector's responsivity, gain, impedance, etc. The result is that the detector's photocurrent depends not only on the optical power incident on the detector, but also on the control signal applied to the detector.

In one example, a modulatable detector 10 includes a photodetector 11 having a modulatable responsivity. One such modulatable detector is illustrated in FIGS. 2D-2G, in accordance with some embodiments. FIG. 2D is a top view and FIG. 2E is a cross sectional view of a representative photodetector having a modulatable responsivity. FIG. 2E is taken along the BB line of FIG. 2D. This photodetector includes a waveguide 20 (e.g., a silicon or silicon nitride waveguide), a highly doped n region (n+ region) 22, an intrinsic region (i region) 23, a p region 24, an oxide layer (e.g., silicon dioxide) 25, a poly-silicon layer (or a layer made of another conductive material) 26, an intrinsic region (i region) 107, a photo-absorption region 28 including germanium (or including another absorbing material) and a highly doped p region (p+ region) 29. In some embodiments, the germanium region is also shaped to form an optical waveguide.

Waveguide 20 abuts germanium region 28. In this way, light traveling down waveguide 20 is transmitted to germanium region 28, and as a result, is absorbed. Germanium region 28 is positioned on top of intrinsic region 107. For example, germanium region 28 is grown epitaxially on silicon. The highly doped regions 22 and 29 are connected to respective electrodes. P region 24 is positioned adjacent to germanium region 28. Oxide layer 25 is positioned on top of p region 24, and poly-silicon layer 26 is positioned on top of oxide layer 25.

Collectively, p region 24, oxide layer 25 and poly-silicon layer 26 form a metal-oxide-semiconductor capacitor (MOS cap). It should be appreciated that control capacitors other than the MOS cap may be used in some embodiments, including for example a Shottky junction-capacitor or a graphene-based capacitor. FIG. 2F illustrates the energy band diagram of the photodetector of FIG. 2E along the CC line. The diagram illustrates four bands. The top bands represent the conduction band when a low bias voltage is applied to the MOS cap and the conduction band when a large bias voltage is applied to the MOS cap. The bottom bands represent the valance band when a low bias voltage is applied to the MOS cap and the valence band when of large a bias voltage is applied to the MOS cap.

The voltage applied between the n+ and p+ regions controls the electric field along the x-axis. In the diagram of FIG. 2F, this voltage produces a reverse bias. The reverse bias, in turn, produces an electric field oriented along the x-axis. This electric field sweeps photogenerated carriers away from the germanium region, assuming that the photocarriers have sufficient energy to overcome the energy barrier existing at the interface between the Ge region 28 and the p region 24.

The voltage applied to the MOS cap or other control capacitors (referred to as the gate voltage) determines the extent of the electron and hole energy barriers at the interface between the Ge region 28 and the p region 24. When the bias voltage applied to the MOS cap is low, both the electron and the hole energy barriers are relatively large. Under these conditions, carriers photogenerated in the germanium region are blocked, and as a result, do not produce a significant photocurrent. To the contrary, when the bias voltage applied to the MOS cap is large, both the electron and the hole energy barriers are relatively low. Under these conditions, carriers photogenerated in the germanium region have sufficient energy to overcome the respective barriers, and as a result, produce a photocurrent. Thus, the voltage applied to the MOS cap controls the responsivity of the photodetector.

In some embodiments, a photodetector includes an avalanche region in which photogenerated carriers experience impact ionization, thereby producing gain. In the example of FIGS. 2D-2E, i region 23 forms an avalanche region. In other embodiments, the avalanche region may include a quasi-i region (e.g., a region with doping concentration less than $10^{-14}$ $cm^{-3}$). Impact ionization occurs in the avalanche region, which amplifies the photocurrent. Thus, the presence of the avalanche region increases the sensitivity of the photodetector. In some embodiments, the responsivity of the photodetector may be modulated by controlling the gain associated with the avalanche region.

Figure 2G:
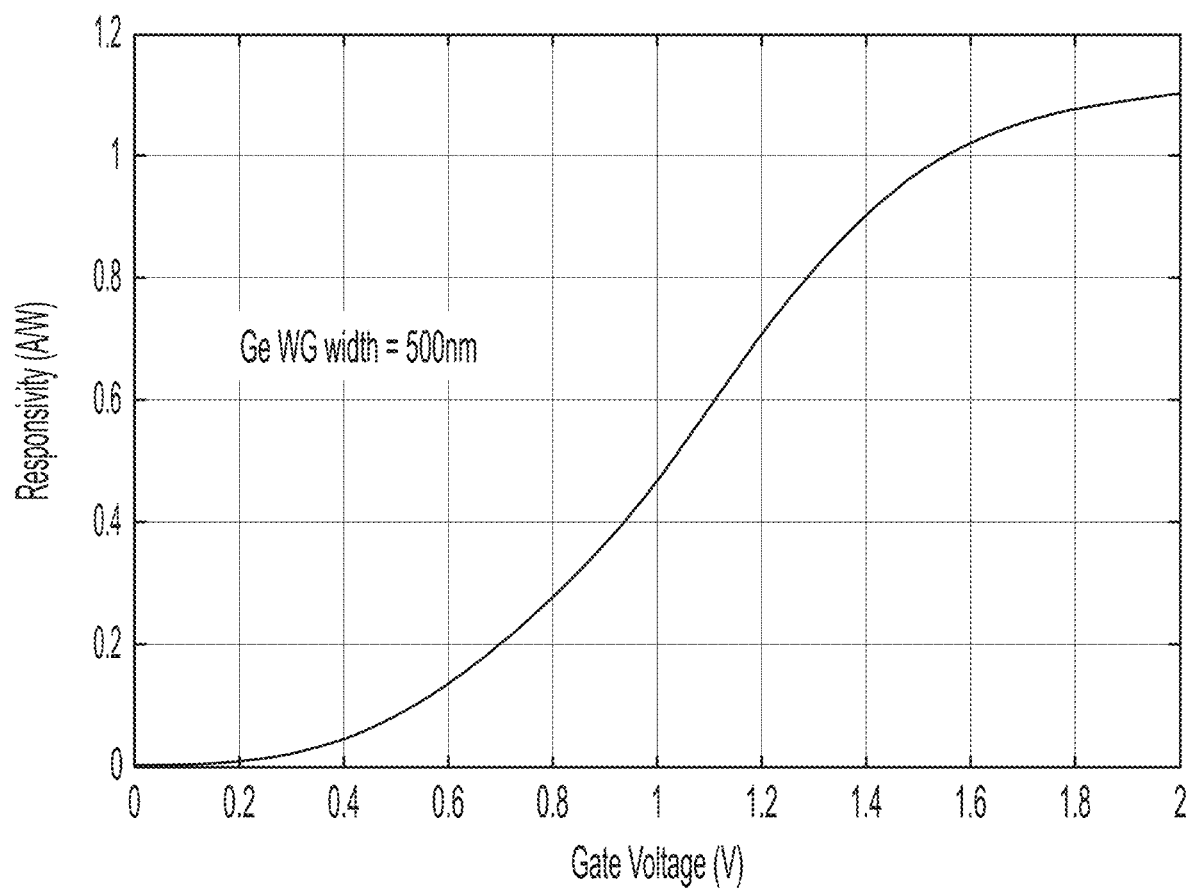
FIG. 2G is a plot illustrating an example responsivity for the photodetector of FIG. 2D in accordance with some embodiments.

FIG. 2G is a plot illustrating the responsivity of a photodetector of the type depicted in FIGS. 2D-2E. In this example, the germanium region has a width (measured in the direction parallel to the x-axis) of 500 nm. As shown, varying the voltage applied to the MOS cap (the gate voltage) results in a change in the responsivity of the photodetector. As discussed above, this change in responsivity occurs because the voltage controls the extent of the energy barriers.

Figure 2H:
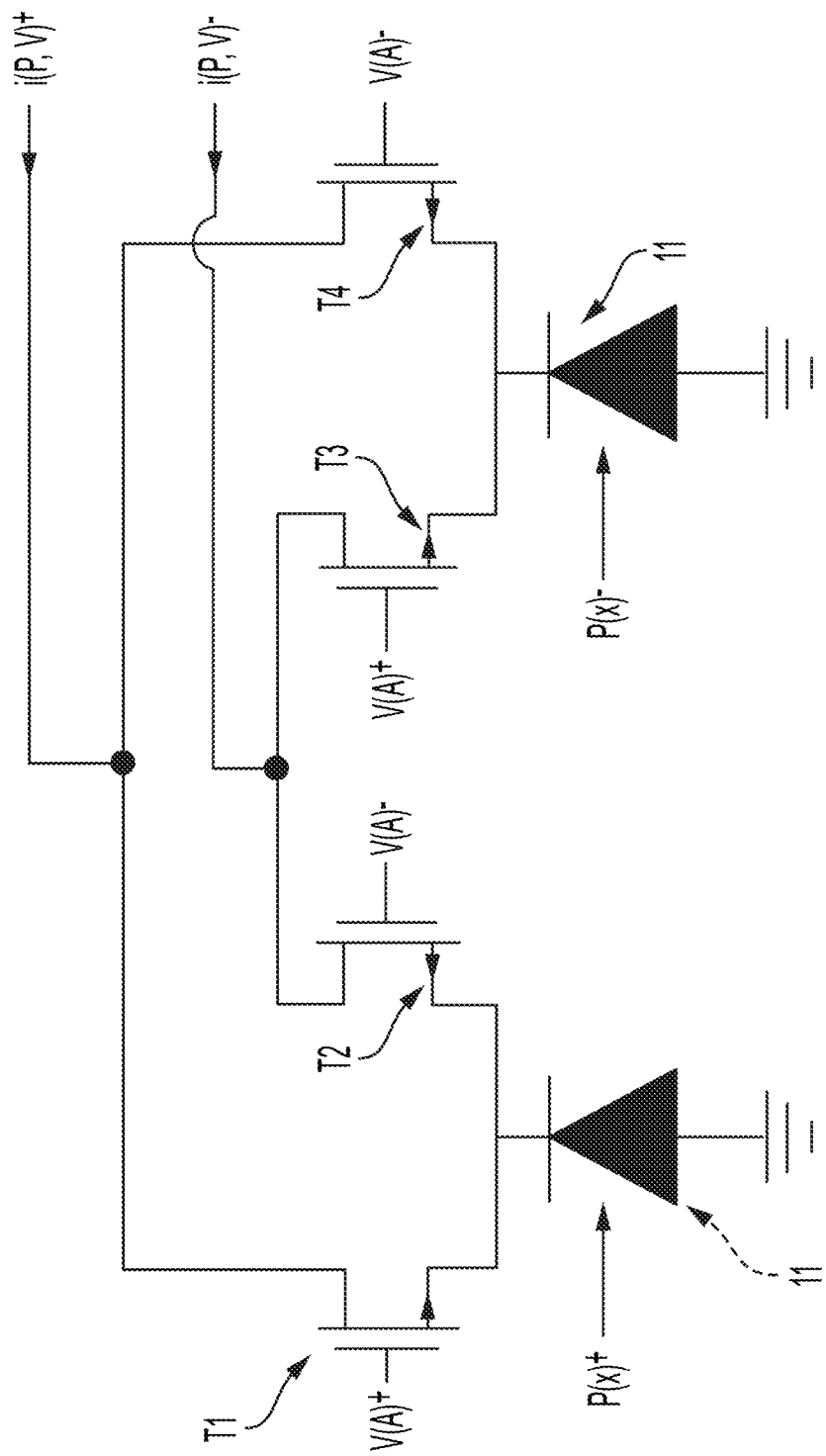
FIG. 2H is a circuit diagram of a modulatable detector, in accordance with some embodiments.

In another example, a modulatable detector 10 includes a gain stage 12 having a modulatable gain. FIG. 2H is a circuit diagram of a modulatable detector having a gain stage characterized by a modulatable current gain, in accordance with some embodiments. In this modulatable detector, gain stage 12 is implemented using transistors. Further, this modulatable detector operates in a differential fashion.

In this modulatable detector, optical powers $P(x)^-$ and $P(x)^+$ are encoded with numeric value x (such that, for example, the difference $P(x)^+ - P(x)^-$ is proportional to x). Voltages $V(A)^+$ and $V(A)^-$ are encoded with numeric value A (such that, for example, the difference $V(A)^+ - V(A)^-$ is proportional to A) and modulate the current gain. Photocurrents $i(P, V)^+$ and $i(P, V)^-$ represent the product of numeric value x times numeric value A (such that, for example, the difference $i(P, V)^+ - i(P, V)^-$ is proportional to x multiplied by A). It should be appreciated that, while this figure illustrates gain stages formed using MOS transistors, any other suitable type of transistor may be used, including bipolar junction transistors (BJTs) and junction field effect transistors (JFETs). Thus, as used herein, the term "gate" indicates the gate of a field effect transistor or the base of a bipolar transistor, the term "source" indicates the source of a field effect transistor or the emitter of a bipolar transistor and the term "drain" indicates the drain of a field effect transistor or the collector of a bipolar transistor. It should also be noted that the drain and source of a transistor may be interchangeable. Accordingly, in some embodiments, when the drain of a transistor is described as being coupled to a certain terminal, this includes the configuration in which the source of the transistor is coupled to the terminal (and vice versa). The modulatable detectors of FIG. 2H allow for encoding of signed numeric values. In these embodiments, in fact, the sign of a numeric value (positive or negative) is represented based on the direction of the photocurrent(s).

This modulatable detector illustrated in FIG. 2H includes a gain stage with two differential pairs (see transistor pair T1-T2 and transistor pair T3-T4) with cross-coupled connections. The drain of transistor T1 is coupled to the drain of transistor T4, and the drain of transistor T2 is coupled to the drain of transistor T3. Photodetectors 11 are coupled to the sources of transistors T1-T4. Voltages $V(A)^-$ and $V(A)^+$ control the current gain of the gain stage, and photocurrents $i(P, V)^+ - i(P, V)^-$ represent the product of numeric value x times numeric value A. The modulatable detector of FIG. 2H provides high speed operation, optical-power-independent overall responsivity, robustness to process variation and mismatch, and large common mode rejection ratio (CMRR) on both the P and V inputs.

Not all embodiments use modulatable detectors to perform multiplications in the optical domain. Other optical modulators can be used, including for example optical interferometers, optical resonators, or other optical devices to perform multiplications in the optical domain. In these embodiments, the output of the multiplication may be represented by an optical signal.

III. Optical Adders

The inventors have developed optical adders that improve upon the speed of conventional electronic adders. The adders developed by the inventors leverage the relative immunity of light to parasitic capacitance. Furthermore, because light is also immune to electromagnetic interference, the adders developed by the inventors are less susceptible to cross talk than their electronic counterparts.

Optical adders of the types described herein are designed to generate optical signals encoding the sum of two or more scalar values. In some embodiments, an optical adder can be implemented by embedding a series of phase shifters in an optical interferometer. The phase-space addition can be measured through coherent interference with a reference field (typically called a local oscillator), for example using homodyne detection. The added benefit of coherent detection schemes is that there is typically a field product term between the signal field and the local oscillator field that effectively results in amplification of the signal field.

Figure 3D:
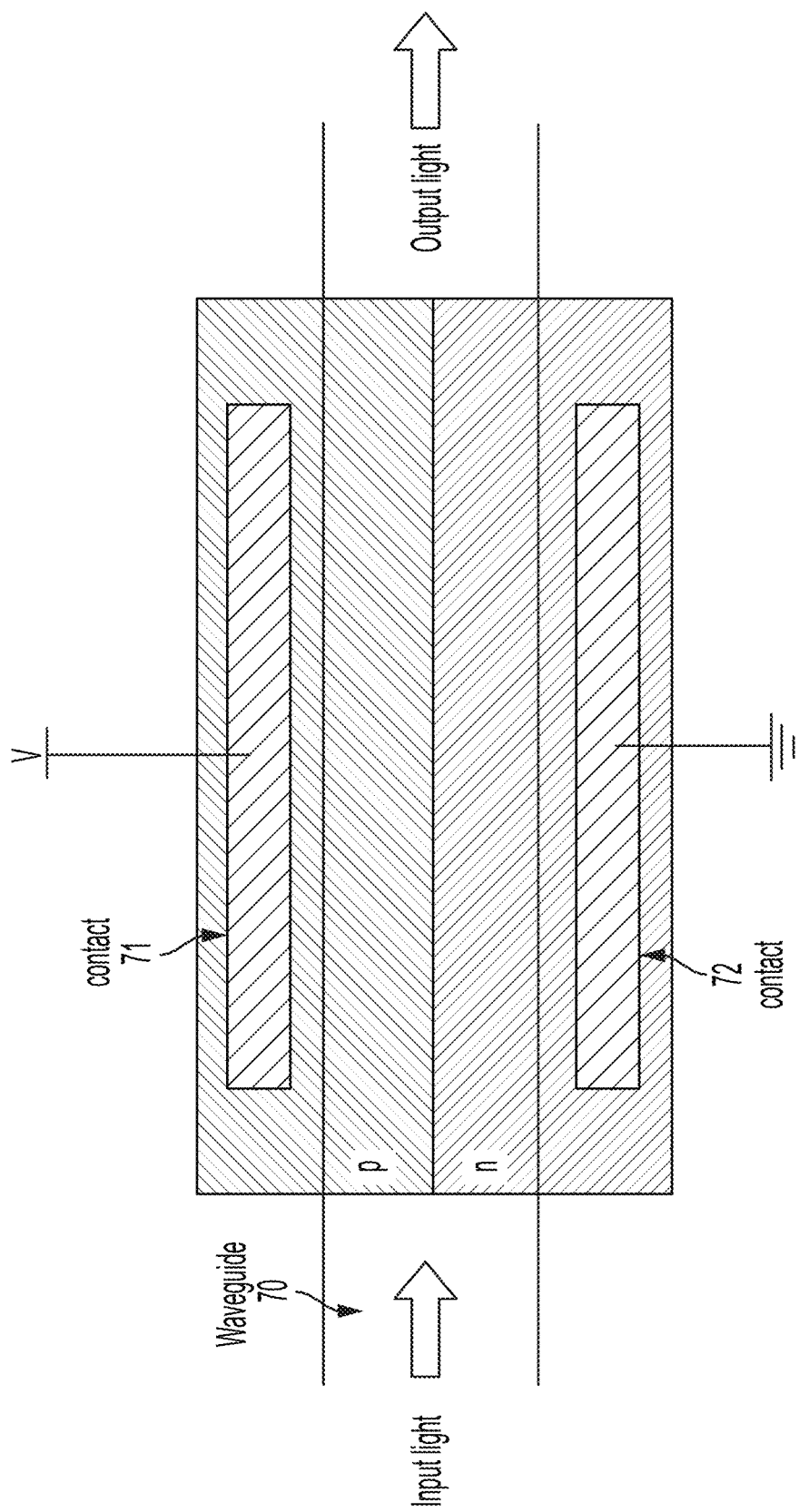
FIG. 3D is a schematic diagram illustrating a phase shifter, in accordance with some embodiments.

An example of such an optical adder is depicted in FIG. 3A, in accordance with some embodiments (in FIGS. 3A-3C, broken lines represent optical channels, such as optical waveguides, and solid lines represent electrical channels, such as conductive traces). This optical adder is embedded in an interferometer having a pair of optical waveguides. An optical beam splitter 31 receives input light and splits the received light (e.g., in equal parts) between the waveguides of the interferometer. The optical beam splitter may be implemented using any suitable optical device, including for example a directional coupler or a Y-junction. A series of optical phase shifters 32 is embedded in one of the waveguides. Each phase shifter is controlled by a respective control voltage $V_1$, $V_2$, $V_3$ and $V_4$ (though not all embodiments are limited to having four phase shifters, as any suitable number of phase shifters greater than one may be used). Optical phase shifters can be actuated by any mechanism including, but not limited to, voltage, current, heat, a different wavelength of light, or mechanical means. One example of an optical phase shifter is described below in connection FIG. 3D. Each phase shifter modulates the phase of the optical signal present on the lower waveguide by an amount that depends on the applied voltage. Let $f(V_i)$ be the amount by which a phase shifter modulates the phase of the optical signal.

Coherent detector 33 is designed to detect the difference in the phases of the upper waveguide and the lower waveguide. For example, coherent detector 33 may produce a current that is proportional to the difference between such phases. The phase difference that appears at the input of coherent detector 33 may be equal to:

$$\Delta \varphi = f(V_1) + f(V_2) + f(V_3) + f(V_4) - \phi_{LO} + \phi_0$$

where $V_i$ is the voltage controlling the $i^{th}$ phase shifter, f is a function that maps the electrical drive signal to an optical phase shift (this could be linear or nonlinear) with units of radians, $\phi_{LO}$ is the phase accumulated along the upper waveguide and $\phi_0$ is a random phase offset which may result, for example, due to fabrication variations or interaction with the environment around the adder. $\phi_0$ can be calibrated away by measuring the phase at the coherent detection without any electrical drive on the phase shifters. The calibration procedure can either be done at only the initial step (right before operations) or periodically. Periodic calibration has the advantage of calibrating away unwanted random phases that are imparted quasi-dynamically due to heat or stress during prolonged operations. In some embodiments, the phase shifter may be operated in a region such that f(V) is proportional to the numeric value (z) encoded in the voltage. For example, in some embodiments, $f(V_1)$ is equal to the product of numeric value $z_1$ multiplied by a constant $\beta$, $f(V_2)$ is equal to the product of numeric value $z_2$ multiplied by the constant $\beta$, $f(V_3)$ is equal to the product of numeric value $z_3$ multiplied by the constant $\beta$ and $f(V_4)$ is equal to the product of numeric value $z_4$ multiplied by the constant $\beta$. In these embodiments, the phase difference $\Delta\varphi$ can be expressed as follows:

$$\Delta\varphi = \beta(z_1 + z_2 + z_3 + z_4) - \varphi_{LO} + \varphi_0$$

thereby representing the sum of numeric values $z_1$, $z_2$, $z_3$ and $z_4$. In this respect, the interferometer can be viewed as an optical adder in that an optical quantity ($\Delta\varphi$) is produced that is representative (e.g., proportional) to the sum of the input numeric values ($z_i$). The current produced by coherent detector 33 may be a function of (e.g., proportional to) $\Delta\varphi$.

The photonic adder of FIG. 3A operates in a single-ended fashion. In some embodiments, photonic adders may be operated in a differential fashion, as described for example in connection with FIG. 3B. In this example, both the upper waveguide and the lower waveguide include phase shifters 32. The phase shifters of the upper waveguide are controlled by voltages $V_1^-$, $V_2^-$, $V_3^-$ and $V_4^-$ and the phase shifters of the lower waveguide are controlled by voltages $V_1^+$, $V_2^+$, $V_3^+$ and $V_4^+$ (where $V_i^+$ and $V_i^-$ represent a numeric value $z_i$ differentially). As a result, the phase difference that appears at the input of coherent detector 33 may be equal to $$\Delta\varphi = (f(V_1^+) + f(V_2^+) + f(V_3^+) + f(V_4^+)) - (f(V_1^-) + f(V_2^-) + f(V_3^-) + f(V_4^-)) + \varphi_0$$

As in the example of FIG. 3A, in some embodiments, the phase shifter may be operated in a region such that f(V) is proportional to the numeric value (z) encoded in the voltage. In this way, $\Delta\varphi$ represents the sum of numeric values z1, z2, z3 and z4.

The photonic adder of FIG. 3C is similar to the photonic adder of FIG. 3B. In the photonic adder of FIG. 3C, however, the input voltages are not necessarily defined differentially. Instead, in this implementation, each voltage represents a different numeric value. Accordingly, this architecture may be used to combine numeric values additively (for example using the phase shifters of the lower waveguide) and to combine numeric values subtractively (for example using the phase shifters of the upper waveguide).

FIG. 3D illustrates an example of a phase shifter 32, in accordance with some embodiments. This phase shifter includes a pn-junction embedded in waveguide 70 (which represents the upper waveguide or the lower waveguide of the interferometer). Accordingly, one side of the waveguide is doped with a p-dopant and one side of the waveguide is doped with an n-dopant. A contact 72 is connected to the n region and a contact 71 is connected to the p region (for example by forming ohmic contacts). In this example, contact 72 is grounded and contact 71 serves as the control terminal, though the opposite arrangement is also possible. Application of a voltage V results in the modulation of the size of the depletion region, which in turn modulates the phase of the input light. Thus, the phase of the light depends upon the applied voltage. The relationship between the voltage and the phase change may be linear or may have any suitable behavior.

Figure 3E:
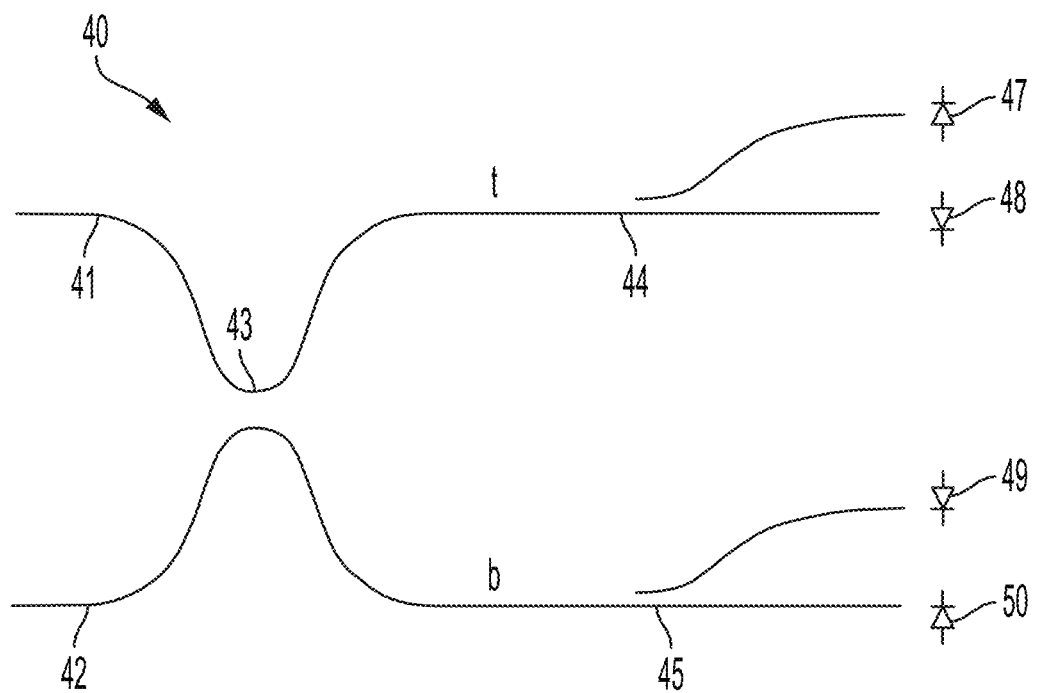
FIG. 3E-3F are a schematic diagram and a circuit diagram, respectively, illustrating a coherent detector, in accordance with some embodiments.
Figure 3F:
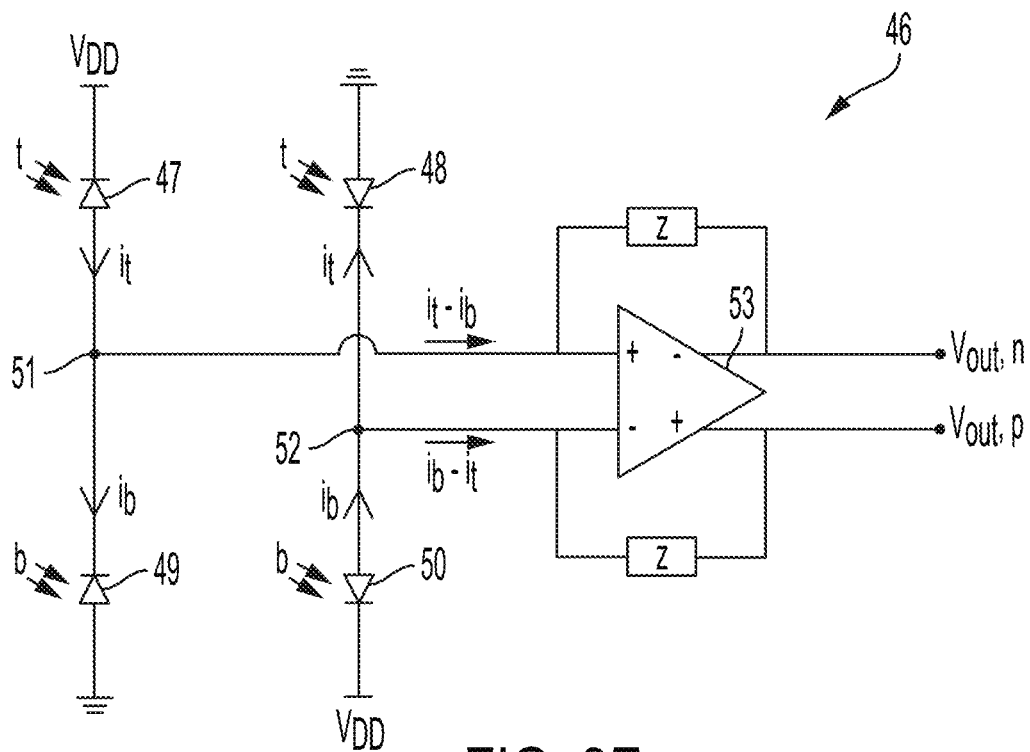

FIGS. 3E-3F illustrate an example of a coherent detector 33, in accordance with some embodiments. This coherent detector includes a waveguide 41 (which connects to the interferometer's upper waveguide) a waveguide 42 (which connects to the interferometers lower waveguide), optical couplers 43, 44 and 45, photodetectors 47, 48, 49 and 50 and operational amplifier 53. Signals t and b represent the optical signals at the outputs of coupler 43, respectively. T represents the power of signal t and B represents the power of signal b. Powers T and B are given by the following expressions, respectively:

$$T = \tfrac{1}{2}(A_u^2 + A_l^2 + 2A_u A_l \sin \Delta\varphi)$$

$$B = \tfrac{1}{2}(A_u^2 + A_l^2 - 2A_u A_l \sin \Delta\varphi)$$

where $A_u$ is the amplitude of the optical signal present at waveguide 41, $A_l$ is the amplitude of the optical signal present at waveguide 42 and $\Delta\varphi$ is the difference between the phase of the optical signal present at waveguide 41 and the phase of the optical signal present at waveguide 42. Coupler 44 couples optical signal t to photodetectors 47 and 48 and coupler 45 couples optical signal b to photodetectors 49 and 50 (though in some embodiments, each optical signal may be detected by a single photodetector, instead of two).

Referring now to FIG. 3F, $i_b$ represents the photocurrent generated by photodetectors 49 and 50 and $i_t$ represents the photocurrent generated by photodetectors 47 and 48. Because photodetectors 47 and 49 are coupled in an anode-cathode arrangement at node 51 (i.e., the anode of one photodetector is coupled to the cathode of the other photodetector), the respective photocurrents are combined subtractively. Similarly, because photodetectors 48 and 50 are coupled in an anode-cathode arrangement at node 52, the respective photocurrents are also combined subtractively. The photocurrent $i_t - i_b$, which couples to the first input terminal of the operational amplifier 53 is proportional to $\sin(\Delta\varphi)$. For small values of $\Delta\varphi$, $i_t - i_b$ is proportional to $\Delta\varphi$. Similarly, $i_b - i_t$, which couples to the second input terminal of the operational amplifier 53 is proportional to $-\sin(\Delta\varphi)$. For small values of $\Delta\varphi$, $i_b - i_t$ is proportional to $-\Delta\varphi$.

Figure 4A:
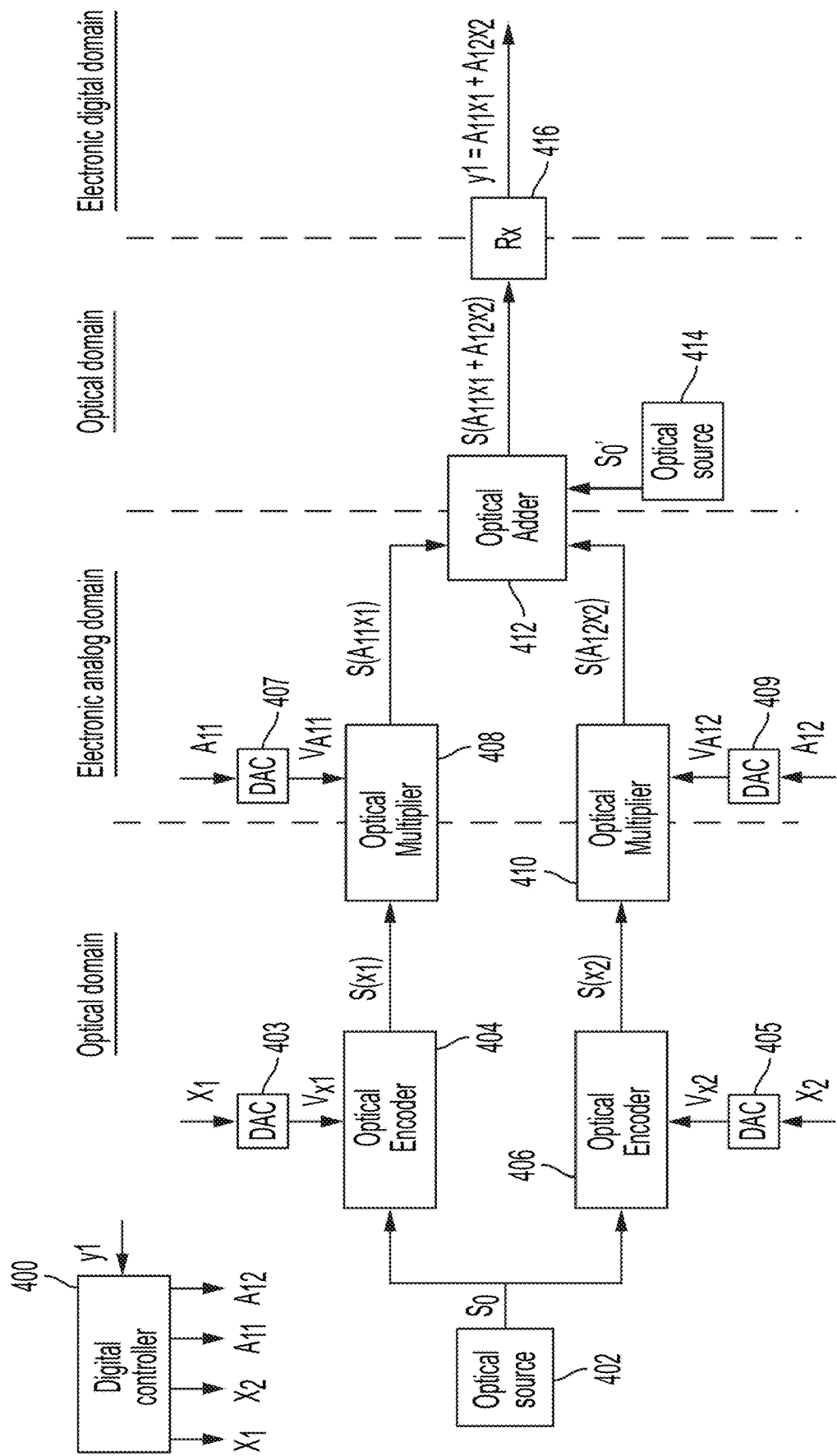
FIGS. 4A-4E are block diagrams illustrating examples of photonic processors based on photonic adders, in accordance with some embodiments.

IV. Photonic Processors Based on Optical Adders and Optical or Electronic Multipliers Leveraging the photonic adders described herein, the inventors have developed photonic processors that can support clock frequencies in the tens of gigahertz (e.g., 20 GHz). FIG. 4A illustrates the architecture of a representative photonic adder-based processor, in accordance with some embodiments. The photonic processor includes a digital controller 400, digital-to-analog converters (DACs) 403, 405, 407 and 409, optical source 402, optical encoders 404 and 406, optical multipliers 408 and 410, optical adder 412, optical source 414 and receiver (RX) 416. The photonic processor is configured to perform matrix multiplications (e.g., matrix-vector multiplications as illustrated in FIGS. 1A-1B). For simplicity, the architecture of FIG. 4A illustrates only the portion of a processor corresponding to the first row of a input matrix. In this case, the input matrix includes two columns. It should be appreciated, however, that the architecture of FIG. 4A may be scaled to matrices of any suitable dimensions.

The signal path of FIG. 4A is divided according to different domains. The first domain is an optical domain in that signals $S_0$, $S(x_1)$ and $S(x_2)$ are optical signals. The second domain is an electronic analog domain in that signals $S(A_{11}x_1)$ and $S(A_{12}x_2)$ are electronic analog signals. The third domain is an optical domain in that signal $S(A_{11}x_1 + A_{12}x_2)$ is an optical signal. The fourth domain is an electronic digital domain in that signal $y_1$ is a digital signal representing a numeric value. Each signal may be represented in a single-ended fashion or a differential fashion.

Optical source 402 produces light $S_0$. Optical source 402 may be implemented in any suitable way. For example, optical source 402 may include a laser, such as an edge-emitting laser or a vertical cavity surface emitting laser (VCSEL), examples of which are described in detail further below. In some embodiments, optical source 402 may be configured to produce multiple wavelengths of light, which enables optical processing leveraging wavelength division multiplexing (WDM), as described in detail further below. For example, optical source 402 may include multiple laser cavities, where each cavity is specifically sized to produce a different wavelength.

The optical encoders encode the input vector into a plurality of optical signals. For example, optical encoder 404 encodes input value $x_1$ into optical signal $S(x_1)$ and optical encoder 406 encodes input value $x_2$ into optical signal $S(x_2)$. Input values $x_1$ and $x_2$, which are produced by digital controller 400, are digital signed real numbers (e.g., with a floating point or fixed point digital representation).

The encoding may be performed in two steps. First, a DAC converts the input value to an input voltage (or input current in some embodiments). For example, DAC 403 converts input value $x_1$ to input voltage $V_{x1}$ and DAC 403 converts input value $x_2$ to input voltage $V_{x2}$. Second, the optical encoders modulate light $S_0$ based on the respective input voltage. For example, optical encoder 404 modulates the light to produce optical signal $S(x_1)$ and optical encoder 406 modulates the light to produce optical signal $S(x_2)$. Thus, signals $S(x_1)$ and $S(x_2)$ are indicative, respectively, of input values $x_1$ and $x_2$. The optical encoders may be implemented using any suitable optical modulator, including for example optical intensity modulators. Examples of such modulators include Mach-Zehnder modulators (MZM), Franz-Keldysh modulators (FKM), resonant modulators (e.g., ring-based or disc-based), nano-electro-electro-mechanical-system (NOEMS) modulators, etc.

The optical multipliers are designed to produce signals indicative of a product between an input value and a matrix value. For example, optical multiplier 408 produces a signal $S(A_{11}x_1)$ that is indicative of the product between input value $x_1$ and matrix value $A_{11}$ and optical multiplier 410 produces a signal $S(A_{12}x_2)$ that is indicative of the product between input value $x_2$ and matrix value $A_{12}$. DACs 407 and 409 convert matrix values $A_{11}$ and $A_{12}$ (which are produced by digital controller 400) to voltages $V_{A11}$ and $V_{A12}$ (or alternatively, to currents). Examples of optical multipliers that may be used in some embodiments are modulatable detectors, which are described in detail further above. In these embodiments, the input voltages modulate a characteristic of the modulatable detector, such as the responsivity of the photodetector 11 and/or the gain of gain stage 12 (see FIG. 2B).

However, other types of optical multipliers may be used in some embodiments, including for example optical modulators followed by photodetectors. In these embodiments, the input voltage modulates a characteristic of the optical modulator, such as the phase shift of an interferometer-based modulator (e.g., an MZM), the absorption of an absorption-based modulator (e.g., a FKM), the resonant frequency of a resonant-based modulator, etc. The photodetector that follows the optical modulator in these embodiments converts the optically modulated signal to an electronic analog (e.g., signal $S(A_{11}x_1)$).

Optical adder 412 receives electronic analog signals $S(A_{11}x_1)$ and $S(A_{12}x_2)$ and light $S_0'$ (generated by optical source 414), and produces an optical signal $S(A_{11}x_1+A_{12}x_2)$ that is indicative of the sum of $A_{11}x_1$ with $A_{12}x_2$. Examples of optical adders are described above in connection with FIGS. 3A-3C. In these embodiments, electronic analog signal $S(A_{11}x_1)$ modulates the phase shift imparted by a first phase shifter 32 (or by a first pair of phase shifters at opposite waveguides if the differential arrangement is used) and electronic analog signal $S(A_{12}x_2)$ modulates the phase shift imparted by a second phase shifter 32 (or by a second pair of phase shifters at opposite waveguides if the differential arrangement is used). The first and second phase shifters (or the first and second pairs of phase shifters) are optically in series with one another. Thus, in these embodiments, the phase of the optical signal present at a waveguide of the interferometer is indicative of the sum $A_{11}x_1+A_{12}x_2$. Optical source 414 may be implemented in a manner similar to optical source 402, although the optical sources need not be of the same type.

RX 416 generates an electronic digital signal indicative of the sum $A_{11}x_1+A_{12}x_2$ based on the optical signal $S(A_{11}x_1+A_{12}x_2)$. In some embodiments, RX 416 includes a coherent detector 33 (see FIGS. 3A-3C and FIG. 3E-3F) followed by an analog-to-digital converter (ADC). The coherent detector produces an output that is indicative of the phase difference between the waveguides of an interferometer. Because the phase difference is a function of the sum $A_{11}x_1+A_{12}x_2$, the output of the coherent detector is also indicative of that sum. The ADC converts the output of the coherent receiver to output value $y_1=A_{11}x_1+A_{12}x_2$. Output value $y_1$ may be provided as input back to digital controller 400, which may use the output value for further processing.

Thus, some embodiments are directed to a photonic processor configured to perform matrix multiplication (e.g., matrix-vector multiplication). The photonic processor may comprise a first encoder configured to produce a first input signal (e.g., $S(x_1)$ of FIG. 4A) indicative of a first input value (e.g., $x_1$ of FIG. 4A) and a second encoder configured to produce a second input signal (e.g., $S(x_2)$ of FIG. 4A) indicative of a second input value (e.g., $x_2$ of FIG. 4A). The photonic processor may further comprise a first multiplier configured to produce, based on the first input signal (e.g., $S(x_1)$ of FIG. 4A), a first output signal (e.g., $S(A_{11}x_1)$ of FIG. 4A) indicative of a first product (e.g., $A_{11}x_1$ of FIG. 4A) of the first input value (e.g., $x_1$ of FIG. 4A) with a first matrix value (e.g., $A_{11}$ of FIG. 4A). The photonic processor may further comprise a second multiplier configured to produce, based on the second input signal (e.g., $S(x_2)$ of FIG. 4A), a second output signal (e.g., $S(A_{12}x_2)$ of FIG. 4A) indicative of a second product (e.g., $A_{12}x_2$ of FIG. 4A) of the second input value (e.g., $x_2$ of FIG. 4A) with a second matrix value (e.g., $A_{12}$ of FIG. 4A). The photonic processor may further comprise an optical adder configured to receive light (e.g., $S_0'$ of FIG. 4A) and to produce, based on the first (e.g., $S(A_{11}x_1)$ of FIG. 4A) and second output signals (e.g., $S(A_{12}x_2)$ of FIG. 4A) and further based on the light, a cumulative signal (e.g., $S(A_{11}x_1+A_{12}x_2)$ of FIG. 4A) indicative of a sum (e.g., $A_{11}x_1+A_{12}x_2$ of FIG. 4A) of the first product with the second product. The photonic processor may comprise a receiver configured to produce, based on the cumulative signal, an output value (e.g., $y_1$ of FIG. 4A) indicative of the sum.

In some embodiments, either optical source 402 or optical source 414 (or both) may be implemented using VCSELs, examples of which are described in detail further below. In some such embodiments, a VCSEL may be further configured to implement an optical encoder (e.g., optical encoder 404). The inventors have appreciated that VCSELs are particularly suitable for direct modulation, making VCSELs suitable to implement an optical source and an optical encoder using a single device. In some such embodiments, each optical encoder includes a separate VCSEL.

Figure 4B:
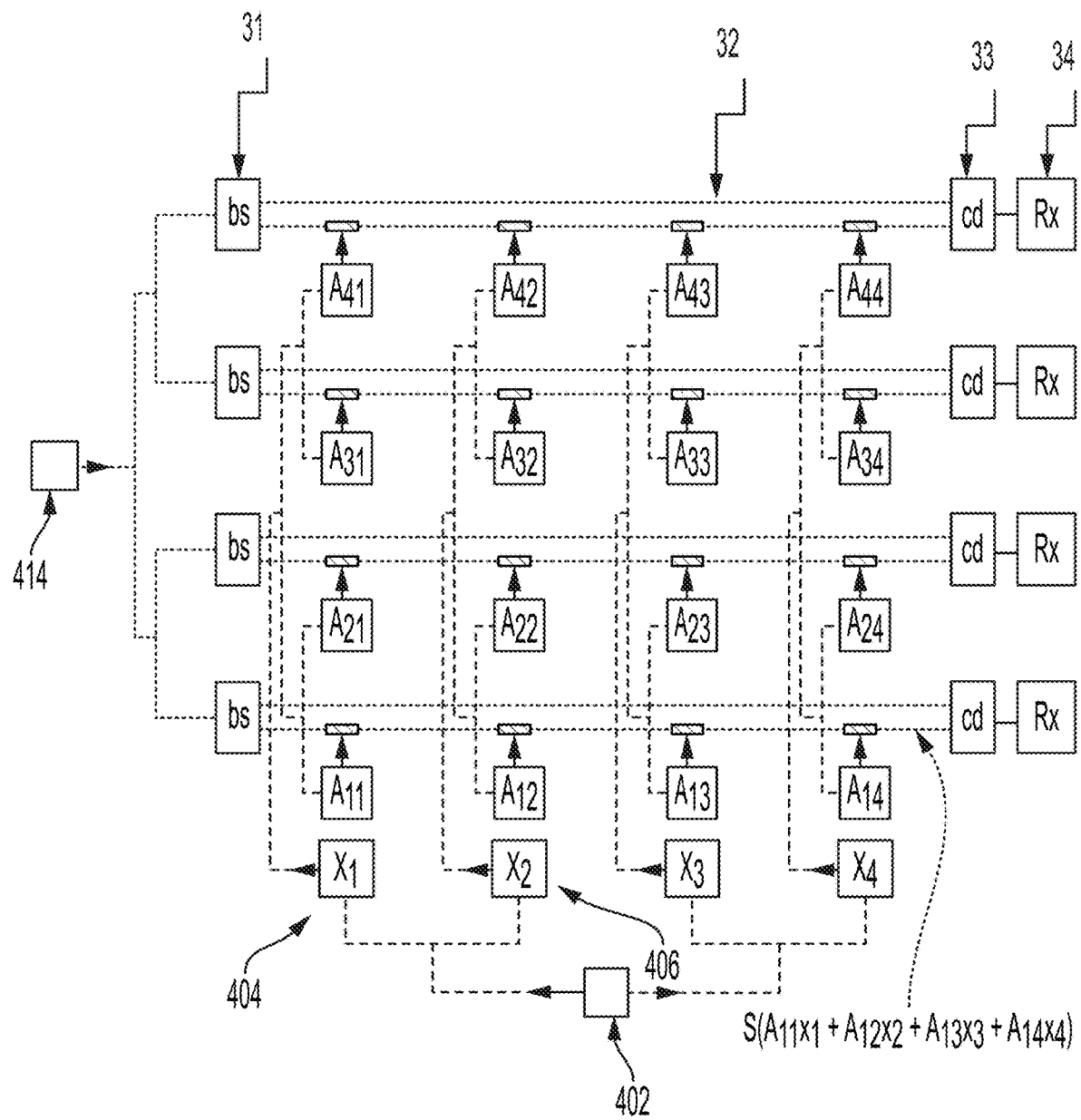
Figure 4C:
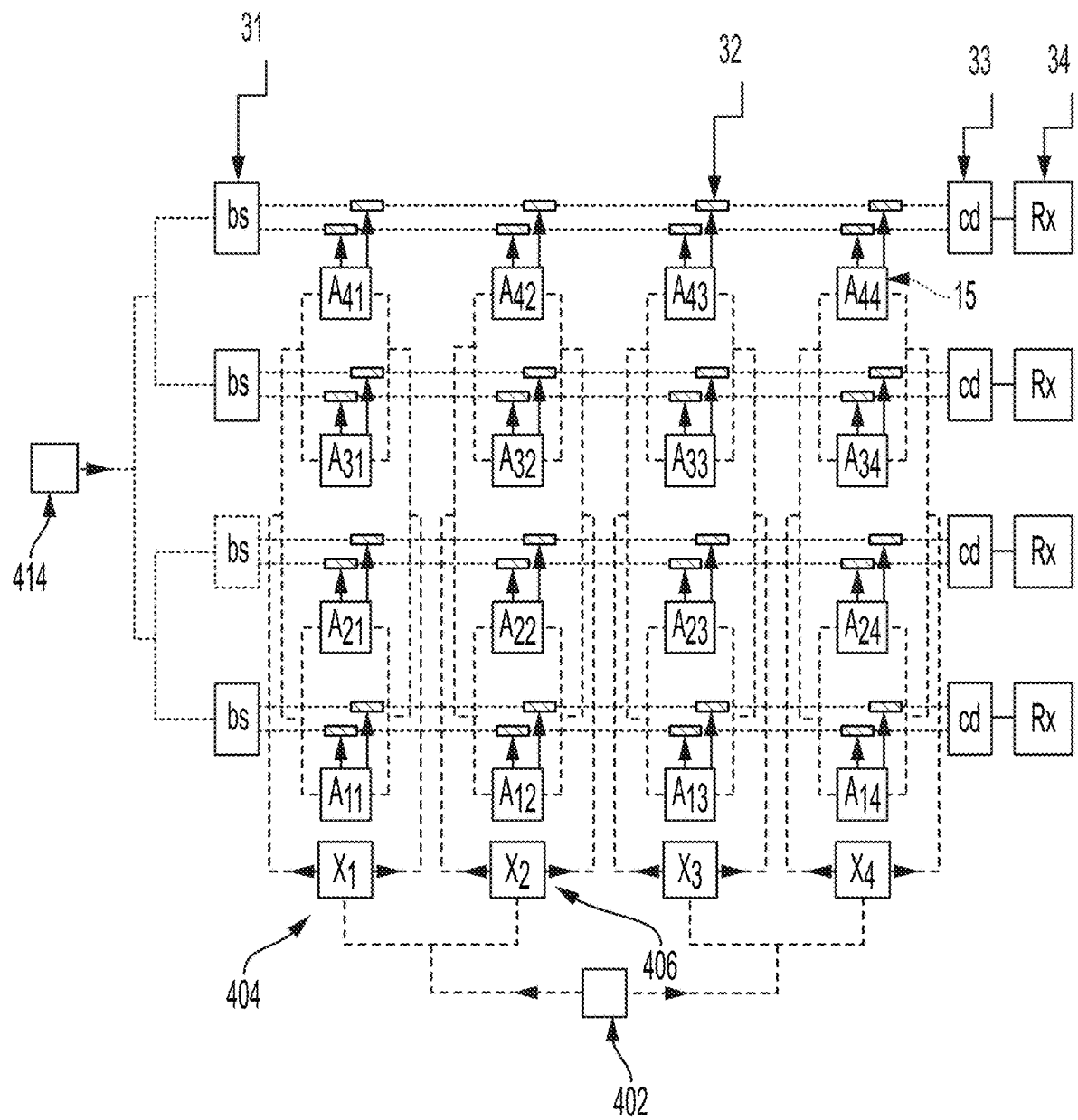
Figure 4D:
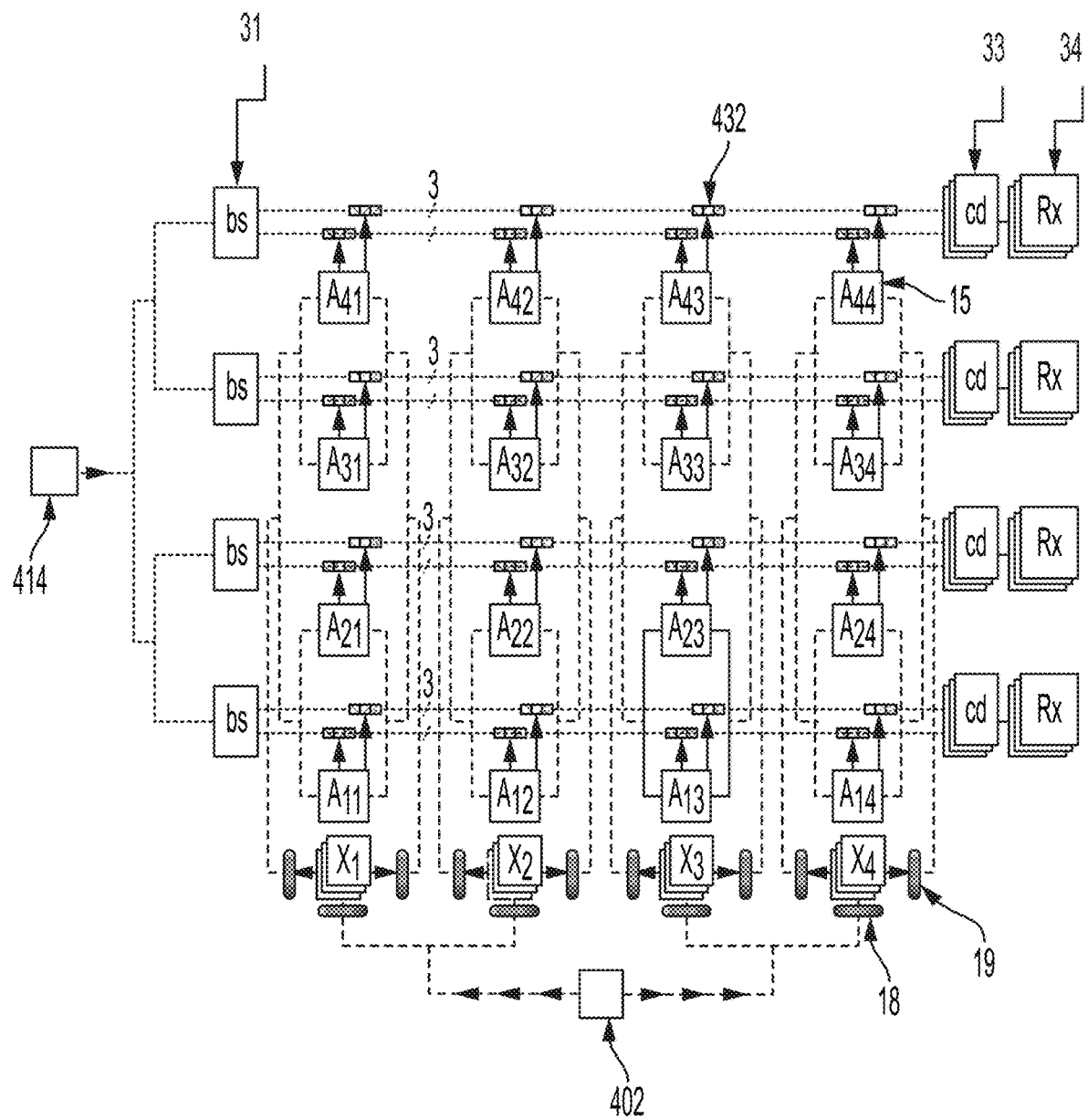

FIGS. 4B-4D illustrate representative implementations of the architecture of FIG. 4A, in accordance with some embodiments. For purposes of illustration, these implementations are depicted as performing matrix multiplications over 4×4 matrices, though the present technology is not limited to any particular matrix dimension. In FIGS. 4B-4D, broken lines represent optical channels, such as optical waveguides, and solid lines represent electrical channels, such as conductive traces.

The implementation of FIG. 4B includes instantiations of the optical adder of FIG. 3A. Each row of the matrix (there are four rows in this example) is associated with a respective optical adder. Each optical adder includes a beam splitter 31, a plurality of phase shifters 32 (four phase shifters in this example, which is equal to the number of columns of matrix A), and a coherent detector 33.

Optical source 402 provides light to optical encoders 14 through an optical power tree. Each optical encoder encodes an input value into the incoming light. In this example, optical encoder 404 encodes input value $x_1$, optical encoder 406 encodes input value $x_2$, another optical encoder (unlabeled) encodes input value $x_3$ and yet another optical encoder (also unlabeled) encodes input value $x_4$. The output of optical encoder 404 ($S(x_1)$) is provided as input to four optical multipliers, labeled respectively "$A_{11}$," "$A_{21}$," "$A_{31}$" and "$A_{41}$." The optical multipliers may be implemented using modulatable detectors or other suitable devices, as described above in connection with FIG. 4A. Each of these four optical multipliers produces an electronic analog signal that is indicative of the product of input value $x_1$ and the respective matrix value. For example, the optical multiplier labeled "$A_{11}$" produces signal $S(A_{11}x_1)$. Similarly, the output of optical encoder 406 is provided as input to four optical multipliers, labeled respectively "$A_{12}$," "$A_{22}$," "$A_{32}$" and "$A_{42}$;" the output of the "$x_3$" optical encoder is provided as input to four optical multipliers, labeled respectively "$A_{13}$," "$A_{23}$," "$A_{33}$" and "$A_{43}$;" and the output of the "$x_4$" optical encoder is provided as input to four optical multipliers, labeled respectively "$A_{14}$," "$A_{24}$," "$A_{34}$" and "$A_{44}$."

The output of each optical multiplier controls the extent to which a corresponding phase shifter 32 shifts the phase of the light present at the waveguide of an optical adder. As discussed above, the phase of the light accumulated upon passing all the phase shifters of a waveguide is a function of the sum of the products corresponding to a row of the matrix. For example, an optical signal $S(A_{11}x_1+A_{12}x_2+A_{13}x_3+A_{14}x_4)$ is present at the end of the lower waveguide of the first optical adder. The phase of this optical signal is indicative of the sum $A_{11}x_1+A_{12}x_2+A_{13}x_3+A_{14}x_4$. The other optical adders operate in a similar manner. Coherent detector 33 produces an output signal that is indicative of the sum. The output signal is digitized using receiver 34, which may include an ADC, amplifiers, filters, etc. Collectively, the output of the ADCs form an output vector Y ($y_1$, $y_2$, $y_3$ and $y_4$).

The implementation of FIG. 4C is similar to the implementation of FIG. 4B, but it uses instantiations of the optical adder of FIG. 3B, instead of FIG. 3A. Thus, the implementation of FIG. 4C operates differentially. Each optical encoder produces a pair of optical signals, where the difference between the powers of the optical signals of a pair is encoded with an input value (as described for example in connection with optical encoder 14 of FIG. 2C). Each optical multiplier also produces a differential pair of signals. The optical multipliers may be implemented, for example, using a pair of modulatable detectors (as described in connection with optical multiplier 15 of FIG. 2C). The outputs of an optical multiplier drive a pair of phase shifters differentially.

The inventors have appreciated that a processor's ability to perform matrix multiplications may be augmented by employing wavelength division multiplexing (WDM). In WDM, multiple wavelengths of light are produced, and each wavelength supports a distinct channel. The inventors have developed WDM photonic processors in which each wavelength supports a matrix multiplication. Utilizing these schemes, the number of operations that a processor can handle per unit time is multiplied up to a factor M, where M is the number of WDM wavelengths.

FIG. 4D illustrates an implementation of the architecture of FIG. 4A that uses three wavelengths, in accordance with some embodiments (of course, any other number of wavelengths may be used). In this implementation, optical source 402 produces multiple wavelengths of light (e.g., more than five wavelengths, more than fifteen wavelengths or more than thirty wavelengths). The wavelengths propagate on common waveguides until they reach demultiplexers 18. Each demultiplexer 18 routes the incoming wavelengths to different output waveguides. Multiplexer 19 combines the wavelengths back to common waveguides. Positioned between the demultiplexers and the multiplexers are sets of optical encoders. Each optical encoder of a set encodes an input value (e.g., $x_1$) into a plurality of wavelengths of light.

Figure 4E:
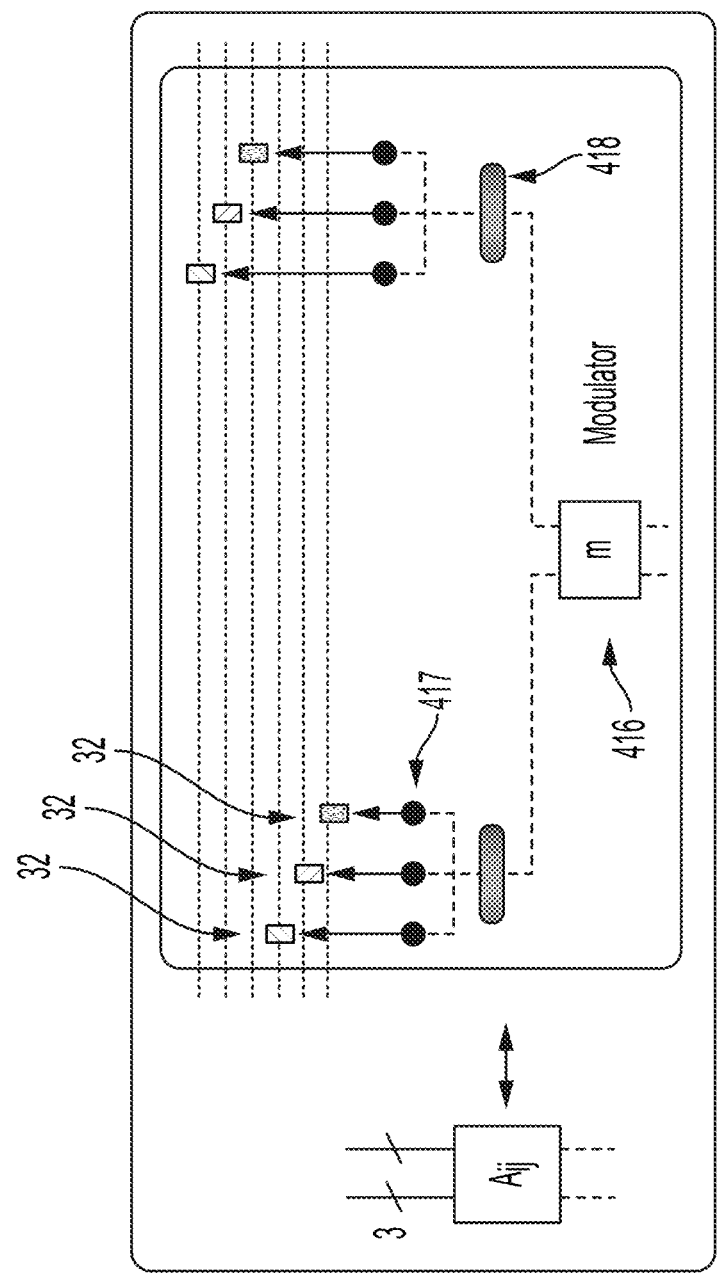

The encoded optical signals are provided as inputs to sets of optical multipliers of the types described above. FIG. 4E illustrates a representative set of optical multipliers in additional detail. Each set includes an optical multiplier 416, a pair of multiplexers 418, photodetectors 417 (two photodetectors per wavelength in this example, given the differential nature of this implementation) and phase shifters 32 (again, two phase shifters per wavelength). The phase shifters operate in the same manner as described above. Instead of having two waveguides, the interferometer includes six waveguides because there are three wavelengths (or more generally, 2M waveguides, where M is the number of wavelengths). For each wavelength, the waveguides are provided in pairs as inputs to respective sets of coherent detectors.

In some embodiment, the same vector X may be multiplied with different matrix values A. In such embodiments, an optical source may produce multiple wavelengths of light, similar to optical source 402 of FIG. 4D. The wavelengths may propagate on common waveguides and may be modulated by the same input value encoders, such that all (or some) wavelengths of light encode the same input value. Demultiplexers (similar to demultiplexers 18 of FIG. 4D) may be placed prior to where the light reaches the optical modulators that encode the matrix $A_{ij}$. The plurality of wavelengths of light may be spatially separated by the demultiplexers, and each wavelength may be provided as an input to one optical multiplier. If M WDM wavelengths are considered, for example, then there may be a total of M optical modulators for each $A_{ij}$, each encoding a different matrix $A_{ij}^{(1)} \ldots A_{ij}^{(M)}$. The result of the multiplication of each individual wavelength may be independently presented as input to an optical adder. In essence, such embodiments can enable up to M different matrix-vector multiplications between M different matrices and a single input vector.

Figure 5A:
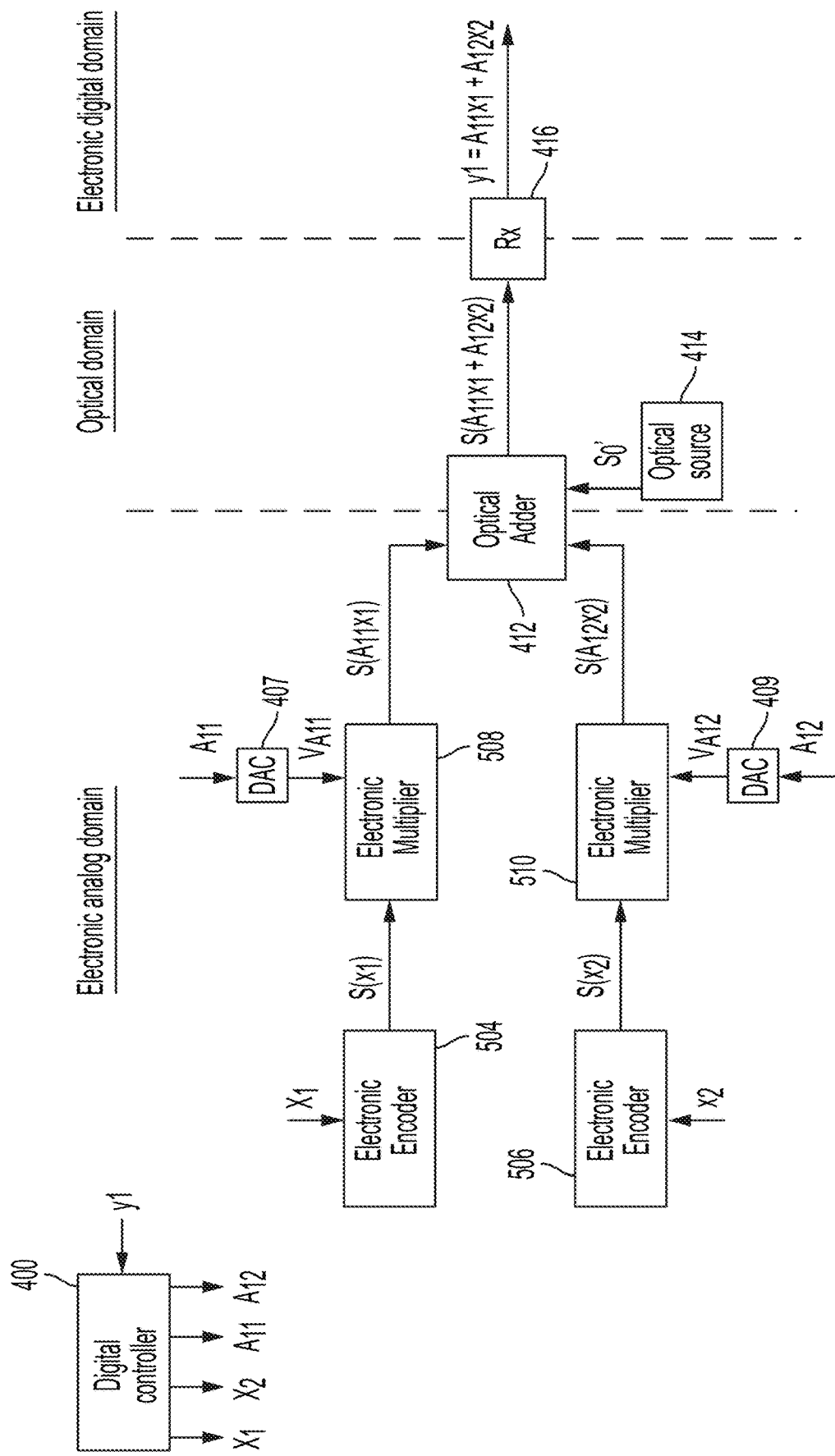
FIGS. 5A-5D are block diagrams illustrating additional examples of photonic processors based on photonic adders, in accordance with some embodiments.

FIG. 5A illustrates another architecture in accordance with some embodiments. As in the architecture of FIG. 4A, this architecture includes an optical adder 412. Unlike the architecture of FIG. 4A, however, the encoders and the multipliers are electronic, not optical. The signal path of FIG. 5A is divided according to different domains. The first domain is an electronic analog domain in that signals $S(x_1)$, $S(x_2)$, $S(A_{11}x_1)$ and $S(A_{12}x_2)$ are electronic analog signals. The second domain is an optical domain in that signal $S(A_{11}x_1+A_{12}x_2)$ is an optical signal. The third domain is an electronic digital domain in that signal $y_1$ is a digital signal representing a numeric value. Each signal may be represented in a single-ended fashion or a differential fashion.

The inventors have appreciated that, notwithstanding the fact that the multiplications are performed in the electronic domain, performing only the additions in the optical domain improves the performance of this architecture over that of conventional processors. First, as discussed above, optical adders are less susceptible to parasitic capacitance than electronic adders, which results in a speed increase. Second, the optical domain effectively produces an isolation barrier between the signals of the electronic analog domain and the signals of the electronic digital domain. In essence, converting signals from the electronic domain to the optical domain and then back to the electronic domain results in the suppression of unwanted signals propagating in a direction opposite to the desired direction. The inventors have appreciated that defining the entire signal path from the encoders to the receiver (RX) in the electronic domain would produce reflections, which would give rise to signals traveling from the receiver back to the encoders. These signals lead to errors. Interposing an optical layer along the signal path from the encoders to the receiver as illustrated in FIG. 5A forms an isolation layer that inhibits such reflections.

Electronic encoders 504 and 506 encode input values $x_1$ and $x_2$, respectively, into electronic analog signals $S(x_1)$ and $S(x_2)$. In some embodiments, the electronic encoders may be implemented simply as DACs, though more elaborate encoding schemes may be used in some embodiments. Electronic multiplier 508 produces a signal $S(A_{11}x_1)$ indicative of the product of input value $x_1$ and matrix value $A_{11}$. Similarly, electronic multiplier 510 produces a signal $S(A_{12}x_2)$ indicative of the product of input value $x_2$ and matrix value $A_{12}$. The electronic multipliers may be implemented in any of numerous ways, including for example using Gilbert cells or other types of mixers. Optical adder 412 and RX 416 operate in the manner described in connection with FIG. 4A.

Thus, some embodiments are directed to a photonic processor configured to perform matrix multiplication. The photonic processor may comprise a first encoder configured to produce a first input signal (e.g., $S(x_1)$ of FIG. 4B) indicative of a first input value (e.g., $x_1$ of FIG. 4B) and a second encoder configured to produce a second input signal (e.g., $S(x_2)$ of FIG. 4B) indicative of a second input value (e.g., $x_2$ of FIG. 4B). The photonic processor may further comprise a first multiplier configured to produce, based on the first input signal (e.g., $S(x_1)$ of FIG. 4B), a first output signal (e.g., $S(A_{11}x_1)$ of FIG. 4B) indicative of a first product (e.g., $A_{11}x_1$ of FIG. 4B) of the first input value (e.g., $x_1$ of FIG. 4B) with a first matrix value (e.g., $A_{11}$ of FIG. 4B). The photonic processor may further comprise a second multiplier configured to produce, based on the second input signal (e.g., $S(x_2)$ of FIG. 4B), a second output signal (e.g., $S(A_{12}x_2)$ of FIG. 4B) indicative of a second product (e.g., $A_{12}x_2$ of FIG. 4B) of the second input value (e.g., $x_2$ of FIG. 4B) with a second matrix value (e.g., $A_{12}$ of FIG. 4B). The photonic processor may further comprise an optical adder configured to receive light (e.g., $S_0'$ of FIG. 4B) and to produce, based on the first (e.g., $S(A_{11}x_1)$ of FIG. 4B) and second output signals (e.g., $S(A_{12}x_2)$ of FIG. 4B) and further based on the light, a cumulative signal (e.g., $S(A_{11}x_1+A_{12}x_2)$ of FIG. 4B) indicative of a sum (e.g., $A_{11}x_1+A_{12}x_2$ of FIG. 4B) of the first product with the second product. The photonic processor may comprise a receiver configured to produce, based on the cumulative signal, an output value (e.g., $y_1$ of FIG. 4B) indicative of the sum.

Figure 5B:
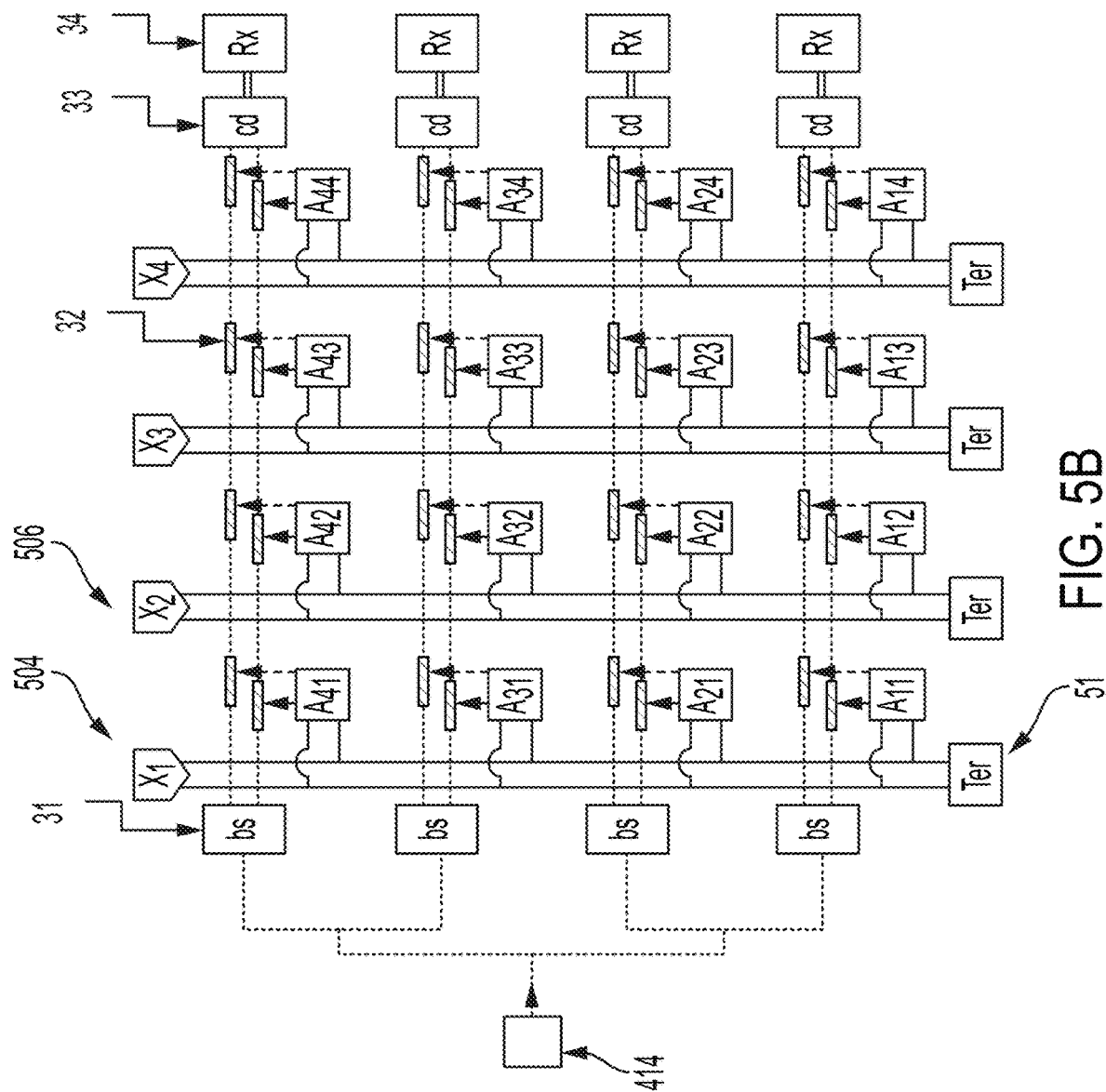
Figure 5C:
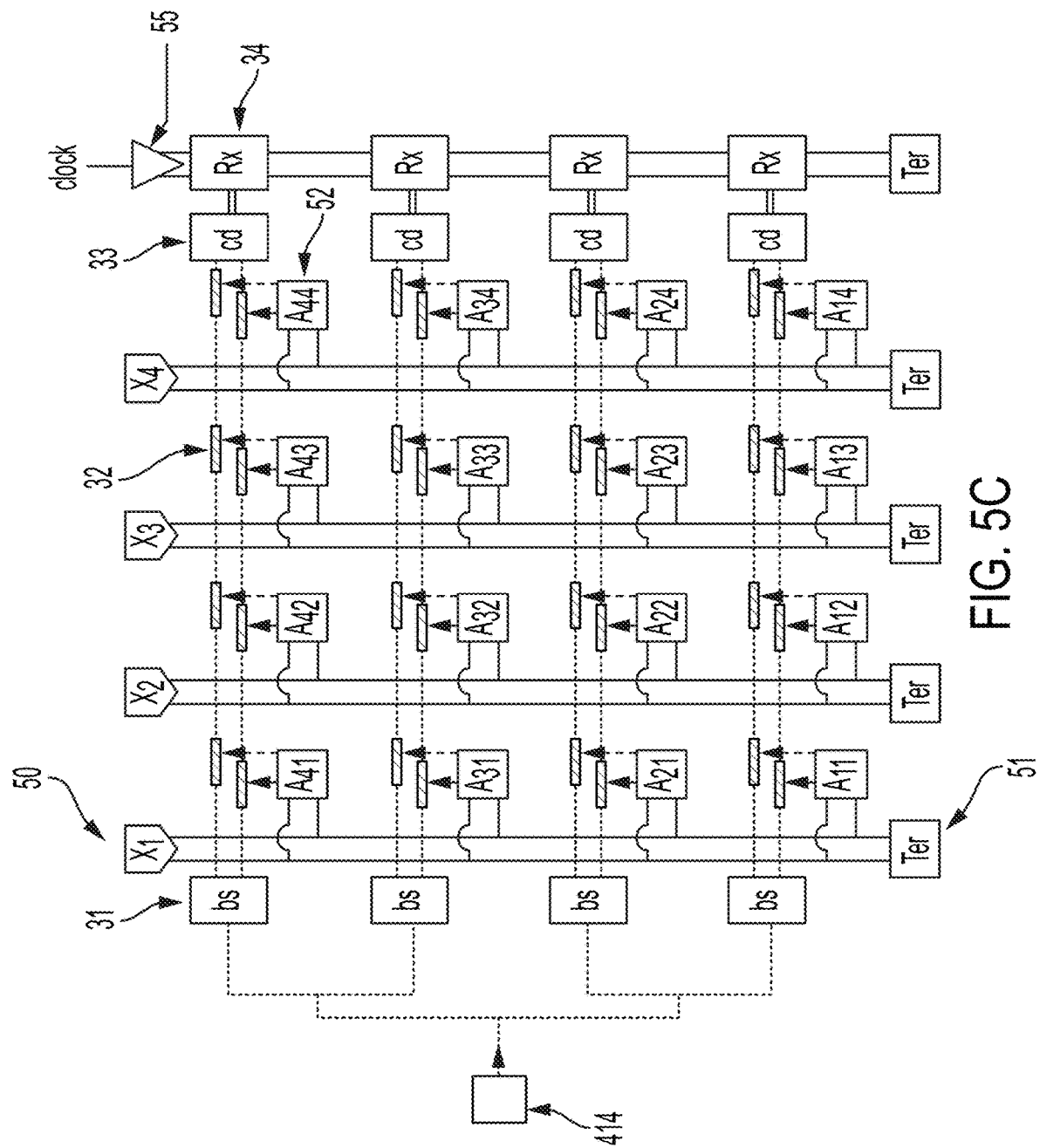
Figure 5D:
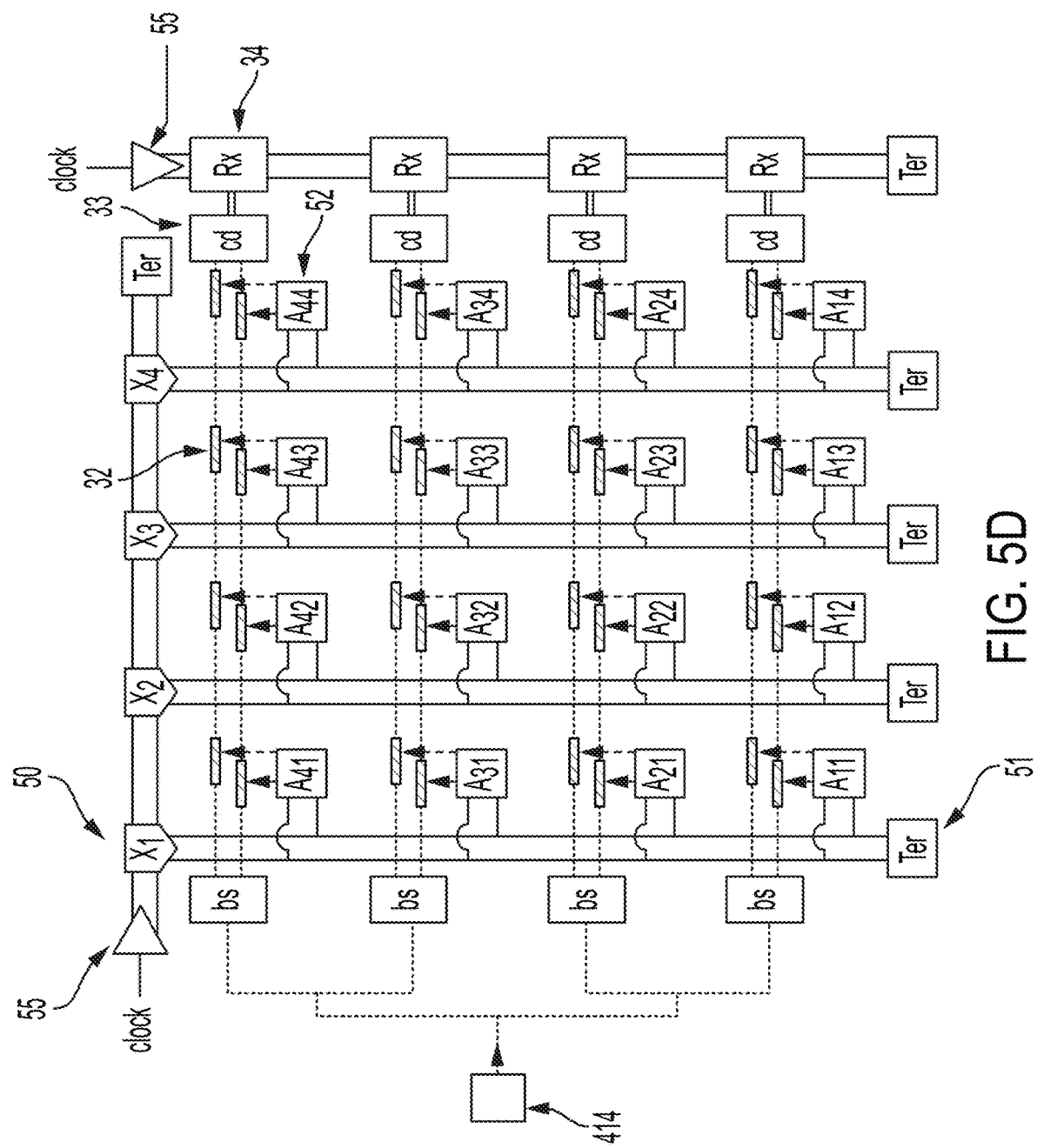

FIG. 5B-5D illustrate representative implementations of the architecture of FIG. 5A, in accordance with some embodiments. Although these implementations are differential, single-ended implementations are also possible. These implementations perform matrix multiplications over 4×4 matrices, though the present technology is not limited to any particular dimension. In FIGS. 5B-5D, broken lines represent optical channels, such as optical waveguides, and solid lines represent electrical channels, such as conductive traces.

Each electronic encoder is coupled to a respective pair of electric lines. Electronic encoder 504 encodes input value $x_1$ into a voltage measured between two electric lines of a pair. Similarly, electronic encoder 506 encodes input value $x_2$ into a voltage measured between two electric lines of a pair. The other two electronic encoders (unlabeled) encode input value $x_3$ and $x_4$, respectively, into pairs of voltages each measured between two electric lines. Each electric line pair is terminated using a termination (Ter) 51 to avoid reflections. Each electric line pair feeds a set of four electronic multipliers. For example, the first electric line pair feeds the electronic multipliers labeled "$A_{11}$," "$A_{21}$," "$A_{31}$" and "$A_{41}$." Each electronic multiplier drives a pair of optical phase shifters differentially. Here, there are four optical adders that are implemented according to the scheme depicted in FIG. 3B. The photonic adders receive light from optical source 414 and operate in the manner described in connection with FIG. 4C.

FIG. 5D illustrates a scheme for properly aligning electric signals and clock timing. This scheme leverages the principle of velocity matching, similar to that used in distributed amplifiers or distributed photodetectors. In this example, the clock that times the operations of the ADCs propagates down a differential electric line with the same propagation speed as the transmission lines that carry the encoder-generated signals down a column. A buffer 55 is used to delay the clock by the amount necessary to match the signals. While the column signals and ADC clock arrive at each successive row at a different time, the time difference for each is constant, thus ensuring that the columns stay synchronized. The same principle can be applied to the clock that times the operations of the electronic encoders (as shown in FIG. 5D), such that the clock propagation time from each electronic encoder to the next is the same as the phase-modulated optical signal propagating along a row.

The inventors have appreciated that velocity matching technique described above is particularly powerful for increasing the frequency of operation. For example, when the electronic encoders are clocked, their analog outputs change and those changes propagate to each phase shifter. Without velocity matching, each phase shifters must settle to its new state and light needs enough time to traverse all phase shifters, accumulating each phase shift along the way, before the encoders can be clocked to capture the result and the encoders can be clocked again to generate the next analog value. The required period of the encoder/ADC clock is therefore related to the time for light to propagate the entire length of the row. With velocity matching, all signals and clocks arrive at the right time at every element across the array. The settling time in that case is related to the propagation time from one element to the next along a row instead of the full length of the row. For a large array, that can be orders of magnitude less time. The same principle applies along the columns.

V. Vertical Cavity Surface Emitting Lasers

As discussed above, electrical circuits are susceptible to parasitic capacitance that can result in signal cross talk and thermal noise. Larger parasitic capacitance can limit the bandwidths and increase the power consumption of the electronic circuits used in conventional digital central processing units (CPUs). Photonic processors represent a promising solution to overcome the bandwidth and high-power consumption of conventional CPUs. Despite an ever-increasing trajectory in the development of photonic processors, the inventors have recognized and appreciated a significant bottleneck that limits the bandwidth of photonic processors: density of optical encoding components and the bandwidth of the optical encoders. This is because the photonic and electrical components, used to encode input values in input light, can require large footprints on the photonic integrated circuit, limiting the compute density of the photonic processor. The inventors have developed integrated photonic systems that use vertical cavity surface emitting lasers (VCSELs) to decrease the footprint of encoding components and to generate input light for the photonic processor with a high bandwidth.

Some photonic processors may use optical signals to perform mathematical operations, such as matrix-matrix multiplication. Consider, for example, a photonic processor configured to multiply an input vector by a matrix, as described above. The input vector is encoded in input light and transmitted to the photonic processor where the input light is further modulated to perform a multiplication corresponding to a matrix. Modern computing tasks may require many mathematical operations to be computed in parallel. To provide a high parallel processing power, the photonic processor may have hundreds or thousands of optical inputs (e.g., waveguides) to receive optical signals encoded with input values. An encoder is used to provide the input values encoded in the input light to the multiplication unit.

The inventors have appreciated that providing a small footprint, high bandwidth encoder presents challenges. The size of photonic components is limited by the center wavelength of light that the component is configured to support. For a waveguide, this is the cross-sectional area of the waveguide and is limited to approximately half the wavelength of light in the waveguide material. Therefore, photonic processors that use shorter wavelengths (i.e., higher energy) can support smaller photonic components than their longer wavelength counterparts. However, for a high throughput process, as would be required to commercially fabricate the thousands of components of a photonic processor, silicon photonic processes provide the most economic fabrication. Silicon has a bandgap of approximately 1.1 eV (corresponding to a wavelength of approximately 1.1 µm). Therefore, silicon photonics are not suitable for use with wavelengths shorter than 1.1 µm, providing a bottleneck in the size photonic components.

The inventors have appreciated that providing a high bandwidth encoder presents a further challenge. Light sources generate heat when they are operated. If this heat is transferred to the photonic processor, the thermal gradient can affect the transmission of light, resulting in increased noise. To mitigate heat generation problems, the light source may be located remotely from the photonic processor and may transmit light to the processor using fiber optics. The light received from the fiber optics is distributed through a network of beam splitters to modulators, to encode the input values, before transmitting the encoded light to the multiplication unit. While this may reduce heat transfer to the photonic processor, the network of beam splitters and modulators may require valuable real estate on the photonic integrated circuit. Additionally, a common light source that generates light for all the processor inputs cannot be directly modulated to provide multiple input values in parallel, because the inputs have a shared source. To provide the individual input values to each input of the photonic processor external modulation is used to encode the light that is input into a photonic processor. Conventional external modulation may limit the bandwidth of the photonic processor due to the bandwidth of the modulator components. As an alternative to the use of a single common light source, individual light sources may be used to generate the light for the inputs to the photonic processor. However, the use of an individual light source for each input to the photonic processor would take up valuable real estate on the substrate. For conventional diode lasers emitting at wavelengths compatible with silicon photonics (i.e., 1.55 µm) diode lasers would have a footprint of at least 10 µm$^2$ and may be very energy intensive.

The inventors have recognized the challenges above and have developed integrated photonic system architectures that use VCSELs configured to generate light at energies above the bandgap of silicon (e.g., above 1.1 eV) to provide a small footprint, high bandwidth encoder. The emission aperture of a VCSEL is proportional the center wavelength of emission. For example, a VCSEL configured to generate light at 1500 nm (e.g., 0.82 eV) may have an emission aperture of approximately 1500 nm. By contrast, a VCSEL configured to generate light at 500 nm (e.g., 2.5 eV) may have an emission aperture of approximately 500 nm. As a result, VCSEL footprints may be smaller than 10 µm$^2$. By contrast, other diode lasers (e.g., side-emitting lasers) have footprints of larger than 10 µm$^2$. Therefore, VCSELs configured to generate light at energies above the bandgap of silicon may reduce the footprint of the VCSELs to provide a higher density of encoders.

The inventors have appreciated that while VCSELs configured to generate light at energies above the bandgap of silicon may reduce the size of the light sources used for encoding, it may also make the use of silicon waveguides impractical. If silicon waveguides were used to transmit light at an energy above the bandgap of silicon, the waveguide would absorb the light, causing prohibitively large losses for optical computing. Therefore, the inventors have recognized that to enable the use of VCSELs configured to generate light at energies above the bandgap of silicon, a waveguide that is transparent to the center wavelength of the generated light, and at the same time compatible with silicon photonic processes, is desirable to transport the light to the photonic processor from the VCSEL.

Recognizing the advantages of using a transparent waveguide described above, the inventors have further developed architectures that use silicon nitride waveguides to transmit light, having an energy above the bandgap of silicon, to the photonic processor from the VCSEL. Silicon nitride fabrication is compatible with many silicon photonics processes and has a bandgap of approximately 5 eV. The large bandgap of silicon nitride (relative to silicon) is transparent to light with a wavelength longer than approximately 250 nm. Unfortunately, fabrication of silicon nitride on a silicon substrate significantly increases the cost of fabrication. Consider, as an example, a photonic processor fabricated on a silicon substrate using silicon processing techniques. To further fabricate silicon nitride waveguides, either as input waveguides or as other optical components within the photonic processor, additional photomasks, lithography steps, and etches are required. The inventors have appreciated the increased costs of fabricating the silicon nitride components on a silicon substrate that includes a photonic processor. At the same time the inventors have recognized that the advantages of developing silicon photonic processor architectures including silicon nitrides outweigh their costs because silicon nitride waveguides enable a substantial footprint reduction.

Accordingly, some embodiments relate to an integrated photonics system comprising a VCSEL and a photonic integrated circuit (PIC) comprising a photonic processor configured to perform matrix multiplication. The VCSEL is optically coupled to the photonic processor. In some embodiments, the VCSEL is configured to generate light having a center wavelength less than 1.1 µm, and the PIC further comprises a waveguide (e.g., silicon nitride waveguide) optically coupling the VCSEL to the photonic processor, the waveguide being transparent to the center wavelength.

As discussed above, the inventors have recognized and appreciated that vertical cavity surface emitting lasers (VCSELs) may increase the overall bandwidth of an integrated photonic system by providing a light source with a small footprint that can be directly modulated to encode input optical signals for a photonic processor. Relative to other diode lasers, such as side-emitting lasers (e.g., distributed feedback lasers and distributed Bragg reflector lasers), VCSELs have lower thresholds, improved spatial profiles of the generated light, are cheaper to produce, and less susceptible to thermal noise. Unlike side-emitting lasers, the VCSEL cavity length is perpendicular to the substrate. Therefore, the footprint of the VCSEL does not depend on cavity length, as it would for a side-emitting laser, and additional mirrors (e.g., additional dielectric layers), built in modulators, optical monitor, and/or additional active layers can be included with the VCSEL without increasing the footprint.

Figure 6A:
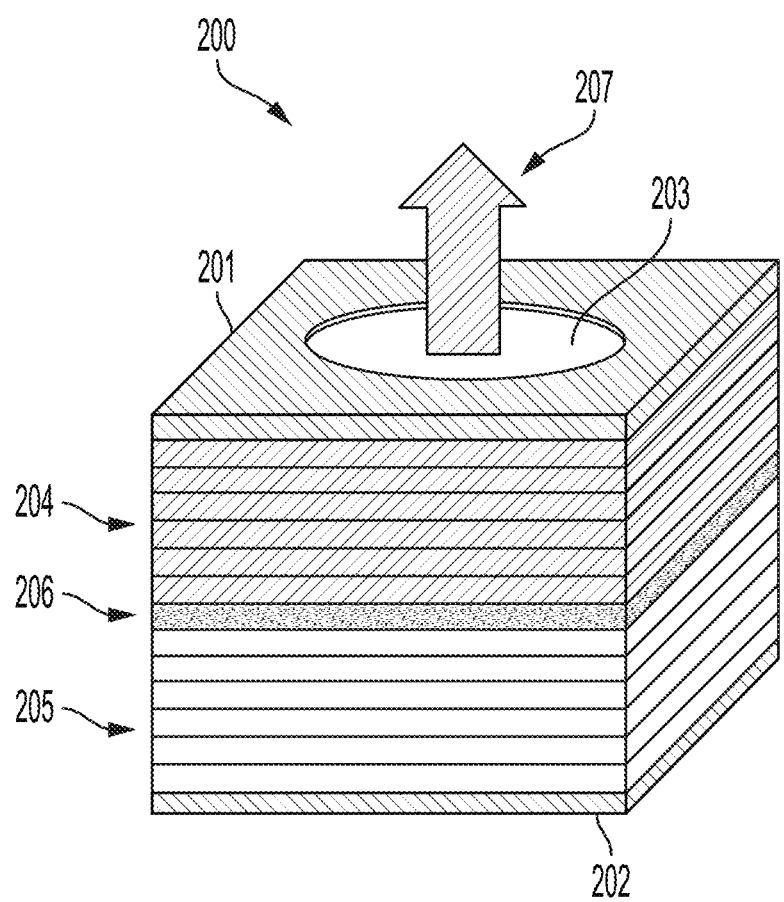
FIG. 6A is a perspective view of a vertical cavity surface emitting laser (VCSEL), in accordance with some embodiments.

FIG. 6A illustrates a VCSEL, in accordance with some embodiments. As illustrated in FIG. 6A, VCSELs may include semiconductor diode lasers that include an active layer between two distributed Bragg reflectors (DBRs). The active layer in a VCSEL is oriented approximately perpendicular to the direction of light emission. For example, VCSEL 200 includes active layer 206, top DBR 204, bottom DBR 205, signal terminal 201, ground terminal 202, and output aperture 203. The active layer 206 is disposed between top DBR 204 and bottom DBR 205 such that the illustrated structure is configured as a laser cavity. DBR mirrors are multilayered dielectric structures that can, in some embodiments, provide reflectivity greater than 99%. Light is generated when electrons and holes recombine in the active layer 206. The emission wavelength of the VCSEL is dependent, at least in part, on the material in the active region. In some embodiments, gallium aluminum arsenide (GaAlAs), indium gallium arsenide (InGaAs), or aluminum gallium arsenide (AlGaAs) may be used to provide a center wavelength between 700 nm and 1,100 nm (approximately 1.77 eV-1.1 eV). In some embodiments, indium gallium nitride (InGaN), aluminum gallium nitride (AlGaInP), gallium indium phosphide (GaInP), aluminum and/or gallium indium phosphide (AlGaInP) may be used to provide a center wavelength between 400 nm and 700 nm (approximately 3 eV-1.77 eV). In some embodiments, aluminum gallium nitride (AlGaN) may be used to provide a center wavelength between 200 nm and 400 nm (approximately 6.2 eV-3 eV). For example, active region 206 may include a InGaN quantum well configured to emit visible light with a center wavelength between 510 nm and 525 nm (approximately 2.43 eV-2.36 eV). The active layer may include other materials for generating the same and/or different wavelengths than the examples provide herein, as aspects of the technology described herein are not limited in this respect.

When an electrical signal is applied across VCSEL 200, light is generated in the active region by the recombination of electrons and holes. The generated light 207 is emitted through output aperture 203. In some embodiments, top DBR 204 is configured as a p-doped DBR and bottom DBR 205 is configured as an n-doped DBR (although the opposite arrangement is also possible). Signal terminal 201 is electrically coupled to the top DBR 204 and ground terminal 202 is electrically coupled to the bottom DBR 205. In some embodiments, the signal terminal is disposed on top of top DBR 204 and the ground terminal 202 is disposed under bottom DBR 205.

In some embodiments, p-doped DBR 204 includes alternating dielectric layers. For example, alternating layers of p-doped dielectrics may include p-doped layers of gallium aluminum arsenide (GaAlAs) and aluminum arsenide (AlAs), or p-doped layers of indium phosphide (InP) and indium gallium arsenide phosphide (InGaAsP). Other p-doped dielectrics may be used, as aspects of the technology described herein are not limited in this respect.

In some embodiments, n-doped DBR 205 includes alternating dielectric layers. For example, alternating layers of n-doped dielectrics may include n-doped layers of GaAlAs and AlAs, or n-doped layers of InP and InGaAsP. Other n-doped dielectrics may be used, as aspects of the technology described herein are not limited in this respect.

Additionally, or alternatively, VCSEL 200 may include undoped mirrors to increase the reflectivity of the VCSEL. For example, undoped mirrors may include silicon oxide ($SiO_2$), silicon nitride ($Si_3N_4$), titanium oxide ($TiO_2$), and/or hafnium oxide ($HfO_2$) dielectric layers. Other dielectric layers may also be used in the top and bottom DBR layers as aspects of the technology described herein are not limited in this respect.

In some embodiments, the undoped mirrors are used in addition to the doped mirrors. In other embodiments, undoped mirrors are used in place of the doped mirrors. In embodiments with undoped mirrors, doped semiconductor layers for electrically pumping the gain medium may be included in the active region. For example, the gain material of the active region may include a InGaN quantum well disposed between n-doped GaN and p-doped GaN. Accordingly, the signal and ground electrodes may be provided between the active region and the top/bottom DBR mirrors, respectively.

In some embodiments, aperture 203 is disposed in the top terminal as illustrated in FIG. 6A. In other embodiments, output aperture 203 is disposed in the bottom terminal. In yet other embodiments, a first output aperture is disposed in the top terminal and a second output aperture is disposed in the bottom terminal. The first terminal may be configured to transmit light to a photonic processor and the second terminal may be configured to transmit light to an optical monitor to generate a feedback signal, as will be described further in connection to FIG. 8.

In some embodiments, the VCSEL may include multiple active layers. A first active layer may be configured to generate pump light to optically pump the second active layer. For example, the VCSEL may be fabricated with two stacked VCSELs, where a first electrically pumped VCSEL is fabricated on top of a second VCSEL. The first VCSEL configured to optically pump the second VCSEL.

Additionally, or alternatively, the output aperture may be configured to facilitate the coupling of light from the VCSEL to a waveguide. For example, the output aperture may be etched to facilitate directional coupling of light out of the VCSEL. As another example, the output aperture may include additional features to affect the polarization of emitted light.

In some embodiments, active layer 206 includes a plurality of light emitters. For example, active layer 206 may include a plurality of quantum wells. In some embodiments, the active layer may include other configurations, as aspects of the technology described herein are not limited in that respect.

In some embodiments, the VCSEL signal electrode and ground electrode are disposed on the same surface of the VCSEL. For example, signal electrode 201 and ground electrode 202 may both be located on the top surface, on either side of output aperture 207. The signal electrode 201 may directly contact the p-doped DBR 204, for electrically coupling the signal electrode to the active layer, and the ground electrode 202 may be electrically coupled to the n-doped DBR 205 through vias or conductive traces for electrically coupling the signal electrode to the active layer.

As described above, a photonic processor may be configured to perform mathematical operations using light that is encoded with an input value. However, the encoding process may be a bottleneck for the compute density of a photonic processor. Direct modulation of the light source can provide much higher bandwidths than external modulation and, as a result, may increase the compute density of a photonic processor by increasing the bandwidth of the encoding process.

VCSELs have a thin active region and highly reflective mirrors, as discussed above in connection with FIG. 6A. In comparison to edge-emitting lasers, the thin active region and highly reflective mirrors of a VCSEL reduce the threshold current for stimulated emission. Lower threshold currents permit high intrinsic modulation bandwidths. Therefore, VCSELs may provide a higher bandwidth and more efficient light source for direct modulation, relative to other light sources such as other diode lasers.

FIG. 6B illustrates a directly modulatable VCSEL, in accordance with some embodiments. The VCSEL 200 receives modulation signal 249 and generates modulated light 207 with intensity profile 250. Intensity profile 250 is encoded with the electrical modulation signal 249 as illustrated in FIG. 6B. Modulation signal 249 may be an intensity modulation signal. In intensity modulation, the optical power is modulated in accordance with the electrical modulating signal. For example, a VCSEL with a threshold current for stimulated emission $I_{th}$, may receive a modulating signal that alternates from a first current below $I_{th}$ to a second current above $I_{th}$. When the current is above the threshold current, the VCSEL generates light through stimulated emission and when the current is below the threshold current, the VCSEL does not generate light, or generates light with very low intensity (e.g., spontaneous emission).

In some embodiments, VCSEL 200 may be configured to provide a bandwidth between 2 Gb/s and 10 Gb/s. In some embodiments VCSEL 200 is configured to provide a bandwidth between 50 Gb/s and 100 Gb/s. In some embodiments, VCSEL 200 is configured to provide a bandwidth between 100 Gb/s and 200 Gb/s.

As discussed above, the inventors have recognized that VCSELs may further increase the overall bandwidth of the system by providing a small footprint, increasing the computing density. Unlike VCSELs, other diode lasers (e.g., side-emitting lasers) use in-plane coupling. Therefore, both the diode laser and the in-plane coupler occupy separate footprints on the photonic integrated circuit. By contrast, VCSELs emit light vertically and, as an advantage, can use out-of-plane coupling. The VCSEL and the optical coupler, that couples light from the VCSEL to the input waveguide of the photonic processor, can occupy the same footprint on the photonic integrated circuit, in a stacked configuration. One such exemplary embodiment is illustrated in FIG. 7.

Figure 7:
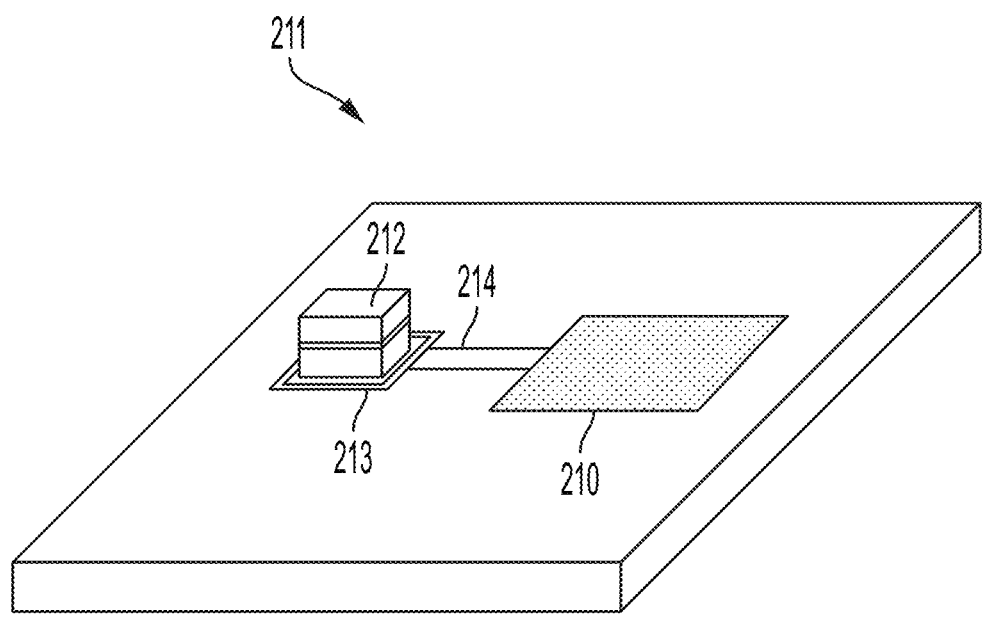
FIG. 7 is a perspective view of a VCSEL optically coupled to a photonic processor, in accordance with some embodiments.

FIG. 7 illustrates an exemplary embodiment of an integrated photonics system configured to perform matrix multiplication using light received from a VCSEL, in accordance with some embodiments. The integrated photonics system 211 includes photonic integrated circuit 209, photonic processor 210, VCSEL 212, waveguide 214, and out-of-plane coupler 213. In some embodiments, photonic integrated circuit 209 is a silicon substrate including photonic processor 210. VCSEL 212 is disposed above the out-of-plane coupler. In some embodiments, VCSEL 212 is above the out-of-plane coupler such that a surface of the VCSEL and a surface of the out-of-plane coupler are in contact. In other embodiments, the VCSEL is suspended above the out-of-plane coupler such that there is an air gap between a surface of the VCSEL and a surface of the out-of-plane coupler. In yet other embodiments, an oxide layer (e.g., silicon oxide) is disposed between a surface of the VCSEL and a surface of the out-of-plane coupler.

In some embodiments, VCSEL 212 is configured to generate light having a center wavelength less than 1.1 µm and is optically coupled to waveguide 214 through out-of-plane coupler 213. For example, VCSEL 212 may be configured with different materials in the active region to generate various wavelengths, as described herein.

Waveguide 214 is transparent to the center wavelength of the light generated by the VCSEL, in accordance with some embodiments. For example, waveguide 214 is a silicon nitride waveguide having a band gap of approximately 5.0 eV. In accordance with the bandgap of silicon nitride, a silicon nitride waveguide will be transparent to light having a center wavelength longer than 250 nm. In some embodiments, waveguide 214 is configured to transmit light having a center wavelength shorter than 1.1 µm. In some embodiments, waveguide 214 is configured to transmit light having a center wavelength shorter than 750 nm. In some embodiments, waveguide 214 is configured to transmit light having a center wavelength shorter than 550 nm. In some embodiments, waveguide 214 is configured to transmit light having a center wavelength shorter than 450 nm.

In some embodiments, waveguide 214 is configured to support a transverse optical mode. In other embodiments, waveguide 214 is configured to support multiple transverse optical modes. In some embodiments, waveguide 214 is configured to transmit light having a spectral bandwidth between 200 nm and 5 nm. In some embodiments, waveguide 214 is configured to transmit light having a spectral bandwidth less than 1 nm.

In some embodiments, the waveguide is configured to support low loss transmission at the center wavelength of light received by VCSEL 212. For example, VCSEL 212 is configured to emit having a center wavelength of 515 nm and waveguide 214 is configured to transmit light having a center wavelength of 515 nm with a loss of 20 dB/cm or less.

As shown in the illustrated embodiment of FIG. 7, out-of-plane coupler 213 is configured to couple light from VCSEL 212 to waveguide 214. For example, out-of-plane coupler 213 may be an optical grating configured with a single output. As another example, out-of-plane coupler may be an optical grating configured with multiple outputs.

Photonic processor 210 is configured to implement matrix multiplication, in accordance with embodiments described herein. The photonic processor may include modulatable detectors, in accordance with some embodiments. The modulatable detectors may be used to perform matrix multiplication by modulating an input vector, received from the waveguide, in accordance with a matrix. For example, photonic processor 210 can be a processor as described above in connection with FIGS. 2-5 above.

VCSEL based optical encoders may also include controllers for modulating the VCSEL to encode input light for a photonic processor. High speed modulation can generate heat at the modulator, which in turn can lead to spectral shifts, whereby the wavelength of the emitted light drifts away from the desired value. Spectral shifts in the center wavelength of light sources may affect the transmission of light through a photonic processor, resulting in spectral noise. Spectral noise decreases the signal-to-noise ratio of a photonic processor and is generally the result of temperature gradients and temperature induced changes in refractive index in a photonic system. The inventors have recognized that VCSELs are ideal for direct modulation because VCSELs consume less power and provide improved temperature stability relative to other light sources (e.g., side-emitting lasers). In some embodiments, the active region of a laser is most susceptible to refractive index changes induced by temperature. Changes in temperature to the active region can shift the center wavelength of the generated light. As a result of the spectral dependence of optical components (e.g., optical couplers, waveguides, detector sensitivities), changes in temperature, that shift the center wavelength of the generated light, may result in changes to the transmission of the light and a decreased signal-to-noise ratio. By extension, a shift of the center wavelength may result in a decrease of the overall efficiency or sensitivity of a photonic processor. In a high compute density encoder, with many light sources within a small area, these effects may be more pronounced. The active region in a VCSEL is shorter than the active region in side-emitting lasers (along the direction of light emission). Therefore, the output of a VCSEL provides improved temperature stability relative to side-emitting lasers. The inventors have recognized and appreciated that the improved spectral stability provided by VCSELs, capable of direct modulation with high efficiency and high signal-to-noise, relative to other light sources, may provide high bandwidth, high compute density encoding for photonic processors.

The inventors have further recognized that the electrical components used to modulate the VCSEL may provide a bottleneck on the bandwidth to encoding input light for a photonic processor. As discussed above, electrical circuits are susceptible to parasitic capacitance, which can limit the speed of modulation and, by extension, the bandwidth. The inventors have appreciated that because, photonic components are not susceptible to parasitic capacitance, the length of a photonic circuit (e.g., length of a waveguide) does not limit the speed of modulation. Accordingly, the inventors have developed integrated photonic system architectures that provide high bandwidth optical encoders.

Figure 8:
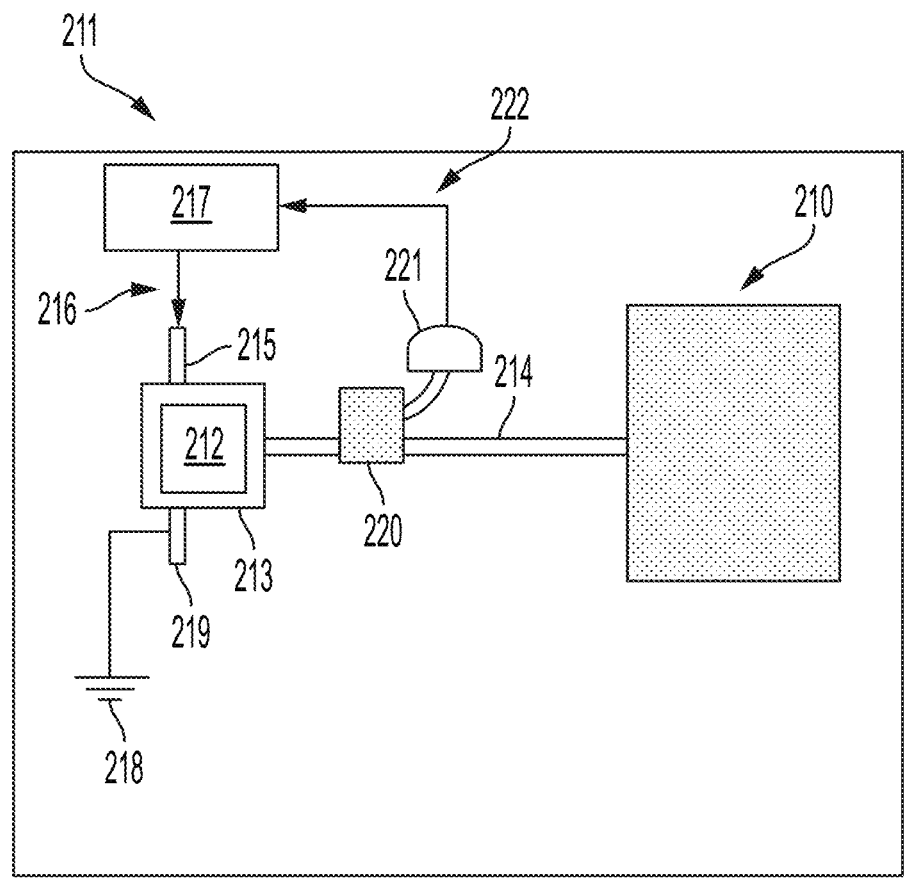
FIG. 8 is a schematic view of a VCSEL configured for direct modulation optically coupled to a photonic processor, in accordance with some embodiments.

FIG. 8 illustrates a block diagram of an exemplary embodiment of an integrated photonics system configured to directly modulate a VCSEL to provide high bandwidth optical encoders, in accordance with some embodiments. Photonics system 211 includes photonic integrated circuit 209, photonic processor 210, VCSEL 212, signal terminal 215, ground terminal 219, controller 217, reference voltage 218, optical sampler 220, optical signal monitor 221, and waveguide 214. Signal terminal 215 and ground terminal 219 can be electrically coupled to the controller 217 and reference voltage 218 using packaging techniques as described herein in connection with FIGS. 13A-13D.

As illustrated in FIG. 8, VCSEL 212 is electrically coupled to controller 217 through signal terminal 215 and electrically coupled to a reference voltage 218 through ground terminal 219. Controller 217 is configured to apply an electrical modulation signal 216 to VCSEL 212. VCSEL 212 is optically coupled to out-of-plane coupler 213 that transmits light generated by the VCSEL to the photonic processor 210 for performing mathematical operations. For example, to perform matrix multiplication, an input numeric value is encoded in the light generated by VCSEL 212 by using controller 217 to directly modulate the electrical signal applied to the VCSEL to cause it to generate light. Direct modulation may be implemented in accordance with the techniques described herein in connection with FIG. 6B.

Controller 217 may be configured for vertical electrical coupling with the VCSEL, in accordance with some embodiments. For example, controller 217 may be fabricated as a separate ASIC that is disposed on top of an interposer above the VCSEL. The ASIC may electrically couple to VCSEL 212 through vias in the interposer or through other packaging interconnects, as described further in connection with FIG. 13D. The all-vertical integration of controller 217, VCSEL 212, and out-of-plane optical coupler 213 provides a small footprint light source that can be directly modulated and enables short electrical connections between controller 217 and VCSEL 212 to reduce the resistance, inductance, and capacitance of the modulator electronics.

In some embodiments, controller 217 is an application-specific integrated circuit (ASIC) disposed on the same substrate as the photonic processor. In other embodiments, controller 217 is an ASIC configured on a separate substrate from the photonic processor. In yet other embodiments, the controller 217 may include components on a first substrate that includes the photonic processor and a second substrate that includes the VCSEL. In yet other embodiments, controller 217 may be configured separate from the integrated photonics system and may transmit signals to the integrated photonics system using an input/output interface.

In some embodiments, controller 217 may receive signal through an input-output interface with other processors or controllers to instruct controller 217 which values to encode in the input light through direct modulation of a VCSEL.

The photonic processor 210 is configured to perform a mathematical operation using the input light, in accordance with some embodiments. For example, the photonic processor may apply a matrix value to the input value, encoded in the input light, by modulating optical components within the photonic processor. In some embodiments, the photonic processor may be a photonic processor as described in connection with FIGS. 2-5 above.

Additionally, or alternatively, controller 217 generates an electrical modulation signal to directly modulate VCSEL 212 according to a target signal. However, the actual signal may deviate from the target signal due to chirp, non-linear optical effects, alignment, and/or deviations in manufacturing. The inventors have appreciated that as modulation speed increases, the chirp and/or non-linearities may become more pronounced. Recognizing that the deviations from the target signal may decrease the bandwidth of the photonic processor, the inventors have developed an integrated photonic system architecture that includes an optical signal monitor configured to detect an actual signal generated by the VCSEL. The optical signal monitor may be used to improve the modulation signal to reduce deviations between the actual signal and the target signal.

As an example, VCSEL 212 receives a modulation signal from controller 217 corresponding to a target optical signal. In some embodiments, the target optical signal corresponds to a target intensity, where the target intensity may correspond to a numeric input value to be used by photonic processor 210 to perform matrix multiplication, as described herein. The light generated by VCSEL 212, according to an input electrical modulation signal corresponding to the target intensity, is coupled into waveguide 214. An optical sampler 220 couples a portion of the light transmitted by waveguide 214 to the optical signal monitor. The optical signal monitor 221 generates an electrical feedback signal corresponding to the actual intensity produced by the VCSEL based on the light detected by the optical signal monitor. In response to the electrical feedback signal generated by optical signal monitor 221, controller 217 adjusts modulation signal 216 to reduce the differences between the target signal and the actual signal.

In some embodiments, optical signal monitor 221 may be co-integrated with VCSEL 212. For example, VCSEL 212 may include a top output aperture optically coupled to the waveguide 214 and a bottom output aperture optically coupled to the optical signal monitor.

In some embodiments, the optical sampler is disposed between the VCSEL and the photonic processor, as illustrated in FIG. 8. In other embodiments, the optical sampler is disposed after the photonic processor. In yet other embodiments, a detector used to perform matrix multiplication may also be used as the optical signal monitor and provide a feedback signal to controller 217.

In some embodiments, optical sampler 220 is configured to couple a portion of the light transmitted through waveguide 214 to optical signal monitor 221. For example, optical sampler 220 may be an in-plane optical coupler configured to couple less than 5% of the light transmitted through waveguide 214. In other embodiments, optical sampler may be an in-plane optical coupler configured to couple less than 40% of the light transmitted through waveguide 214.

In some embodiments, the optical signal monitor may be used to correct for manufacturing or alignment differences between VCSELs and the out-of-plane couplers.

The small footprint of VCSELs can increase the bandwidth of photonic processors by enabling larger compute densities (i.e., more photonic components per unit area). The compute density is proportional to the mathematical operations that can be computed in parallel. The inventors have recognized and appreciated that in addition to the smaller footprint of VCSELs configured to generate light with energies above the bandgap of silicon, that the use of shorter wavelengths (i.e., wavelengths shorter than 1.1 µm) enables the use of smaller optical components in the photonic processor itself. Smaller optical components in the processor further enable increases in the photonic components per unit area, resulting in larger computer densities. An encoder architecture configured to accommodate multiple VCSELs to encode input values for a photonic processor with a high compute density is illustrated in FIG. 9.

Figure 9:
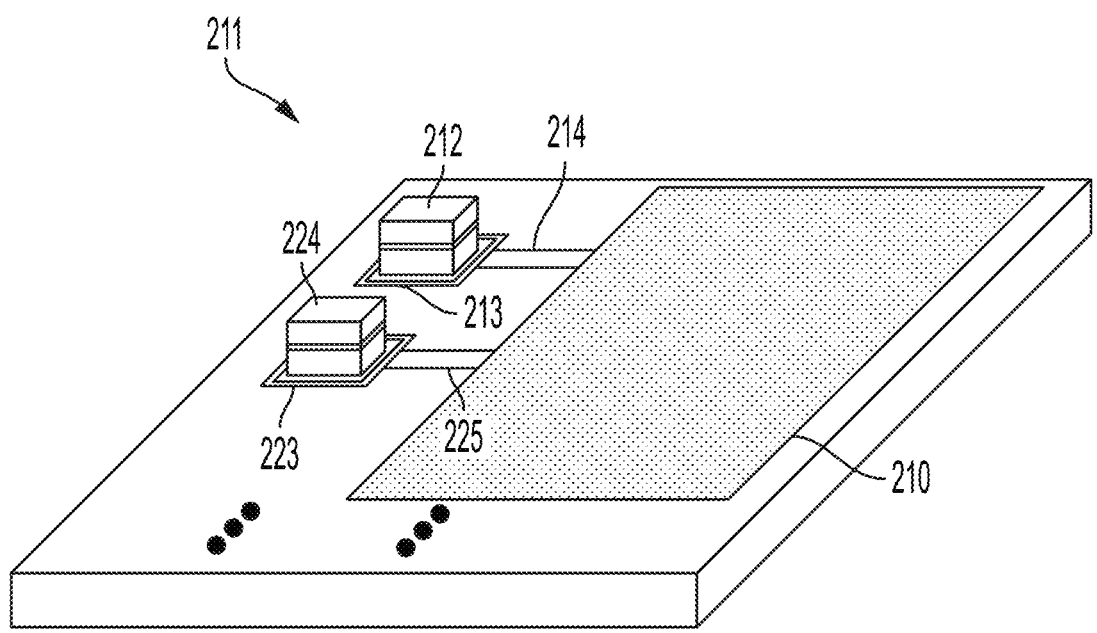
FIG. 9 is a perspective view of an integrated photonics system including a plurality of VCSELs optically coupled to a photonic processor, in accordance with some embodiments.

FIG. 9 illustrates an exemplary embodiment of a photonic processor configured with multiple VCSELs for performing matrix multiplication in parallel, in accordance with some embodiments. The integrated photonics system 211 illustrated in FIG. 9 includes photonic processor 210, VCSELs 212 and 224, out-of-plane couplers 213 and 223, and waveguides 214 and 225.

In some embodiments, each VCSEL may be coupled to a controller, such as controller 217, as described in connection with FIG. 8, for generating electrical signals to modulate each the VCSELs independently. For example, VCSEL 212 may be configured with a first controller, and VCSEL 224 may be configured with a second controller independent from the first controller. In some embodiments, a single controller is configured to transmit signals to multiple VCSELs. For example, VCSEL 212 and 224 may both receive modulation signals from the same controller.

In some embodiments, the VCSELs may be configured to generate light having a center wavelength less than 1.1 µm. Accordingly, VCSELs 212 and 224 may be configured to generate light having the same center wavelength. For example, both VCSELs 212 and 224 may be configured to generate light having a center wavelength of approximately 515 nm.

Additionally, or alternatively VCSELs may be configured to generate light having different center wavelengths, in accordance with some embodiments. For example, VCSEL 212 may be configured to generate light having a first center wavelength of 515 nm and VCSEL 224 may be configured to generate light having a second center wavelength of 680 nm. In some embodiments, VCSELs configured to generate light having different center wavelengths may be used to generate multiplexed signals, where the light generated from each VCSEL is encoded separately and then combined in a shared waveguide.

In some embodiments, waveguide 214 and 225 are formed from a material optically transparent to the center wavelength generated by the VCSEL. In some embodiments, the waveguide is formed of a material transparent to the center wavelength. As described herein, in connection with FIG. 7, silicon nitride may be used to provide waveguides transparent to the center wavelength and that are compatible with silicon photonics processes, though other materials are also possible.

VCSELs 212 and 224 may be configured to generate light encoded with input numeric values. For example, VCSEL 212 may receive a first signal to modulate the light generated by VCSEL 212 corresponding to a first numeric value and VCSEL 224 may receive a second signal to modulate the light generated by VCSEL 224 corresponding to a second numeric value. In some embodiments, the input values may correspond to a scalar number for use in scalar multiplication. When VCSELs 212 and 224 are configured to encode values for scalar multiplication, the first numeric value and the second numeric value may correspond to the same scalar quantity (e.g., the same number). Additionally, or alternatively, the first numeric value and the second numeric value may correspond to different scalar quantities (e.g., different numbers).

Additionally, or alternatively, the input values may correspond to input vectors for use in matrix multiplication. Input vectors may be characterized by their dimensionality (e.g., the number "n" of elements in the vector). In some embodiments, VCSELs 212 and 224 may be configured to receive elements corresponding to the same input vector. For example, for a n=2 input vector, the vector includes two elements, a first numeric value $x_1$ and a second numeric value $x_2$. VCSEL 212 may receive a signal corresponding to value $x_1$ and VCSEL 224 may receive an input value corresponding to $x_2$.

Two exemplary vector encoding schemes are provided by way of illustration. In a first exemplary vector encoding scheme, the VCSELs may encode values for parallel computing of different input vectors. For example, for a first input vector with two elements $x_1$ and $x_2$ and a second input vector with two elements $x_3$ and $x_4$, each VCSEL may receive values corresponding to a single input vector. In more detail, VCSEL 212 may first receive signals to encode element $x_1$ corresponding to the first input vector and VCSEL 224 may first receive signals to encode element $x_3$ corresponding to the second input vector. After the transmission of light encoded with elements $x_1$ and $x_3$ to the photonic processor, VCSEL 212 may receive signals to encode element $x_2$ corresponding to the first input vector and VCSEL 224 may receive signals to encode element $x_4$ corresponding to the second input vector.

In a second exemplary vector encoding scheme, the VCSELs may encode values for parallel computing of the same input vectors. For example, for an input vector with four elements $x_1$, $x_2$, $x_3$, and $x_4$ a subset of the elements may be encoded in parallel using VCSEL 212 and 214. VCSEL 212 may first encode element $x_1$ and VCSEL 214 may first encode element $x_2$ to be encoded in parallel by photonic processor 210. After the light encoded with the elements $x_1$ and $x_2$ has been transmitted to the photonic processor, VCSEL 212 may encode element $x_3$ and VCSEL 214 may encode element $x_4$ to be encoded in parallel by photonic processor 210.

For either encoding scheme, the input vectors can be computed using fewer VCSELs than the number of elements in the input vector by encoding a subset of the elements in parallel and sequentially updating the subset until all of the elements have been encoded. As such, the input vectors may be any dimensionality, as aspects of the technology described herein are not limited in this respect.

The above-described exemplary encoding schemes may be used in combination. For example, a subset of VCSELs may encode input values in accordance with the first encoding scheme while a second subset may encode input values in accordance with the second encoding scheme. Alternatively, or additionally, a first subset VCSELs may be used in accordance with a first encoding scheme to encode a first input value and may be used in accordance with the second encoding scheme to encode a second input value. In some embodiments, other encoding schemes will be used, as aspects of the technology described herein are not limited in this respect.

In some embodiments, additional external modulation components may be included with the photonic integrated system to implement matrix multiplication using the input light generated by the VCSELs.

Additionally, or alternatively, light emitted from VCSEL 212 may emit light to a plurality of input waveguides, such that a plurality of calculations are performed in parallel with the light emitted from a single VCSEL.

In some embodiments, integrated photonics system may include between 32 and 1024 VCSELs. In some embodiments, integrated photonics system may include between 100 and 10,000 VCSELs. In some embodiments, integrated photonic system as many as 100,000 VCSELs.

In some embodiments, for a photonic processor configured to compute an array of M by N values or matrix elements, the integrated photonic system may include M VCSELs. Each VCSEL may provide input light to, at least, N optical modulators, each optical modulator configured for performing multiplication in the photonic processor such that M by N values or matrix elements can be computed in parallel.

The photonic processor may include multiple photonic cores. A photonic core includes optical elements that are configured to perform mathematical operations using input light encoded with input values, as described herein. Computing efficiency may be increased when every available processor input is utilized. If there is a calculation that can be implemented using fewer inputs than the system has available, the remaining inputs could be more efficiently used to perform a second process rather than sitting idle during the first process. Having multiple photonic cores provides the flexibility to use all of the inputs, in all of the cores, to do one calculation or to use a single core to do one calculation, while leaving additional cores free to perform other processes.

Figure 10:
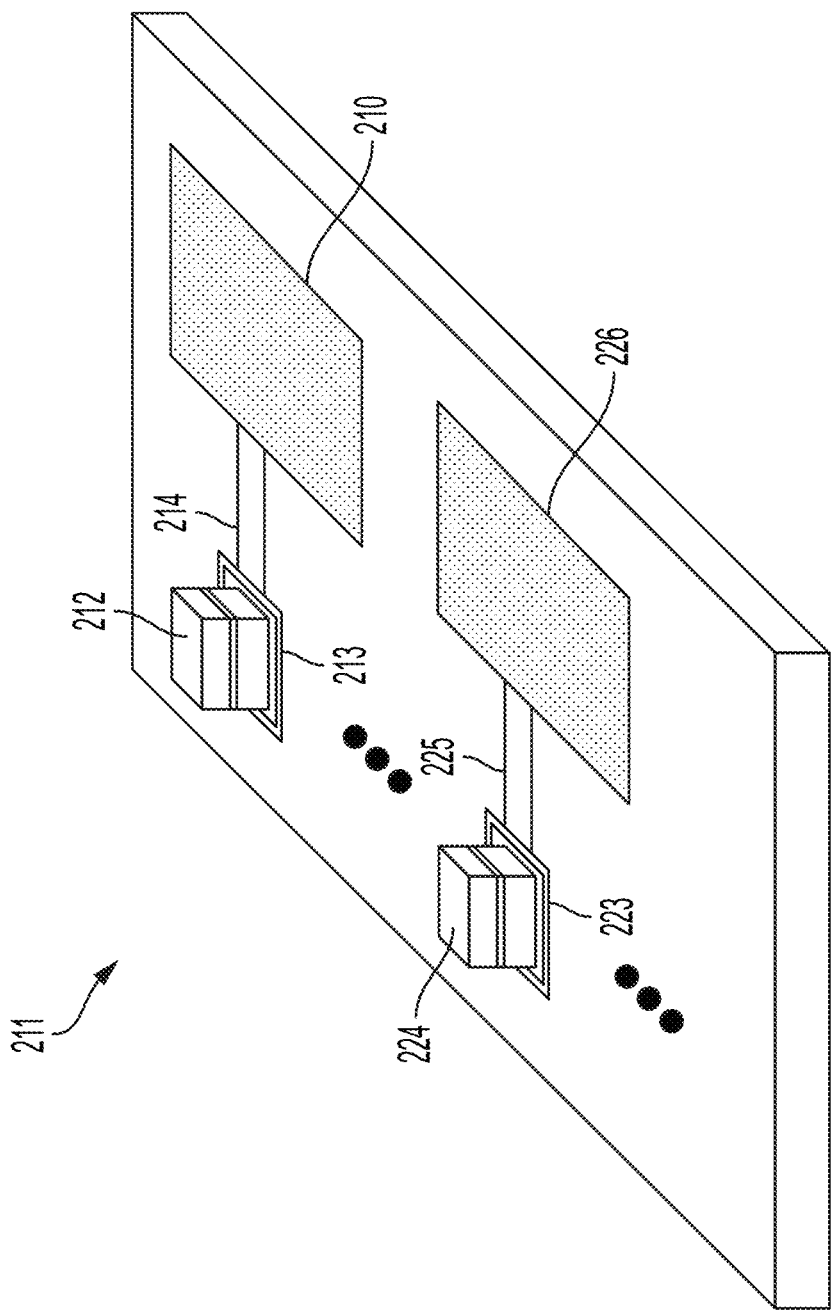
FIG. 10 is a perspective view of an integrated photonics system with multiple photonic processors, in accordance with some embodiments.

FIG. 10 illustrates an exemplary embodiment of an integrated photonics system 211 including photonic processors 210 and 226. Each photonic processor can be configured to perform matrix multiplication using light received from multiple VCSELs configured to provide a high bandwidth encoder, as described herein. Photonic processor 210 receives light generated by VCSEL 212, optically coupled to waveguide 214 by out-of-plane coupler 213. Photonic processor 210 may be configured with between 100 and 500 VCSELs and 100 and 500 input waveguides, in accordance with some embodiments. Photonic processor 226 receives light generated by VCSEL 224, optically coupled to waveguide 225 by out-of-plane coupler 223. Photonic processor 226 may be configured with between 100 and 500 VCSELs and 100 and 500 input waveguides in accordance with some embodiments.

In some embodiments, photonic processor 210 and 226 may be configured with the same number of input waveguides and VCSELs. In other embodiments, photonic processor 210 and 226 may be configured with different numbers of input waveguides and VCSELs.

In some embodiments, photonic processor 210 and 226 may be configured to perform two different portions of a calculation. In some embodiments, photonic processor 210 and 226 may be configured to perform the same calculation. In some embodiments, photonic processor 210 and 226 may be configured to perform different calculations.

In some embodiments, an integrated photonics system may include 2-32 cores. In other embodiments, the integrated photonics system may have additional cores, as aspects of the technology described herein are not limited in this respect.

Photonic cores 210 and 226 and VCSELs 212 and 224 may be configured according to the integrated photonic systems described above.

Figure 11:
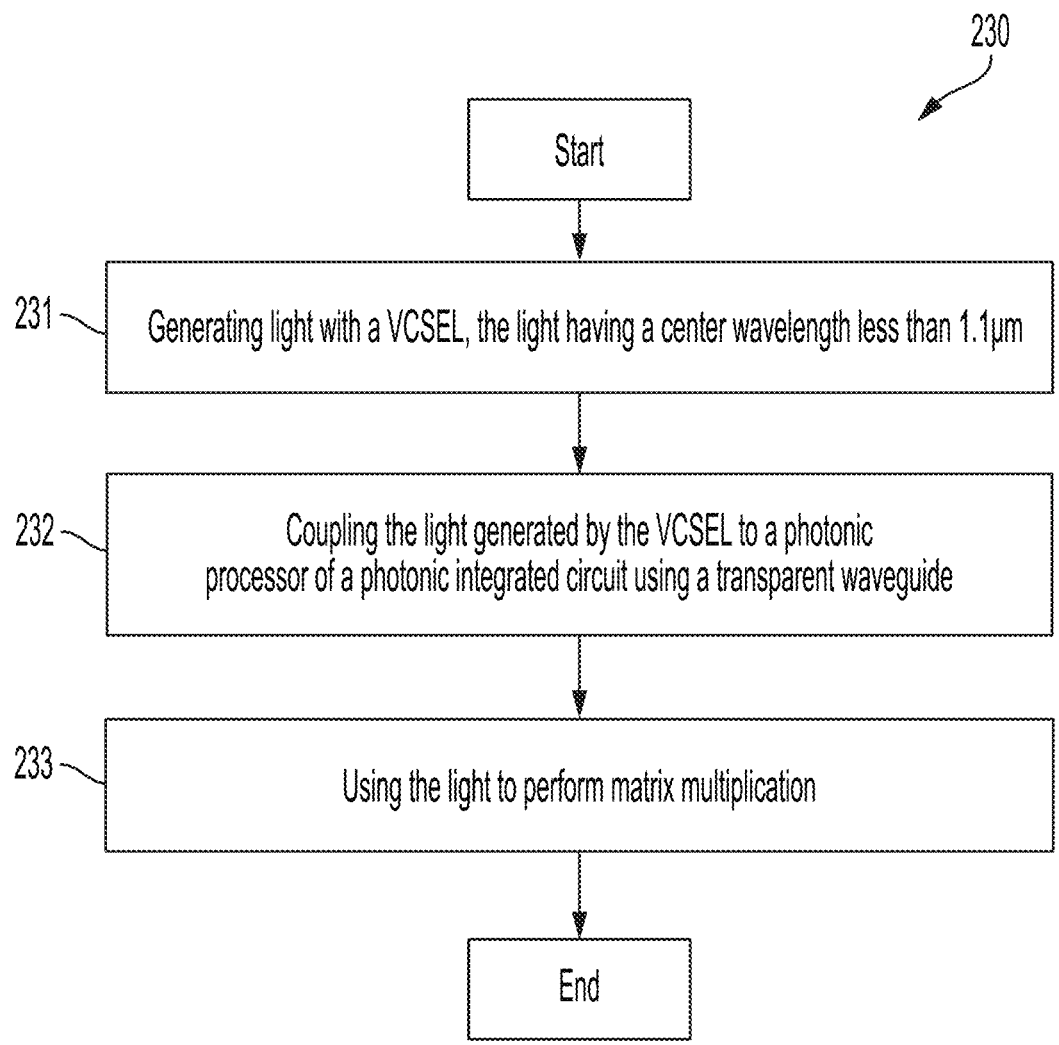
FIG. 11 is a flowchart of a method for operating an integrated photonics system, in accordance with some embodiments.

FIG. 11 is a flowchart illustrating an exemplary method for operating an integrated photonic system to perform matrix multiplication, in accordance with embodiments described herein. As described above, a photonic processor is configured to perform matrix multiplication by modulating light encoded with an input value, in accordance with a matrix. The input value can be encoded in the transmitted light using external modulation of light before transmitting the light to the multiplication unit and/or direct modulation where the light is generated according to a modulation signal. As described in connection with FIG. 6-8 above, the inventors have recognized and appreciated that directly modulating VCSELs that are configured to generate light having an energy above the bandgap of silicon (approximately 1.1 eV) may provide high bandwidth encoding to provide input light to a photonic processor.

Prior to the start of method 230, an electrical modulation signal may be generated by a controller and transmitted to the VCSEL. The electrical modulation signal may be generated by a centralized controller or a localized controller, as described above in connection with FIG. 8. In some embodiments, the electrical modulation signal will directly modulate the output of the VCSEL to encode an input value.

Method 230 begins at block 231, where a VCSEL generates light having a center wavelength less than 1.1 μm (e.g., light with an energy larger than the bandgap of silicon). In some embodiments, when the electrical modulation signal includes a modulation signal, the light generated by the VCSEL is modulated to encode an input value into the emitted light. For example, the VCSEL may generate light in accordance with a modulation signal that directly modulates the intensity of the VCSEL. The modulation signal may modulate the electrical signal between a current above a threshold current, for stimulated emission, to a current below the lasing threshold current, for stimulated emission. The VCSEL may be modulated according to other modulation techniques as described herein in connection with FIG. 6B.

The electrical modulation signal corresponds to a target intensity to be encoded in the light generated by the VCSEL, in accordance with some embodiments. An optical monitor may monitor an actual intensity of the light generated by the VCSEL, as described above in connection with FIG. 8. In some embodiments, the optical monitor generates a feedback signal based on the actual intensity of light. The controller that generates the modulation signal may adjust the modulation signal, in accordance with the feedback signal, such that the differences between the target intensity and the actual intensity are reduced.

In some embodiments, the VCSEL may generate light having a center wavelength between 200 nm and 1.1 μm. In some embodiments, the VCSEL may generate light having a center wavelength between 400 nm and 700 nm.

Multiple VCSELs may be used to generate and encode multiple input values for performing multiple matrix multiplication processes in parallel, in accordance with some embodiments. For example, a first VCSEL may be used to generate light that is transmitted to the photonic processor using a first waveguide and a second VCSEL may be used to generate light that is transmitted to the photonic processor using a second waveguide. In some embodiments, the first VCSEL and the second VCSEL may generate light having the same center wavelength. In other embodiments, the first and the second VCSEL may generate light having different center wavelengths. For example, the first and the second VCSEL may have the same gain material in the active region but the mirrors may be configured to provide a different center wavelength. As another example, the first and the second VCSEL may have different gain materials in the active region.

Additionally, or alternatively, the outputs of the first and the second VCSELs may be combined. For example, the outputs of the first and second VCSELs may be used to generate a multiplexed signal. The multiplexed signal may be transmitted by a first waveguide or by multiple waveguides.

Next, at block 232, the light generated by the VCSEL is coupled to a photonic processor of a photonic integrated circuit using a waveguide transparent to the center wavelength of the light generated by the VCSEL. The waveguide may be a silicon nitride waveguide in some embodiments, though other materials are also possible. Silicon nitride has a band gap of approximately 5 eV. Therefore, silicon nitride is transparent to light with an energy less than approximately 5 eV or a wavelength longer than 250 nm. In some embodiments, a silicon nitride waveguide is used to couple light with a center wavelength between 250 nm and 1.1 μm generated by the VCSEL to a photonic processor on a photonic integrated circuit.

The waveguide may include an out-of-plane coupler for optically coupling the waveguide to the VCSEL. The out-of-plane coupler is configured to receive light emitted from the VCSEL perpendicular to the surface of the photonic integrated circuit and transmit the received light in the plane of the integrated circuit. In some embodiments, the out-of-plane coupler may couple light through a single waveguide. Additionally, or alternatively, the out-of-plane coupler may couple light in multiple directions through multiple waveguides.

The waveguide that couples light from the VCSEL to the photonic processor may additionally include additional waveguides optically coupled to each other such that the light generated by a single VCSEL is transmitted to the photonic processor using multiple waveguides. The multiple waveguides may be related to a single optical input or may be configured as separate optical inputs. For example, in some embodiments the waveguides may be coupled by beam splitters. In other embodiments, the waveguides may be evanescently coupled.

In some embodiments, other materials that are transparent to the center wavelength may be used as the waveguide to transparent light generated by the VCSEL to the photonic processor.

Next, at block 233, a photonic processor uses the light coupled to the photonic processor by the waveguide to perform matrix multiplication. The photonic processor may include modulatable detectors, in accordance with some embodiments. The modulatable detectors may be used to perform matrix multiplication by modulating an input vector, received from the waveguide, in accordance with a matrix, as described herein.

In some embodiments, performing matrix multiplication may involve modulating adjustable beam splitters to further modulate the input light to perform matrix multiplication. The adjustable beam splitters may be used to perform matrix multiplication by modulating input light, received from the waveguide, in accordance with a matrix, as described herein.

Method 230 ends after the multiplication is complete. Following the completion of method 230, a controller may send new signals corresponding to new values to the VCSELs to be encoded for additional matrix multiplication. The computed matrix multiplication may be summed, or otherwise used in further calculations, as aspects of the technology described herein are not limited in this respect. For example, the photonic processor may include optical adders, in accordance with some embodiments.

As described above, photonic processors include photonic and electronic components and may be economically fabricated using silicon processing nodes. VCSELs are layered dielectric structures that may be fabricated using a broad range of dielectric materials both for the active region and for the DBR mirrors. Due to the specialization and sensitivity of high-quality semiconductor manufacturing, most foundries specialize in a limited selection of semiconductor materials and use dedicated processing nodes, based on specific materials and applications, to prevent cross contamination. Accordingly, foundries generally do not permit the co-fabrication of VCSELs and silicon photonics. Instead, the VCSELs and photonic processor are generally fabricated separately, using different equipment and, in some cases, different foundries and are then packaged together. FIGS. 12-13 illustrate exemplary techniques for packaging, in accordance with some embodiments described herein.

Figure 12A:
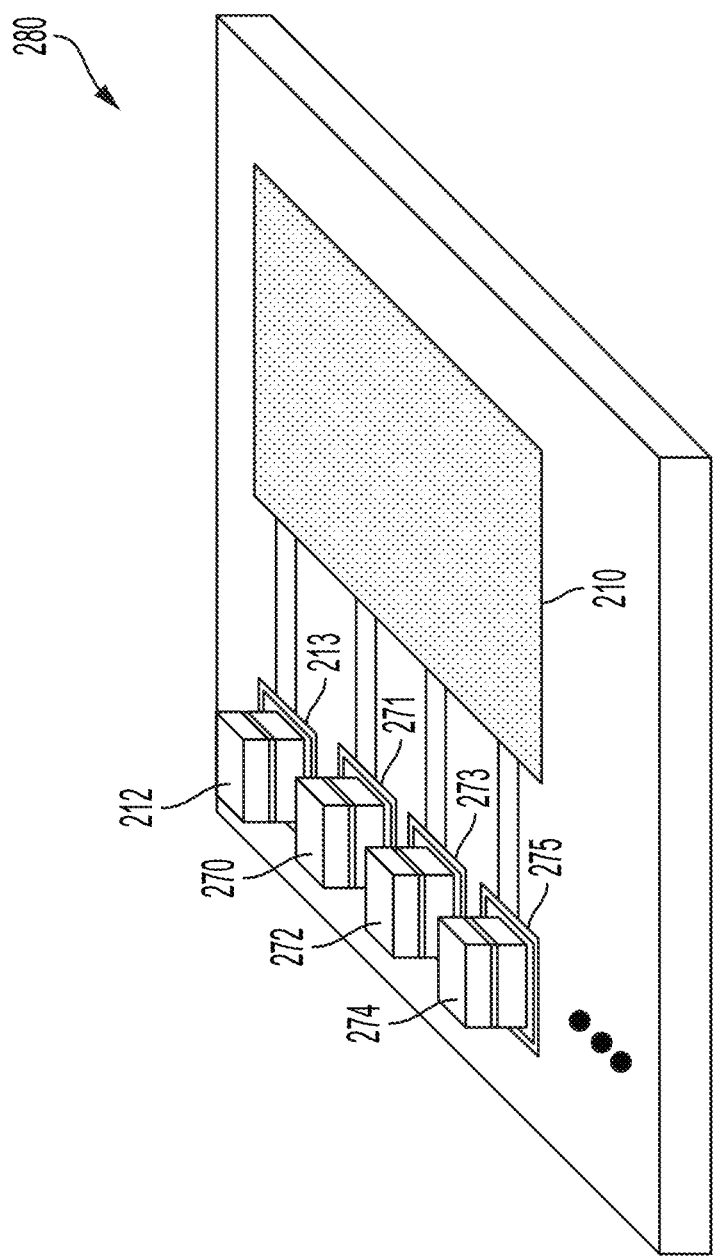
FIG. 12A is a perspective view of a packaging technique, in accordance with some embodiments.

FIG. 12A illustrates an exemplary packaging technique, according to some embodiments. VCSELs may be directly fabricated on a substrate that includes a photonic processor. For example, following an initial fabrication process for the photonic processor 210, the photonic integrated circuit, including a silicon substrate, is transferred to VCSEL processing equipment and VCSELs 212, 270, 272, and 274 may then be grown on photonic integrated circuit 280. The VCSELs 212, 270, 272, and 274 may be grown above out-of-plane couplers 213, 271, 273, and 275, respectively. As a result, light generated by the VCSELs will be optically coupled to the out-of-plane couplers.

In some embodiments, it may be advantageous to fabricate the VCSELs separately from the photonic integrated circuit that includes the photonic processor. Separate fabrication allows for more economic, wafer scale, manufacturing techniques of VCSELs. As another advantage, the VCSELs can be tested prior to bonding the VCSELs to the photonic processor. In this way, manufacturing defects and faulty VCSELs may be identified prior to bonding, reducing the costs of replacing faulty VCSELs that have already been bonded to the photonic integrated circuit. In some embodiments, following the fabrication of the photonic processor on a photonic integrated circuit and the separate fabrication of the VCSELs, the VCSELs are then bonded to the photonic integrated circuit. For example, VCSELs 212, 270, 272, and 274 may be bonded to photonic integrated circuit 280, the photonic integrated circuit including a photonic processor 210. The VCSELs 212, 270, 272, and 274 may be bonded such that light generated by the VCSELs will be optically coupled to the out-of-plane couplers 213, 271, 273, and 275, respectively. In some embodiments, the VCSELs are bonded to the photonic integrated circuit using adhesives and/or optical cements.

Figure 12B:
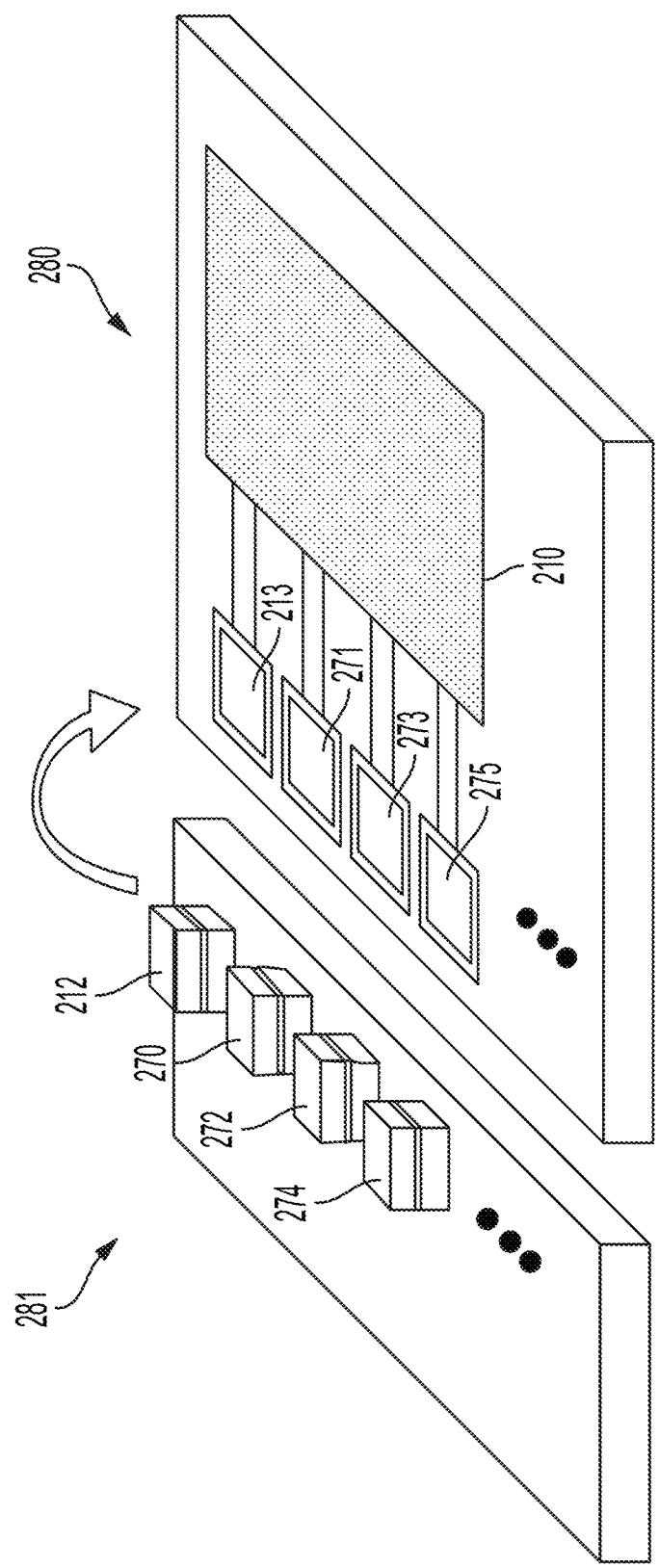
FIG. 12B is a perspective view of a packaging technique, in accordance with some embodiments.

In some embodiments, the VCSELs and the photonic integrated circuit are packaged together using a flip-chip bonding technique. FIG. 12B illustrates an exemplary flip-chip bonding between a first substrate including the VCSELs and a second substrate including the photonic processor, in accordance with some embodiments. For example, VCSEL substrate 281 includes VCSELs 212, 270, 272, 274 and photonic integrated circuit 280. Photonic integrated circuit 210 is a silicon substrate that includes photonic processor 210 and out-of-plane couplers 213, 271, 273, and 275. For bonding, the VCSEL substrate 281 is inverted and placed on top of photonic integrated circuit 280. Additional features such as solder balls, pins, pillars, grooves, and/or vias may be included to facilitate alignment of the VCSEL substrate 281 with the photonic integrated circuit 280. In some embodiments, solder components are re-melted to couple the VCSEL substrate to the photonic integrated circuit.

In some embodiments bonding techniques may be used in combination with each other. Additionally, or alternatively, additional bonding techniques may be used, as aspects of the technology described herein are not limited in this respect.

As described above, electrical signals, such as modulation signals and feedback signals may be transmitted between the photonic integrated circuit and the VCSELs. Since foundries generally do not allow the co-fabrication of these components, electrical interconnects are used to electrically couple the VCSELs to the integrated photonic system or external controller. Exemplary electrical interconnects are illustrated in FIGS. 13A-D.

Figure 13A:
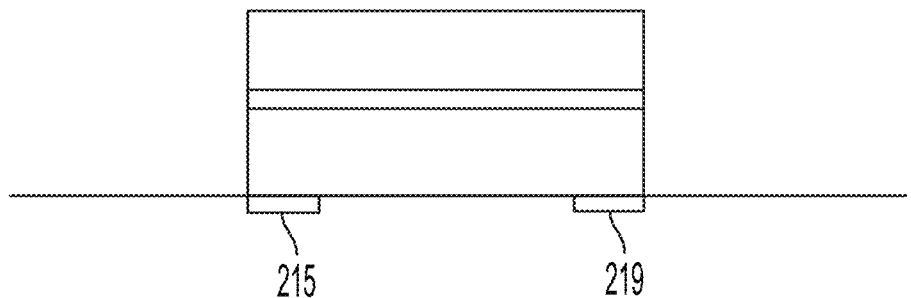
FIG. 13A is a cross sectional side view of a photonic package, in accordance with some embodiments.

FIG. 13A illustrates electrical coupling between the VCSEL and the integrated photonic circuit that includes vias (e.g., through silicon vias or through oxide vias), in accordance with some embodiments. The integrated photonic circuit includes signal via 215 and ground via 219. In some embodiments, the VCSEL includes a signal terminal configured to electrically couple the VCSEL to the signal via and a ground terminal configured to electrically couple the VCSEL to the ground via.

As described above, in connection with FIG. 6A, the VCSEL and signal interconnect may be located on the same surface of the VCSEL. For example, the signal interconnect and the ground interconnect may both be located on the surface of the VCSEL to facilitate electrical coupling with the photonic integrated circuit. The VCSEL may additionally include internal or external conductive traces to electrically couple a terminal to the doped layers. In other embodiments, the signal interconnect may be disposed on one side of the DBR and the ground interconnect may be disposed on the other side of the DBR. For example, the top DBR of the VCSEL may include a signal interconnect, and the bottom DBR of the VCSEL may include a ground interconnect.

Figure 13B:
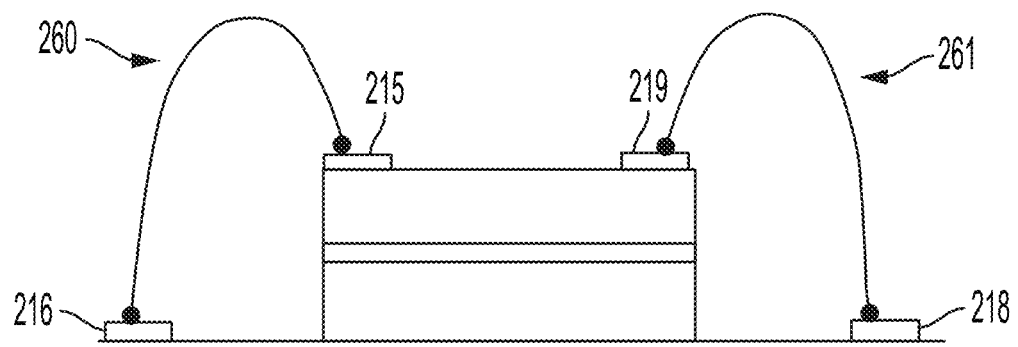
FIG. 13B is a cross sectional side view of another photonic package, in accordance with some embodiments.

FIG. 13B illustrates electrical coupling between the VCSEL and the integrated photonic circuit that includes wire bonds and conductive pads, in accordance with some embodiments. The photonic integrated circuit includes conductive signal pad 216 and conductive ground pad 218. The VCSEL may also include conductive signal pads, VCSEL signal pad 215 and VCSEL ground pad 219. The conductive signal pad 216 may be electrically coupled to VCSEL signal pad 215 using wire bond 260 and the conductive ground pad 218 may be electrically coupled to the VCSEL ground pad using wire bond 261.

Additionally, or alternatively, electrical interconnects may couple the photonic integrated circuit to a VCSEL substrate comprising a plurality of VCSELs. The VCSEL substrate may include additional interconnects between the VCSEL substrate and the plurality of VCSELs for providing electrical signals to the plurality of VCSELs. The additional interconnects may include conductive traces, wire bonds and conductive pads, through silicon or through oxide vias, interposers, solder bumps, bump grid arrays, pin grid arrays, and/or other packaging techniques, as aspects of the technology described herein are not limited in this respect.

Figure 13C:
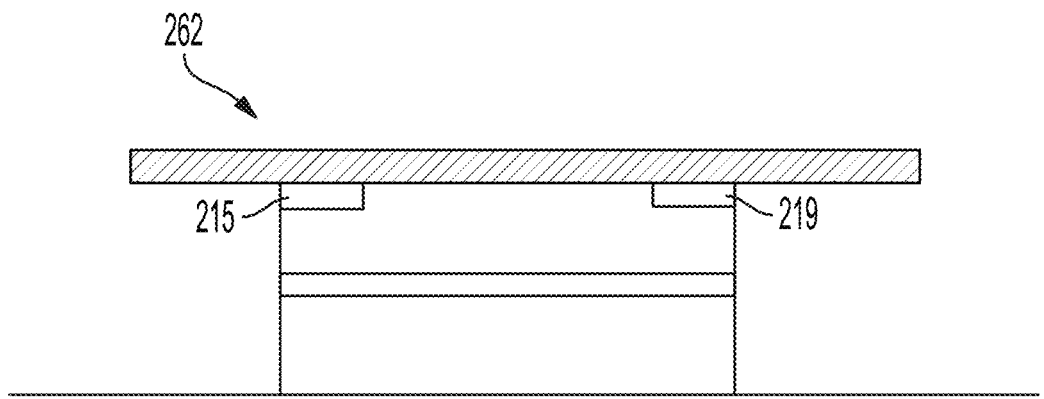
FIG. 13C is a cross sectional side view of yet another photonic package, in accordance with some embodiments.

FIG. 13C illustrates electrical coupling between the VCSEL and the integrated photonic circuit that includes an interposer (e.g., a silicon interposer or an organic interposer), in accordance with some embodiments. An interposer 262 may be electrically coupled to a conductive surface of the VCSEL through conductive pads disposed at or near a top surface of the VCSEL. For example, the VCSEL may include conductive signal pad 215 and conductive ground pad 219. The interposer may be electrically coupled to the conductive ground and signal pads 215 and 219. In other embodiments, the VCSEL may be electrically connected to the interposer using other packaging techniques or a combination of packaging techniques, as the technology described herein is not limited in this respect.

A single interposer may be configured to electrically couple multiple VCSELs to the photonic integrated circuit. In some embodiments, the interposer may provide individual electrical connections between each VCSEL and the photonic integrated circuit. Additionally, or alternatively, the interposer may use a single electrical connection to electrically couple multiple VCSELs to the photonic integrated circuit.

The inventors have recognized and appreciated that vertically stacking the controller to modulate the VCSEL, with the VCSEL, provides a small footprint light source capable of high bandwidths. The resistance, impedance, and capacitance limit the bandwidths of electrical components. By minimizing the distance electrical signals travel, the resistance, impedance, and capacitance can be minimized, allowing for larger bandwidths and faster modulation. In some embodiments, the interposer may include vias such that an application specific integrated circuit (ASIC) can be configured above the interposer, either fabricated on the interposer or on a separate die bonded to the interposer, for sending electrical signals to the VCSEL. An ASIC configured above the VCSEL may be configured to provide power to the VCSEL and may be further configured to directly modulate the VCSEL. The ASIC may be configured as controller 217, as described in connection with FIG. 8.

Figure 13D:
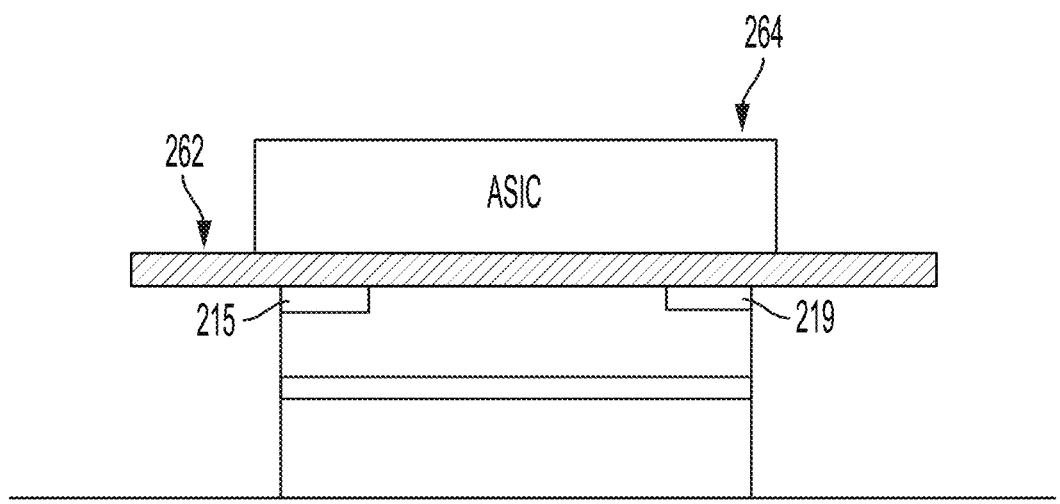
FIG. 13D is a cross sectional side view of yet another photonic package that includes an ASIC, in accordance with some embodiments.

FIG. 13D illustrates an exemplary configuration of an interposer, ASIC, and VCSEL, in accordance with some embodiments. ASIC 264 may be disposed above interposer 262. The interposer is disposed above the VCSEL and is electrically coupled to the VCSEL through vias in the interposer. In some embodiments, the interposer provides electrical connections from ASIC 264 to the conductive signal pad 215 and conductive ground pad 219. In some embodiments, a separate ASIC may be configured to modulate each VCSEL. Additionally, or alternatively, an ASIC may be configured to modulate multiple VCSELs.

VI. Additional Comments

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The definitions, as defined and used herein, should be understood to control over dictionary definitions, definitions in documents incorporated by reference and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some case and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately," "substantially," and "about" may be used to mean within ±20% of a target value in some embodiments. The terms "approximately," "substantially," and "about" may include the target value.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another claim element having a same name (but for use of the ordinal term) to distinguish the claim elements.

Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

What is claimed is:

1. A photonic processor configured to perform matrix multiplication, the photonic processor comprising:
    a first encoder configured to produce a first input signal indicative of a first input value and a second encoder configured to produce a second input signal indicative of a second input value;
    a first multiplier configured to produce, based on the first input signal, a first output signal indicative of a first product of the first input value with a first matrix value;
    a second multiplier configured to produce, based on the second input signal, a second output signal indicative of a second product of the second input value with a second matrix value;
    an optical adder configured to receive light and to produce, based on the first and second output signals, a cumulative optical signal indicative of a sum of the first product with the second product, wherein the optical adder comprises first and second optical phase shifters;
    a digital controller configured to:
        control the first optical phase shifter based on the first output signal, and
        control the second optical phase shifter based on the second output signal; and
    a receiver configured to produce, based on the cumulative signal, an output value indicative of the sum.

2. The photonic processor of claim 1, wherein the first and second optical phase shifters are optically connected in series.

3. The photonic processor of claim 1, wherein the optical adder further comprises a coherent detector coupled to the second optical phase shifter.

4. The photonic processor of claim 3, wherein the optical adder further comprises a first waveguide and a second waveguide, wherein the first and the second optical phase shifters are embedded in the first waveguide, and wherein the first and second waveguides are provided as inputs to the coherent detector.

5. The photonic processor of claim 4, wherein the optical adder further comprises a beam splitter coupled to the first and second waveguides.

6. The photonic processor of claim 1, wherein:
the first encoder is a first optical encoder such that the first input signal is a first optical input signal, and
the second encoder is a second optical encoder such that the second input signal is a second optical input signal.

7. A photonic processor configured to perform matrix multiplication, the photonic processor comprising:
a first encoder configured to produce a first input signal indicative of a first input value and a second encoder configured to produce a second input signal indicative of a second input value;
a first multiplier configured to produce, based on the first input signal, a first output signal indicative of a first product of the first input value with a first matrix value, wherein the first multiplier comprises a first modulatable detector such that the first output signal is a first electrical output signal;
a second multiplier configured to produce, based on the second input signal, a second output signal indicative of a second product of the second input value with a second matrix value, wherein the second multiplier comprises a second modulatable detector such that the second output signal is a second electrical output signal;
an optical adder configured to receive light and to produce, based on the first and second output signals, a cumulative signal indicative of a sum of the first product with the second product; and
a receiver configured to produce, based on the cumulative signal, an output value indicative of the sum.

8. The photonic processor of claim 7, wherein the first modulatable detector has a modulatable responsivity, wherein the first modulatable detector is configured to produce the first output signal by setting the modulatable responsivity based on the first matrix value.

9. The photonic processor of claim 7, wherein the first modulatable detector has a modulatable gain, wherein the first modulatable detector is configured to produce the first output signal by setting the modulatable gain based on the first matrix value.

10. The photonic processor of claim 1, wherein:
the first encoder is a first electronic encoder such that the first input signal is a first electrical input signal, and
the second encoder is a second electronic encoder such that the second input signal is a second electrical input signal.

11. The photonic processor of claim 10, wherein the first multiplier comprises a Gilbert cell.

12. The photonic processor of claim 1, further comprising a vertical cavity surface emitting laser (VCSEL) configured to generate the light with a wavelength less than 1.1 μm.

13. The photonic processor of claim 12, wherein the optical adder is formed on a silicon substrate and wherein the silicon substrate comprises a silicon nitride waveguide configured to couple the light with the wavelength less than 1.1 μm to the optical adder.

14. The photonic processor of claim 1, wherein the output value is equal to the sum.

15. A method for performing matrix multiplication, the method comprising:
producing a first output signal indicative of a first product of a first input value with a first matrix value, wherein producing the first output signal comprises:
controlling a first encoder to encode a first input signal based on the first input value; and
controlling a first multiplier positioned in series with the first encoder based on the first matrix value;
producing a second output signal indicative of a second product of a second input value with a second matrix value, wherein producing the second output signal comprises:
controlling a second encoder to encode a second input signal based on the second input value; and
controlling a second multiplier positioned in series with the second encoder based on the second matrix value; and
controlling an optical adder to produce, based on the first and second output signals and further based on input light, a cumulative optical signal indicative of a sum of the first product with the second product, wherein the optical adder comprises first and second optical phase shifters optically connected in series, and wherein controlling the optical adder comprises:
controlling the first optical phase shifter based on the first output signal; and
controlling the second optical phase shifter based on the second output signal.

16. The method of claim 15, wherein controlling the first encoder comprises controlling a first optical encoder such that the first input signal is a first optical input signal.

17. The method of claim 15, wherein controlling the first multiplier based on the first matrix value comprises setting a characteristic of a modulatable detector based on the first matrix value.

18. The method of claim 15, wherein controlling the optical adder comprises coupling the light to the optical adder.

19. The method of claim 15, wherein the optical adder comprises a coherent detector, and wherein controlling the optical adder comprises reverse-biasing the coherent detector.

20. The method of claim 19, wherein the optical adder further comprises a first waveguide and a second waveguide, wherein the first and the second optical phase shifters are embedded in the first waveguide, and wherein the first and second waveguides are provided as inputs to the coherent detector.

21. The photonic processor of claim 7, wherein the optical adder comprises first and second optical phase shifters, and wherein the photonic processor further comprises:
a digital controller configured to:
control the first optical phase shifter based on the first output signal, and
control the second optical phase shifter based on the second output signal; and
a receiver configured to produce, based on the cumulative signal, an output value indicative of the sum.

22. The photonic processor of claim 21, wherein the first and second optical phase shifters are optically connected in series.

23. The photonic processor of claim 21, wherein the optical adder further comprises a coherent detector coupled to the second optical phase shifter.

24. The photonic processor of claim 23, wherein the optical adder further comprises a first waveguide and a second waveguide, wherein the first and the second optical phase shifters are embedded in the first waveguide, and wherein the first and second waveguides are provided as inputs to the coherent detector.

25. The photonic processor of claim 24, wherein the optical adder further comprises a beam splitter coupled to the first and second waveguides.

\* \* \* \* \*